(12) United States Patent
Matsui

(10) Patent No.: US 6,262,939 B1
(45) Date of Patent: Jul. 17, 2001

(54) SEMICONDUCTOR INTEGRATED CIRCUIT DEVICE

(75) Inventor: Yoshinori Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/521,971

(22) Filed: Mar. 9, 2000

(30) Foreign Application Priority Data

Mar. 12, 1999 (JP) .................................................. 11-067556

(51) Int. Cl.[7] .................................................... G11C 8/00
(52) U.S. Cl. ...................................... 365/233; 365/230.04
(58) Field of Search ............................... 365/233, 230.04, 365/230.06, 230.08, 189.02, 189.05

(56) References Cited

U.S. PATENT DOCUMENTS 5,680,363 * 10/1997 Dosaka et al. .................. 365/230.03
5,890,195 * 3/1999 Tao ........................................ 711/105
6,016,280 * 1/2000 Maesako et al. ..................... 365/226
6,101,146 * 8/2000 Maesako et al. ............... 365/230.03

* cited by examiner

*Primary Examiner*—Vu A. Le
*Assistant Examiner*—Anh Phung
(74) *Attorney, Agent, or Firm*—Sughrue, Mion, Zinn, Macpeak & Seas, PLLC

(57) ABSTRACT

The semiconductor integrated circuit device for reading data synchronously with an external clock signal, comprises: a memory cell array in which memory cells are arranged in a matrix; first and second address specifying devices for alternately specifying continuous internal addresses in the memory cell array starting from an external address synchronously with the external clock signal; first and second data transfer devices, which correspond to the respective first and second address specifying devices, for alternately transferring the data from the memory cells in the memory cell array specified by the internal addresses synchronously with the external clock; and data output device for outputting the data alternately transferred by the first and second data transfer device.

8 Claims, 59 Drawing Sheets

FIG. 4

PIN ARRANGEMENT

64M DRAM+16K SRAM (×8)

| | | | | |
|---|---|---|---|---|
| Vcc | 1 | | 54 | Vss |
| DQ0 | 2 | | 53 | DQ7 |
| VccQ | 3 | | 52 | VssQ |
| NC | 4 | | 51 | NC |
| DQ1 | 5 | | 50 | DQ6 |
| VssQ | 6 | | 49 | VccQ |
| NC | 7 | | 48 | NC |
| DQ2 | 8 | | 47 | DQ5 |
| VccQ | 9 | | 46 | VssQ |
| NC | 10 | | 45 | NC |
| DQ3 | 11 | 54pin | 44 | DQ4 |
| VssQ | 12 | 400mil × 875mil | 43 | VccQ |
| NC | 13 | 0.8mm Pitch | 42 | NC |
| Vcc | 14 | TSOP II | 41 | Vss |
| NC | 15 | | 40 | NC, VREF |
| /WE | 16 | | 39 | DQM |
| /CAS | 17 | | 38 | CLK |
| /RAS | 18 | | 37 | CKE |
| /CS | 19 | | 36 | NC |
| A13 (BA) | 20 | | 35 | A11 |
| A12 | 21 | | 34 | A9 |
| A10 (AP) | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

FIG. 5

CORRESPONDENCE BETWEEN COMMANDS AND INPUT TERMINAL STATES

| COMMAND | CKE n-1 | CKE n | /CS | /RAS | /CAS | /WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|
| READ | H | x | L | H | L | H | x | x | x | SRAM COLUMN SELECTION | | | | | | | SRAM ROW SELECTION | | | |
| WRITE | H | x | L | H | L | L | x | x | x | SRAM COLUMN SELECTION | | | | | | | SRAM ROW SELECTION | | | |
| PREFETCH | H | x | L | H | H | L | BANK SELECTION | x | x | L | L | x | x | DRAM COLUMN SELECTION | | x | SRAM ROW SELECTION | | | |
| PREFETCH (AUTO PRECHARGE) | H | x | L | H | H | L | BANK SELECTION | x | x | H | L | x | x | DRAM COLUMN SELECTION | | x | | | | |
| RESTORE | H | x | L | H | H | L | BANK SELECTION | x | x | L | H | x | x | DRAM COLUMN SELECTION | | x | SRAM ROW SELECTION | | | |
| RESTORE (AUTO PRECHARGE) | H | x | L | H | H | L | BANK SELECTION | x | x | H | H | x | x | DRAM COLUMN SELECTION | | x | | | | |
| ACTIVE | H | x | L | L | H | H | BANK SELECTION | x | x | DRAM ROW SELECTION | | | | | | | | | | |
| PRECHARGE | H | x | L | L | H | L | BANK SELECTION | x | x | L | x | x | x | x | x | x | x | x | x | x |
| ALL BANK PRECHARGE | H | x | L | L | H | L | x | x | x | H | x | x | x | x | x | x | x | x | x | x |
| CBR REFRESH | H | x | L | L | L | H | x | x | x | x | x | x | x | x | x | x | x | x | x | x |
| NON-OPERATION | H | x | L | H | H | H | x | x | x | x | x | x | x | x | x | x | x | x | x | x |
| DEVICE NON-SELECTION | H | x | H | x | x | x | x | x | x | x | x | x | x | x | x | x | x | x | x | x |
| REGISTER SETTING (1) | H | x | L | L | L | L | L | L | L | L | L | L | L | REGISTER SETTING | | | | | | |
| REGISTER SETTING (2) | H | x | L | L | L | L | L | L | L | L | L | L | L | L | REGISTER SETTING | | | | | |

H: HIGH LEVEL  L: LOW LEVEL  x: HIGH OR LOW (DON'T CARE)

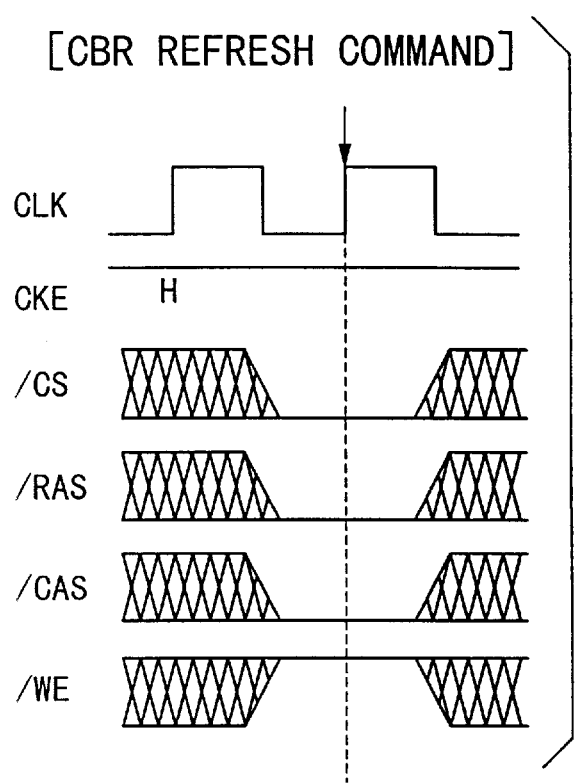
FIG. 15 [CBR REFRESH COMMAND]
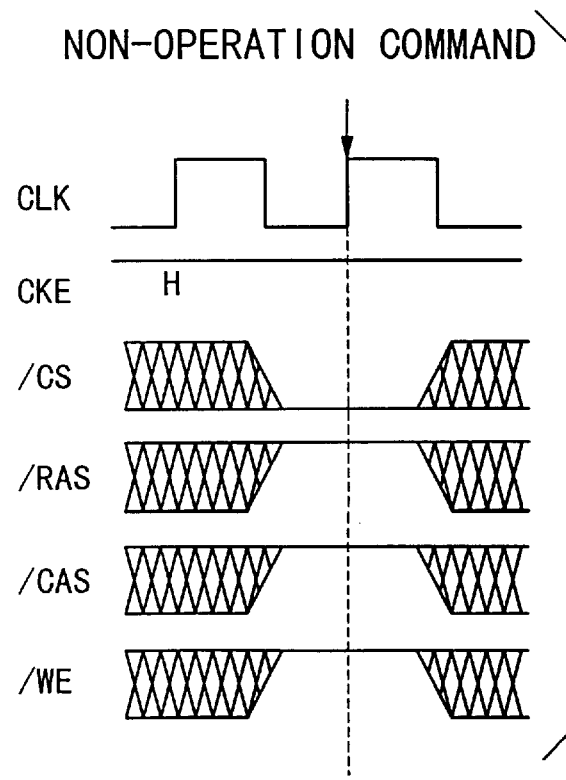
FIG. 16 NON-OPERATION COMMAND FIG. 17 [DEVICE NON-SELECTION COMMAND]
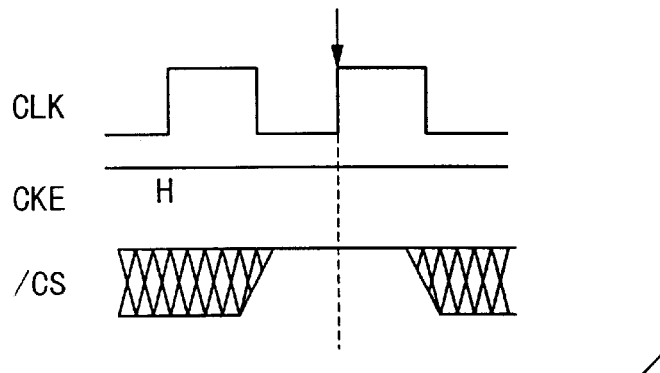
FIG. 18
(1) (1) [MODE REGISTER SETTING (1) COMMAND] OF [REGISTER SETTING COMMAND] (A), (B), (C) AND (D)
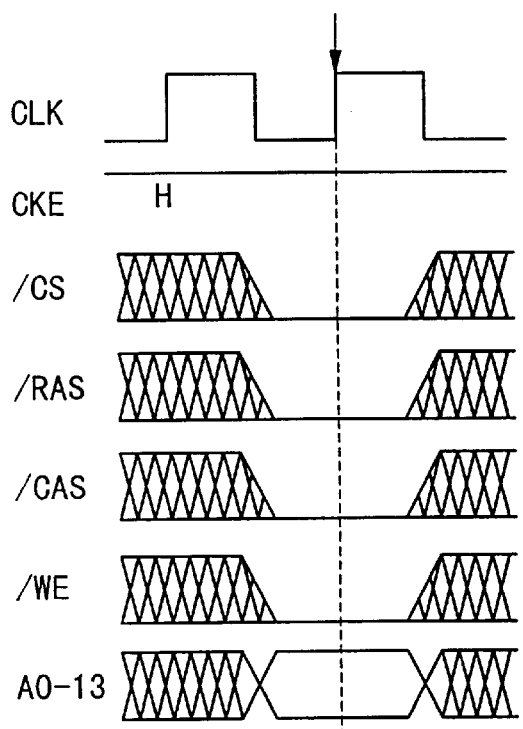

REGISTER SETTING

FIG. 20A REFRESH COUNTER TEST SET (STANDARD TEST SET)

| A13 | A12 | A11 | A10 | A9 | A8 | A7 | A6 | A5 | A4 | A3 | A2 | A1 | A0 |
|---|---|---|---|---|---|---|---|---|---|---|---|---|---|
| L | L | L | L | L | H | x | x | x | x | x | x | x | x |

FIG. 20B UNUSED TEST SET

| A13 | A12 | A11 | A10 | A9 | A8 | A7 | A6 | A5 | A4 | A3 | A2 | A1 | A0 |
|---|---|---|---|---|---|---|---|---|---|---|---|---|---|
|  |  |  |  | H | L |  |  |  |  |  |  |  |  |

FIG. 20C DEVICE TEST SET

| A13 | A12 | A11 | A10 | A9 | A8 | A7 | A6 | A5 | A4 | A3 | A2 | A1 | A0 |
|---|---|---|---|---|---|---|---|---|---|---|---|---|---|
| x | x | x | x | x | H | H | V | V | V | V | V | V | V |

FIG. 20D MODE REGISTER SETTING COMMAND

| A13 | A12 | A11 | A10 | A9 | A8 | A7 | A6 | A5 | A4 | A3 | A2 | A1 | A0 |
|---|---|---|---|---|---|---|---|---|---|---|---|---|---|
| L | L | L | L | L | L | L | V | V | V | V | V | V | V |

H: HIGH LEVEL   L: LOW LEVEL
x: INVALID DATA (DON'T CARE)   V: VALID DATA INPUT

FIG. 21

MODE REGISTER SETTING COMMAND

MODE REGISTER SETTING (1) COMMAND

| A13 | A12 | A11 | A10 | A9 | A8 | A7 | A6 | A5 | A4 | A3 | A2 | A1 | A0 |
|---|---|---|---|---|---|---|---|---|---|---|---|---|---|
| L | L | L | L | L | L | L | L | × | × | L | LATENCY | | |

A0 → LAP LATENCY

| A0 | LAP TYPE |
|---|---|
| L | SEQUENTIAL |
| H | INTERLEAVE |

| LATENCY | | | CAS LATENCY |
|---|---|---|---|
| A3 | A2 | A1 | |
| L | L | L | UNUSE |
| L | L | H | UNUSE |
| L | H | L | 2 |
| L | H | H | UNUSE |
| H | L | L | UNUSE |
| H | L | H | UNUSE |
| H | H | L | UNUSE |
| H | H | H | UNUSE |

| BURST LENGTH | | | | |
|---|---|---|---|---|
| A5 | A4 | A3 | SEQUENTIAL | INTERLEAVE |
| L | L | L | 1 | 1 |
| L | L | H | 2 | 2 |
| L | H | L | 4 | 4 |
| L | H | H | 8 | 8 |
| H | L | L | 16 | 16 |
| H | L | H | UNUSE | UNUSE |
| H | H | L | UNUSE | UNUSE |
| H | H | H | UNUSE | UNUSE |

MODE REGISTER SETTING (2) COMMAND

CLK2:
| A13 | A12 | A11 | A10 | A9 | A8 | A7 | A6 | A5 | A4 | A3 | A2 | A1 | A0 |
|---|---|---|---|---|---|---|---|---|---|---|---|---|---|
| L | L | L | L | L | L | L | H | BURST LENGTH | | × | × | × |

CLK1:
| A13 | A12 | A11 | A10 | A9 | A8 | A7 | A6 | A5 | A4 | A3 | A2 | A1 | A0 |
|---|---|---|---|---|---|---|---|---|---|---|---|---|---|
| L | L | L | L | L | L | L | H | UNUSE | | SRAM ROW DATA | | |

SEMICONDUCTOR INTEGRATED CIRCUIT DEVICE

BACKGROUND OF THE INVENTION

1. Field of the Invention

The present invention relates to a semiconductor integrated circuit device having a main memory portion and a sub-memory portion formed in a semiconductor substrate and a data transfer circuit provided between the main memory portion and the sub-memory portion, and particularly, to a semiconductor integrated circuit device which can reduce its internal operating frequency.

This application is based on Japanese Patent Application No. 11-67556, the contents of which are incorporated herein by reference.

2. Description of the Related Art

In general, a relatively low speed, inexpensive semiconductor device having large memory capacity, such as general purpose DRAM, is used as the main memory in a computer system.

In the recent computer systems, the operating speed of a DRAM constituting the main memory increases with an increase in an operating speed of the system, particularly, of the MPU thereof. However, the operating speed of the DRAM is still insufficient and, in order to solve this problem, it is usual to provide a sub-memory between the MPU and the main memory. Such sub-memory is generally called as a cache memory and is constructed with a high speed SRAM or an ECLRAM.

The cache memory is generally provided to the MPU externally or internally. Recently, a semiconductor device in which the DRAM constituting the main memory and the cashe memory are mounted on the same semiconductor substrate have gained attention. Japanese Unexamined Patent Application, First publication Nos. Sho 57-20983, Sho 60-7690, Sho 62-38590 and Hei 1-146187 disclose examples of such semiconductor memory. Such semiconductor memory is sometimes called a cache DRAM or CDRAM since it includes the DRAM and the cache memory. Data are bi-directionally transferred between the SRAM, which functions as the cashe memory, and the DRAM which is the main memory.

Recently, in the semiconductor integrated circuit devices, as the data reading speed increases, the operating frequency has also increased. The operating frequency of the semiconductor memory device such as a DRAM depends on the operating frequency of the internal circuits such as address buffers and decoders. Therefore, unless the operating frequency of the internal circuits is increased, the operating frequency of the entire device cannot be increased, and the device cannot handle further increases in speed.

This problem will be specifically discussed with reference to FIGS. 64 and 65.

FIG. 64 shows a construction of a data read block of a conventional semiconductor memory device. In this example, an SRAM column address signal iASC, which is generated from an external address is input from the outside, is input via a column address buffer 392J to a column decoder 390J. The column decoder 390J decodes the signal and inputs an SRAM column decoded output signal SSL to an SRAM array 120J. In the SRAM array 120J, data buffers 394J which include SRAM cells are arranged in a matrix, and the respective data buffers 394J have switch circuits 397J which become conductive depending on the SRAM column decoded output signals SSL from the column decoder 390J. The respective data buffers 394J are connected via the switch circuits 397J to a data input/output line SIO. The data input/output line SIO is connected to a data control circuit 160J which includes a data latch circuit 395J and a data-out buffer 152J. The SRAM column decoder 123J and the data control circuit 160J are operated synchronously with an external clock signal (CLK) which is not shown.

According to this construction, in every clock cycle of the external clock signal CLEK, the SRAM column address signals iASC are successively generated corresponding to addresses A0 to A3. The column decoded output signals SSL corresponding to the addresses A0 to A3 are successively generated in every clock cycle, and are delayed from the SRAM column address signal iASC by a half of one clock cycle. Data D0 to D3 from the data buffers 394J, which are specified by the SRAM column decoded output signals SSL, successively appear at the data input/output line SIO in every clock cycle. The data control circuit 160J inputs these signals, and outputs the signals as data DQ in every clock cycle.

In this conventional technique, the internal circuits such as the column decoder and the data control circuit complete one operation within one clock cycle, that is, the operating frequency for reading the data depends on the operating frequency of the internal circuits.

Document "400 MHz Random Column Operating SDRAM Techniques with Self Skew Compensation", 1997, Symposium on VLSI Circuits Digest of Technical Papers, pp105–106, discloses a technique for improving the operating frequency using a multi-line data read path from a memory array. While this technique accelerates the operation in the data transfer path downstream from the DRAM memory array, the technique restricts the operating frequency of an address transfer path (such as an address buffer, a column decoder, and a data bus) from inputting of an external address to specifying of a memory cell because this path is constructed in a manner similar to the conventional devices. This technique includes adding a plurality of switches and a plurality of local IO lines to respective sense amplifiers for providing the multi-line data transfer path for the DRAM, and therefore the overhead in layout may be increased.

BRIEF SUMMARY OF THE INVENTION

It is therefore an object of the present invention to provide a semiconductor integrated circuit device which can increase a data read speed without increasing the operating frequency of internal circuits, and which can reduce the operating frequency of the internal circuits.

In a first aspect of the present invention, a semiconductor integrated circuit device for reading data synchronously with an external clock signal, comprises: a memory cell array (an SRAM array 120) in which memory cells are arranged in a matrix; first and second address specifying devices (a first column decoder 390, and a second column decoder 391) for alternately specifying continuous internal addresses in the memory cell array starting from an external address synchronously with the external clock signal; first and second data transfer devices (a first data latch circuit 395, and a second data latch circuit 396), which correspond to the respective first and second address specifying devices, for alternately transferring the data from the memory cells in the memory cell array specified by the internal addresses synchronously with the external clock; and data output device (a data-out buffer 152) for outputting the data alternately transferred by the first and second data transfer device.

In a second aspect of the invention, the first and second data transfer devices comprise first and second switch devices (a first switch circuit 397-1, and a second switch circuit 397-2) which are connected between the memory cells in the memory cell array and the first and second data transfer devices, and which are made conductive based on the internal addresses specified by the first and second address specifying devices.

In a third aspect of the invention, the first address specifying device comprises: a first address buffer (a first column address buffer 392) for receiving the external address synchronously with the external clock signal and generating a first address signal based on the external address; and a first decoder (a first column decoder 390) for decoding the first address signal to generate a first selection signal, and inputting the first selection signal to the first switch device. The second address specifying device comprises: a second address buffer (a second column address buffer 393) for receiving the external address synchronously with the external clock signal and generating a second address signal, based on the external address; and a second decoder (a second column decoder 391) for decoding the second address signal to generate a second selection signal, and inputting the second selection signal to the second switch device. The first and second address buffers alternately operates synchronously with the external clock signal, and alternately generates the first and second address signals based on the external address, so that the memory cells in the memory cell array are successively selected.

In a fourth aspect of the invention, a semiconductor integrated circuit device for reading data synchronously with an external clock signal, comprises: a main memory; and a sub-memory for sending and receiving data to and from the main memory, and the sub-memory comprises a plurality of data reading devices (a system comprising a first address buffer 392, a first column decoder 390, a switch circuit 397-1, and a first data latch circuit 395, and a system comprising a second address buffer 393, a second column decoder 391, a switch circuit 397-2, and a second data latch circuit 396).

In a fifth aspect of the invention, the data reading devices comprise: first and second address specifying devices (a first address buffer 392, a first column decoder 390, a second address buffer 393, and a second column decoder 391) for alternately specifying continuous internal addresses in a memory cell array of the sub-memory starting from an external address; first and second data transfer devices (a first data latch circuit 395, and a second data latch circuit 396), which correspond to the respective first and second address specifying devices, for alternately transferring the data from the memory cells in the memory cell array specified by the internal addresses synchronously with the external clock; and data output device (a data-out buffer 152) for outputting the data alternately transferred by the first and second data transfer device.

According to the invention, the first address specifying device specifies the internal address in the memory cell array, and the data in the memory cell specified by the internal address is transferred by the first data transfer device. Then, the second address specifying device specifies the internal address in the memory cell array, and the data in the memory cell specified by the internal address is transferred by the second data transfer device. The first and second address specifying devices alternately specify the continuous internal addresses.

Each of the first and second address specifying devices specifies one internal address in two cycles. Also, each of the first and second data transfer devices transfer one data set in two cycles. Further, the data output devices alternately output the data from the first and second data transfer devices.

The first address specifying device, the second address specifying device, the first data transfer device, and the second data transfer device complete one operation in two cycles, and the operating frequency of these circuits can be reduced. Further, the data output device alternately accepts and outputs the data from the first and second data transfer devices, and its operating frequency can be reduced. Thus, the operating frequency of the entire device can be increased without increasing the operating frequency of the internal circuits.

BRIEF DESCRIPTION OF THE DRAWINGS

FIG. 4 shows an arrangement of external terminals of the semiconductor memory device shown in FIG. 1.

FIG. 5 shows a correspondence between various commands determining operating functions of the semiconductor memory device shown in FIG. 1 and the external terminals;

FIG. 15 shows states of the external terminals showing the CBR refresh command shown in FIG. 5.

FIG. 16 shows states of the external terminals showing the device non-selection command shown in FIG. 5.

FIG. 17 shows states of the external terminals showing the non-operation command shown in FIG. 5.

FIG. 18 shows states of the external terminals showing the register setting command (1) shown in FIG. 5.

FIGS. 20A–20D show states of the external terminals showing the register setting command shown in FIG. 5.

FIG. 21 shows states of the external terminals showing the mode register setting command which is a portion of the register setting command shown in FIG. 5.

DETAILED DESCRIPTION OF THE INVENTION

(1) Basic Construction

A basic construction of an embodiment of the present invention will be described.

A semiconductor integrated circuit device according to the present invention includes a semiconductor memory device and a control device of the semiconductor memory device. The semiconductor memory device includes a main memory portion and a sub memory portion and bi-directional data transfer is possible between the main memory portion and the sub memory portion. The sub memory portion is constructed with a plurality of memory cell groups, each of which is able to function as an independent cache memory. In the semiconductor memory device of the present invention, the number of control terminals and the number of address terminals can be the same as those necessary to control the main memory portion.

The semiconductor integrated circuit device will be described by way of an embodiment which has a synchronous interface having a x8 2-bank constriction including a 64-Mbit DRAM array as the main memory portion and a 16-Kbit SRAM array as the sub memory portion. The present invention is not limited to this embodiment.

(2) Block Diagram

Figure 1:
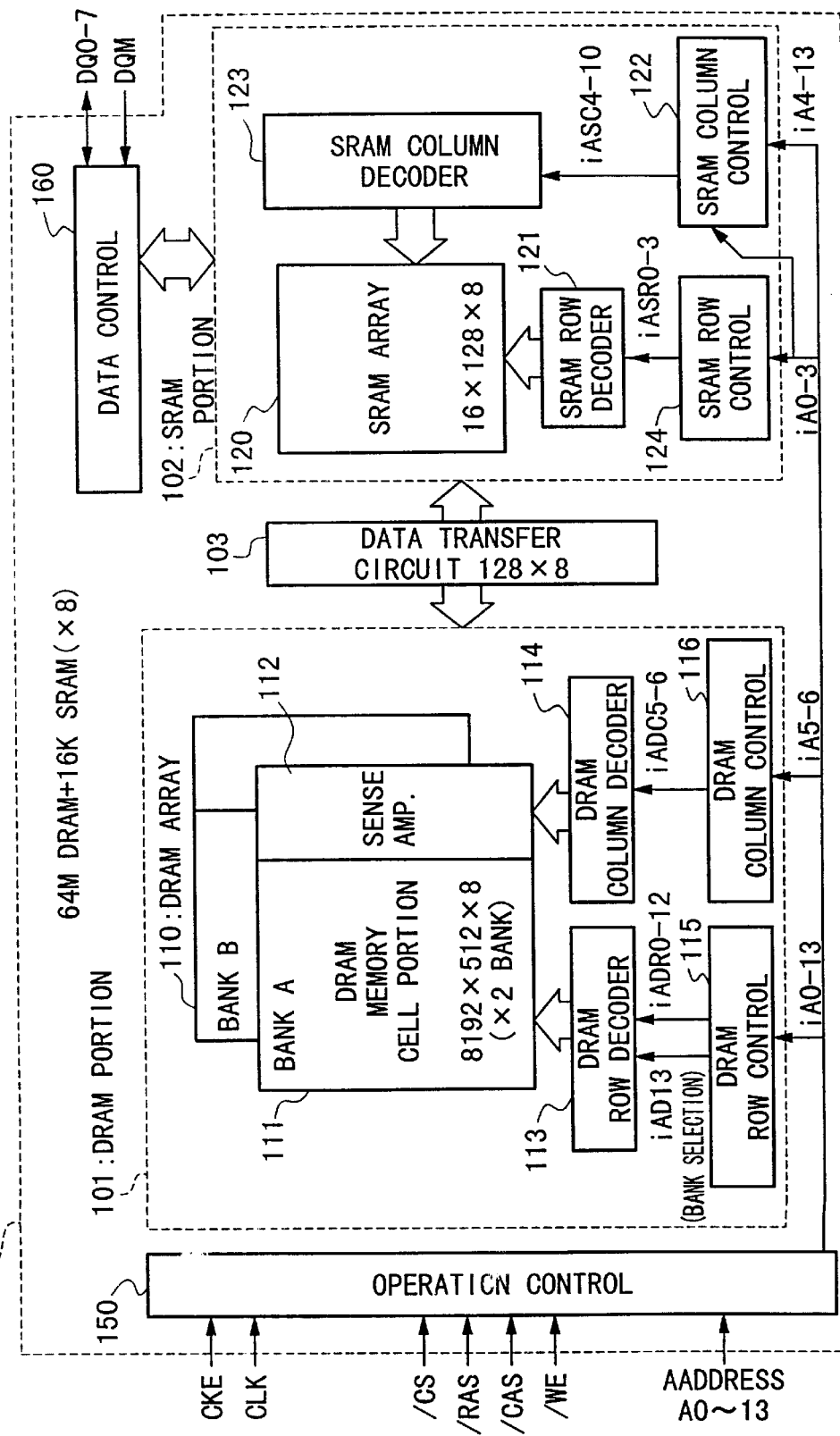
FIG. 1 is a block diagram showing a whole construction of a semiconductor memory, device according to a first embodiment of the present invention.

FIG. 1 is a block diagram schematically showing a construction of a whole semiconductor memory device according to an embodiment of the present invention. In FIG. 1, the semiconductor memory device 100 includes a dynamic RAM (DRAM) portion 101 as a main memory portion, a static RAM (SRAM) portion 102 as a sub memory portion, and a bi-directional data transfer circuit 103 for data transfer between the DRAM portion 101 and the SRAM portion 102.

The DRAM portion 101 includes a DRAM array 110 having a plurality of dynamic memory cells arranged in a row and column matrix, a DRAM row control circuit 115 for generating a DRAM row selection signal and a bank selection signal from internal address signals iA0 to iA13, a DRAM row decoder 113 responsive to the DRAM row selection signals iADR0 to iADR12 and the bank selection signal iAD13 for selecting a corresponding row of the DRAM array 110, a DRAM column control circuit 116 for generating a DRAM column selection signal from the internal address signals iA5 and iA6, and a DRAM column decoder 114 responsive to the DRAM column selection signals iADC5 and iADC 6 for selecting a corresponding column.

Further, the DRAM array 110 includes a memory cell portion 111 and a sense amplifier 112 for detecting and amplifying data held in the selected DRAM cell. Further, the DRAM array 110 is divided to a plurality of blocks called banks and, in this embodiment, to two banks A and B one of which is selected by the bank selection signal iAD13.

The SRAM portion 102 includes an SRAM array 120 having a plurality of static memory cells arranged in a row and column matrix, an SRAM row control circuit 124 for generating an SRAM row selection signal from the internal address signals iA0 to iA3, an SRAM row decoder 121 responsive to SRAM row selection signals iASR0 to iASR3 for selecting one of SRAM cell groups (in this embodiment, cell groups divided every row), an SRAM column control circuit 122 for generating an SRAM column selection signal from the internal address signals iA0 to iA3 and iA4 to iA13, and an SRAM column decoder 123 for selecting a column by SRAM column selection signals iASC4 to iASC10. The semiconductor memory device 100 further includes an operation control circuit 150 for controlling an operation of the semiconductor memory device in response to an external input signal, and a data control circuit 160 for controlling an external data input/output operation.

Although, in this embodiment, the DRAM and SRAM are used as the main memory, portion and the sub memory portion, respectively, the present invention is not limited thereto. Instead of the DRAM, a memory such as SRAM, mask ROM, programmable ROM (PROM), erasable PROM (EPROM), electrically erasable PROM (EEPROM), flush EEPROM, and ferroelectric memory may be used as the main memory portion. The memory constituting the main memory portion is preferably constructed such that the kind and specific function thereof can be efficiently utilized. For example, in a case where a DRAM is used as the main memory portion, a usual DRAM, an EDODRAM, a synchronous DRAM, a synchronous GRAM, a burst EDODRAM, a DDR synchronous DRAM, a DDR synchronous GRAM, an SLDRRAM, or a RambusDRAM may be used. Further, any random access memory may be used as the sub memory portion provided that the memory allows access at higher speed than that of a memory used as the main memory portion. In a case where the main memory portion is constituted with a flush EEPROM, a memory capacity of the sub memory portion is preferably a half or more of the capacity of a unit erase sector of the flush EEPROM.

(3) System

The semiconductor memory device according to the present invention is provided with the SRAM column control circuit 122 and, therefore, an SRAM column control mode can be changed in an SRAM cell group unit, as to be described in detail later. This function allows the setting of a lap time, a burst length, and a latency, etc., (referred to as "data input/output mode", hereinafter) for every SRAM cell group, so that the data input/output mode of each SRAM cell group is automatically determined within the semiconductor memory device when the SRAM cell group is selected, by preliminarily providing the setting. Therefore, there is no need of data control externally of the semiconductor memory device or an external data processing control for switching the data input/output mode.

Figure 2:
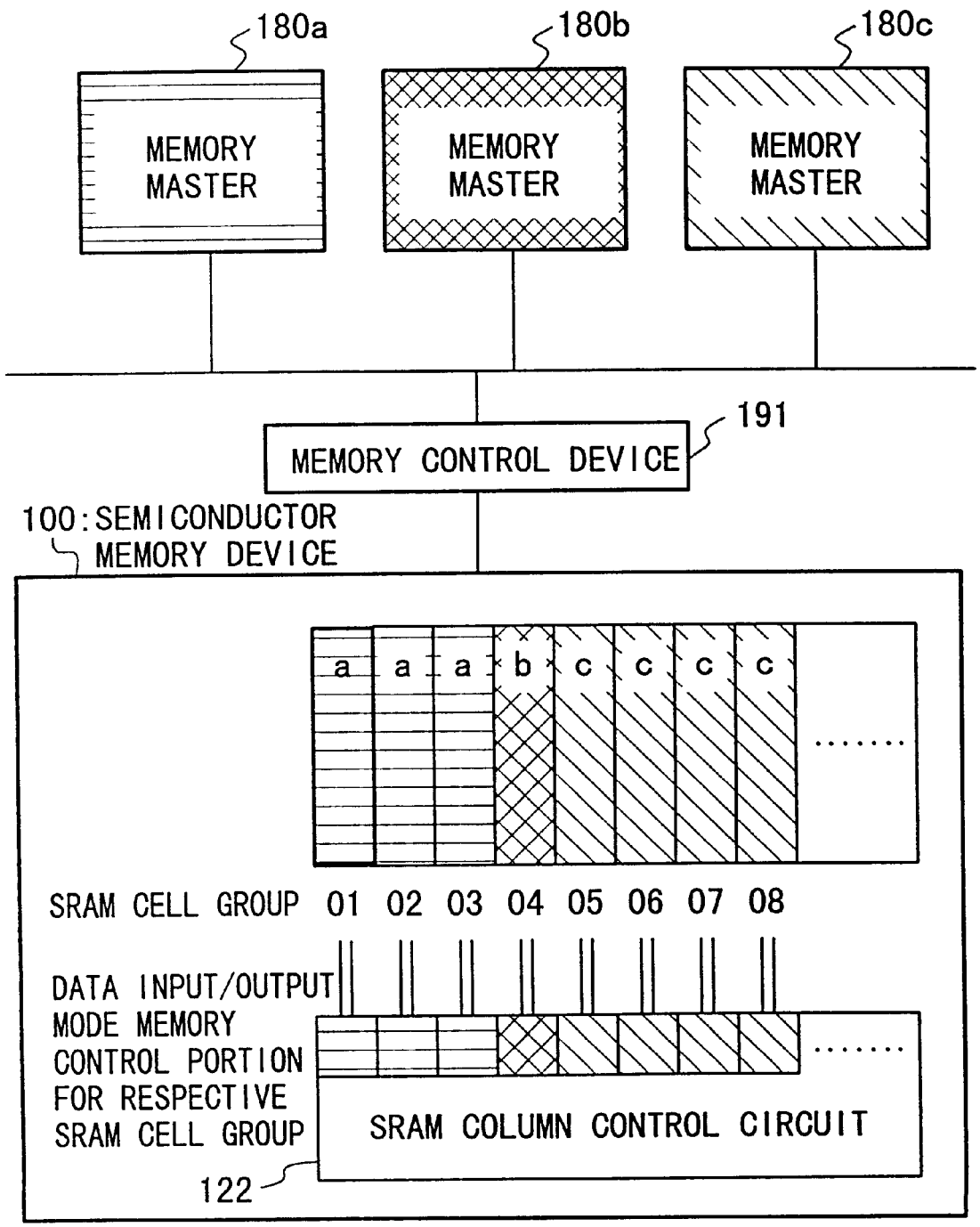
FIG. 2 is a block diagram of a memory system including the semiconductor memory device shown in FIG. 1 and a plurality of memory masters which perform access requests with respect to the semiconductor memory device.

The semiconductor memory device of the present invention has a function that, when it receives a plurality of access requests, the semiconductor memory device receives an allocation, assignment and/or re-assignment in SRAM cell group unit for every access request. FIG. 2 shows a memory system having a plurality of memory masters which perform access requests to the semiconductor memory device 100 shown in FIG. 1. In FIG. 2, SRAM cell groups 01, 02 and 03 are assigned to an access request from a memory master 180a, SRAM cell group 04 is assigned to an access request from a memory master 180b, and the SRAM cell groups 05, 06, 07 and 08 are assigned to an access request from a memory master 180c. The assignment of the SRAM cell groups to these access requests is variable and can be changed at any time.

Figure 3:
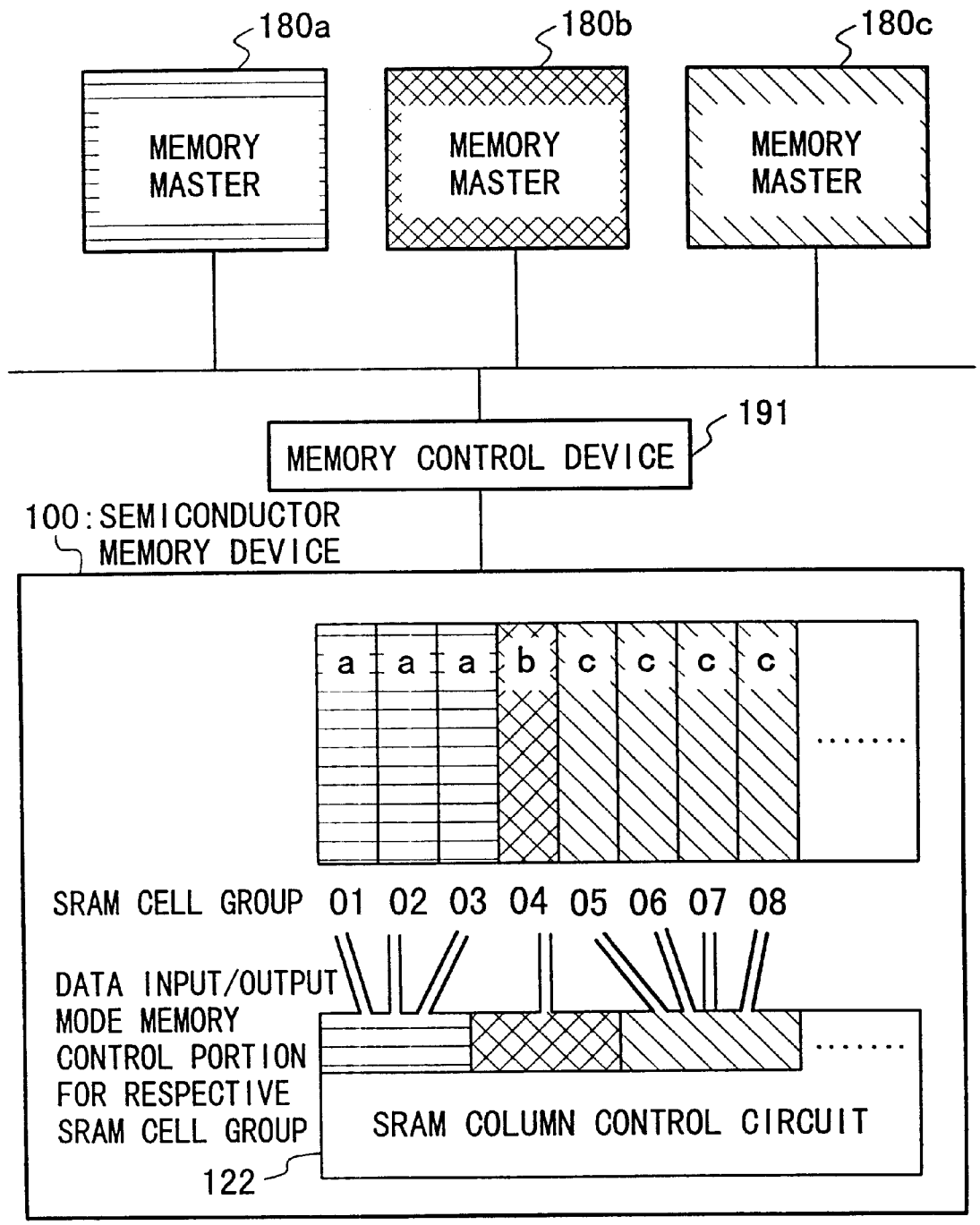
FIG. 3 is a block diagram of a memory system including the semiconductor memory device shown in FIG. 1 and a plurality of memory masters which perform access requests with respect to the semiconductor memory device.

Further, in FIG. 2, when the data input/output mode requested for the semiconductor memory device 100 by the memory master 180a is different from the data input/output mode requested for the semiconductor memory device by the memory master 180b, it is possible to perform the data input/output operation for the memory master 180a and the data input/output operation for the memory master 180b successively without using a special control signal. In order to realize such an operation, the SRAM column control circuit 122 of the semiconductor memory device 100 includes a data input/output mode memory portion. The data input/output mode memory portion may have a one-to-one correspondence to the SRAM cell groups as shown in FIG. 2 or may correspond to a plurality of SRAM cell groups as shown in FIG. 3.

(4) Pin Arrangement

FIG. 4 shows an example of a pin arrangement of a package of the semiconductor memory device according to the present invention. The semiconductor memory device shown in FIG. 4 has a x8-bit, 2-bank construction including a 64-Mbit DRAM array and a 16-Kbit SRAM array and a synchronous interface and is housed in a 54 pin TSOP type II plastic package of 400 mil×875 mil with a lead pitch of 0.8 mm. The number of pins and the pin arrangement of this pin construction are the same as those of a usual 64-Mbit synchronous DRAM. Further, the number of pins and the pin arrangement of other bit constructions are the same as those of a corresponding synchronous DRAM.

Signals of the respective pins are defined as follows:

CLK: A clock signal CLK is a reference clock commonly used for all other input/output signals. That is, the clock signal CLK determines take-in timing of other input signals and output signal timing. A set-up/store time of each external signal is defined with reference to a rising edge of the clock CLK.

CKE: A clock enable signal CKE determines whether or not a CLK signal subsequent thereto is effective. When the CKE signal is HIGH at the rising edge of the CLK signal, the CLK signal is determined as being effective and, when it is LOW, the CLK signal is determined as being invalid.

/CS: A chip select signal /CS determines whether or not external input signals /RAS, /CAS, /WE are accepted. When the signal /CS is LOW at the leading edge of the signal CLK, the /RAS signal, the /CAS signal and the /WE signal which are input at the same timing are received by the operation control circuit. When the signal /CS is HIGH at the leading edge of the CLK signal, the /RAS signal, the /CAS signal and the /WE signal input at the same timing are neglected.

/RAS, /CAS, /WE: The respective control signals /RAS, /CAS and /WE in combination determine the operation of the semiconductor memory device.

A0 to A13: Address signals A0 to A13 are received by the address control circuit according to the clock signal, sent to the DRAM row decoder, the DRAM column decoder, the SRAM row decoder, and the SRAM column decoder, and used to select a cell of the DRAM portion and a cell of the SRAM portion. Further, the address signals are input into a mode register to be described later, according to an internal command signal to set the data input/output mode of the internal operation. The address signal A13 is a bank selection signal of the DRAM cell array, too.

DQM: A data mask signal DQM functions to invalidate (mask) a data input and output in byte unit.

DQ0 to DQ7: Data signals DQ0 to DQ7 are input/output data signals.

(5) Basic Operation

A basic operation of the semiconductor memory device according to the present invention will be described. It should be noted that commands and the number of data are a mere embodiment and other combinations can be made arbitrarily.

FIG. 5 shows an example of various commands determining operation functions of the semiconductor memory device according to the present invention and states of the external input control signals. It should be noted, however, that any other combination of the various commands determining the operational functions of the semiconductor memory device and the states of the external input control signals can be used.

In FIG. 5, the states of the respective input control signals at a rising edge of a reference clock signal CLK and operations determined thereby are shown. A symbol "H" indicates a logical high level, "L" a logical low level, and "x" an arbitrary level. Further, input control signals CKEn−1 in FIG. 5 shows a state of the input control signal CKE in a period of a reference clock just preceding a specified reference clock, and the control signal CKE to be described for the respective commands is the CKEn−1.

Figure 10:
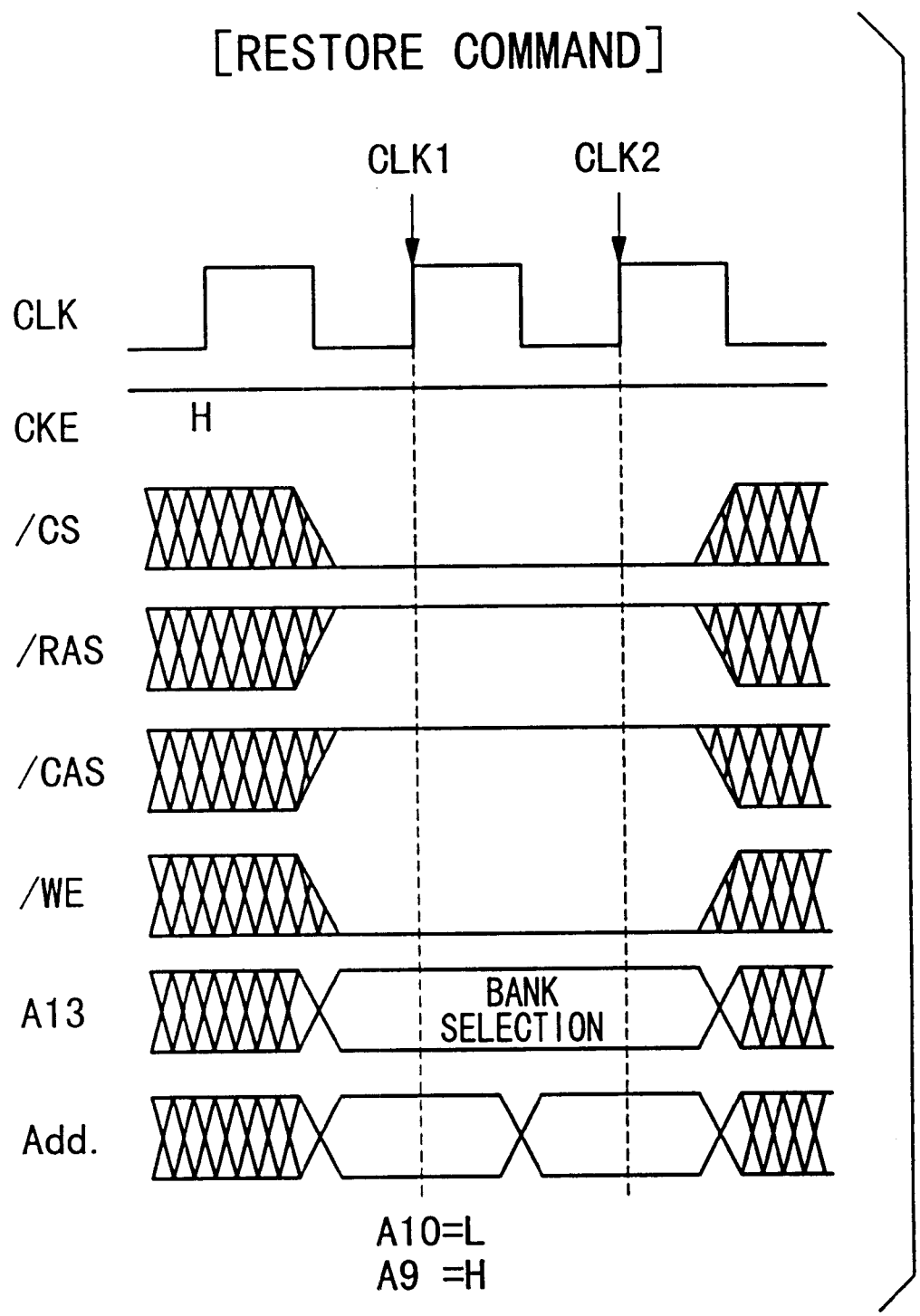
FIG. 10 shows states of the external terminals showing the restore command shown in FIG. 5.

The commands shown in FIG. 10 will be described in sequence.

1. [Read Command]

Read command is to execute a data read operation from an SRAM cell.

Figure 6:
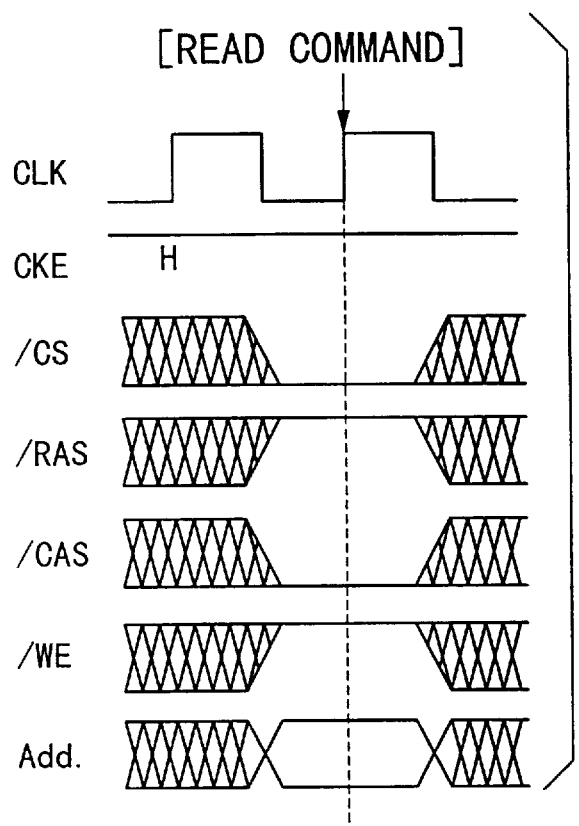
FIG. 6 shows states of the external terminals showing the read command shown in FIG. 5.

As shown in FIG. 6, the states of the respective input control signals at the rising edge of the external clock signal are CKE=H, /CS=L, /RAS=H, /CAS=L and /WE=H. When this read command is input, the addresses A0 to A3 and the addresses A4 to A10 are input as the SRAM row selection addresses and as the SRAM column selection addresses, respectively. Data at these addresses are output to DQ0 to DQ7 at a time delayed from the input of the read command by a latency. When DQM=H with the clock set for the read command, the data output of the DQ0 to DQ7 are masked and are not output externally.

Figure 24:
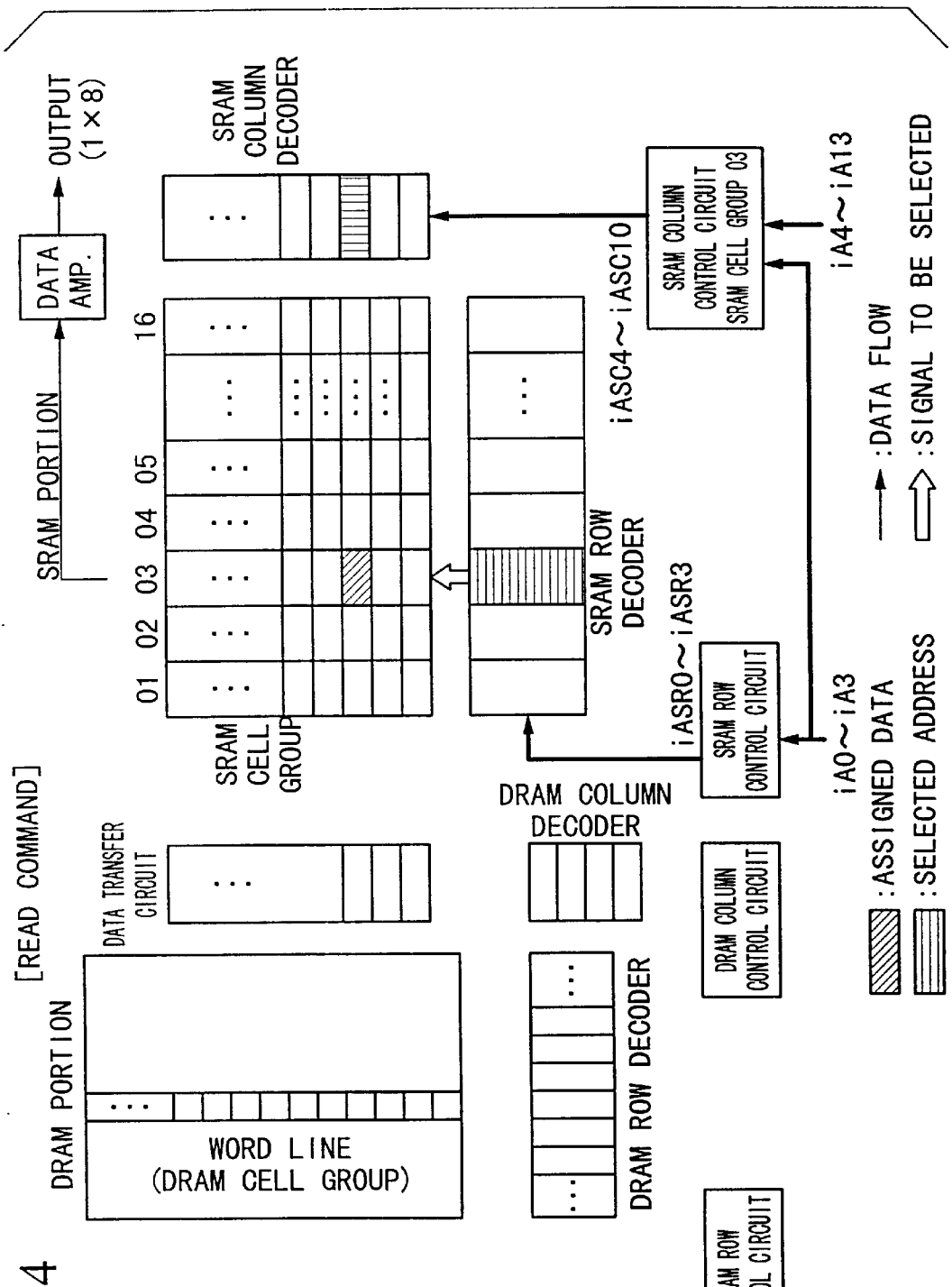
FIG. 24 is a flowchart of an address assignment and data in a read command operation.

FIG. 24 shows an address signal and a data flow in an internal operation according to this read command. SRAM cells are selected by the row selection of the SRAM row decoder by the internal address signals iA0 to iA3 and the column selection of the SRAM column decoder by the SRAM selection signals iASC4 to iASC10 generated from the internal address signals iA0 to iA3 and iA4 to iA13. Data of the selected SRAM cells are output externally through the data amplifier in an assigned data input/output mode.

2. [Write Command]

The write command performs the operation of writing data to the SRAM cell.

Figure 7:
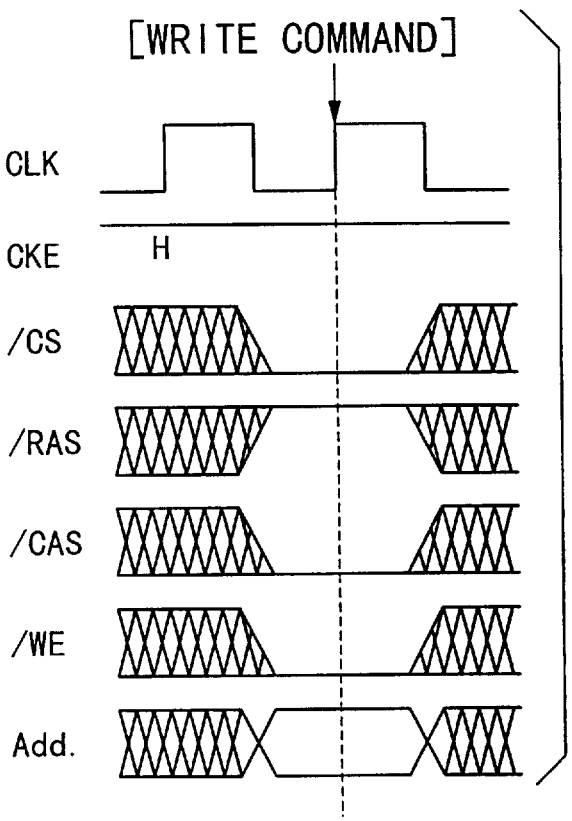
FIG. 7 shows states of the external terminals showing the write command shown in FIG. 5.

As shown in FIG. 7, the states of the respective input control signals at the rising edge of the external clock signal are CKE=H, /CS=L, /RAS=H, and /CAS=/WE=L. When the write command is input, the addresses A0 to A3 are received as SRAM row selection addresses and the addresses A4 to A10 are received as SRAM column selection addresses. As data to be written, the data of DQ0 to DQ7 is received at a time delayed from the input of the write command by a latency. When DQM=H with the clock for data input of DQ0 to DQ7, the data output of the DQ0 to DQ7 are masked and are not input.

Figure 25:
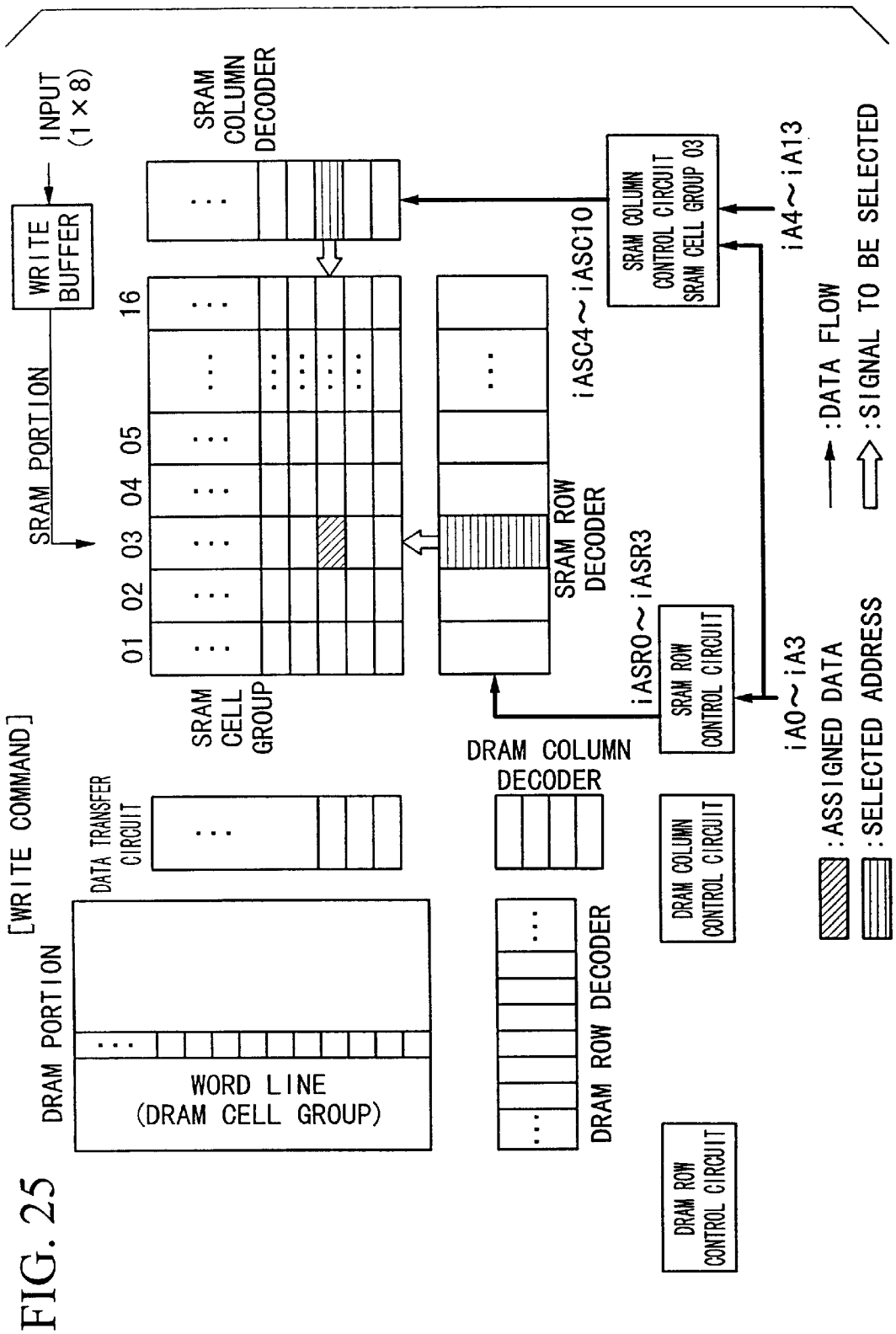
FIG. 25 is a flowchart of an address assignment and data in a write command operation.

FIG. 25 shows an address signal and a data flow in an internal operation according to this write command. SRAM cells are selected by the row selection of the SRAM row decoder by the SRAM row selection signals iASR0 to iASR3 generated from the internal address signals iA0 to iA3 and the column selection of the SRAM column decoder by the SRAM selection signal iASC4 to iASC10 generated from the internal address signals iA0 to iA3 and iA4 to iA13. The write data from DQ0 to DQ7 is written in the selected SRAM cell through the write buffer.

As shown in FIGS. 24 and 25, the read command and the write command perform the read and write regardless of the DRAM portion and the data transfer portion. Therefore, these commands can operate even when data transfer operation between SRAM cell groups other than the SRAM row selected for the data input/output and the DRAM portion and/or the operation inside the DRAM portion still continues. On the contrary, even if the read command or the write command is operated, it is possible to operate by commands of data transfer operation between SRAM cell groups other than the SRAM row selected for the data input/output and the DRAM portion and/or the operation inside the DRAM portion.

3. [Prefetch Command]

Figure 8:
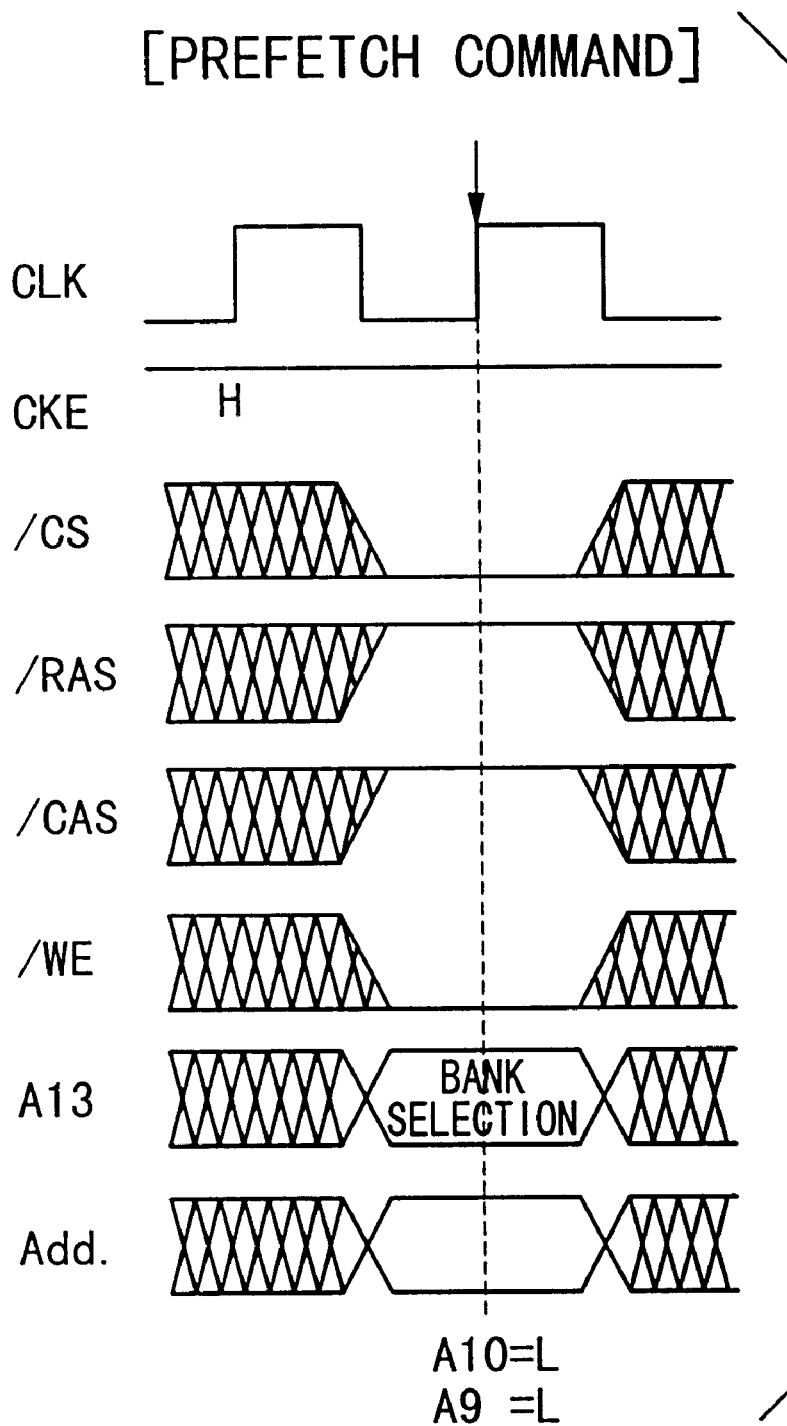
FIG. 8 shows states of the external terminals showing the prefetch command shown in FIG. 5.

The prefetch command is to perform a data transfer from a DRAM cell group to an SRAM cell group. As shown in FIG. 8, the states of the respective input control signals at the rising edge of the external clock signal are CKE=H, /CS=L, /RAS=/CAS=H and /WE=L. Further, A10=L and A9=L. When the prefetch command is input, the addresses A0 to A3 are input as SRAM row selection addresses, the addresses A5 to A6 are input as DRAM column selection addresses and A13 is input as a bank selection address of the DRAM array.

Figure 26:
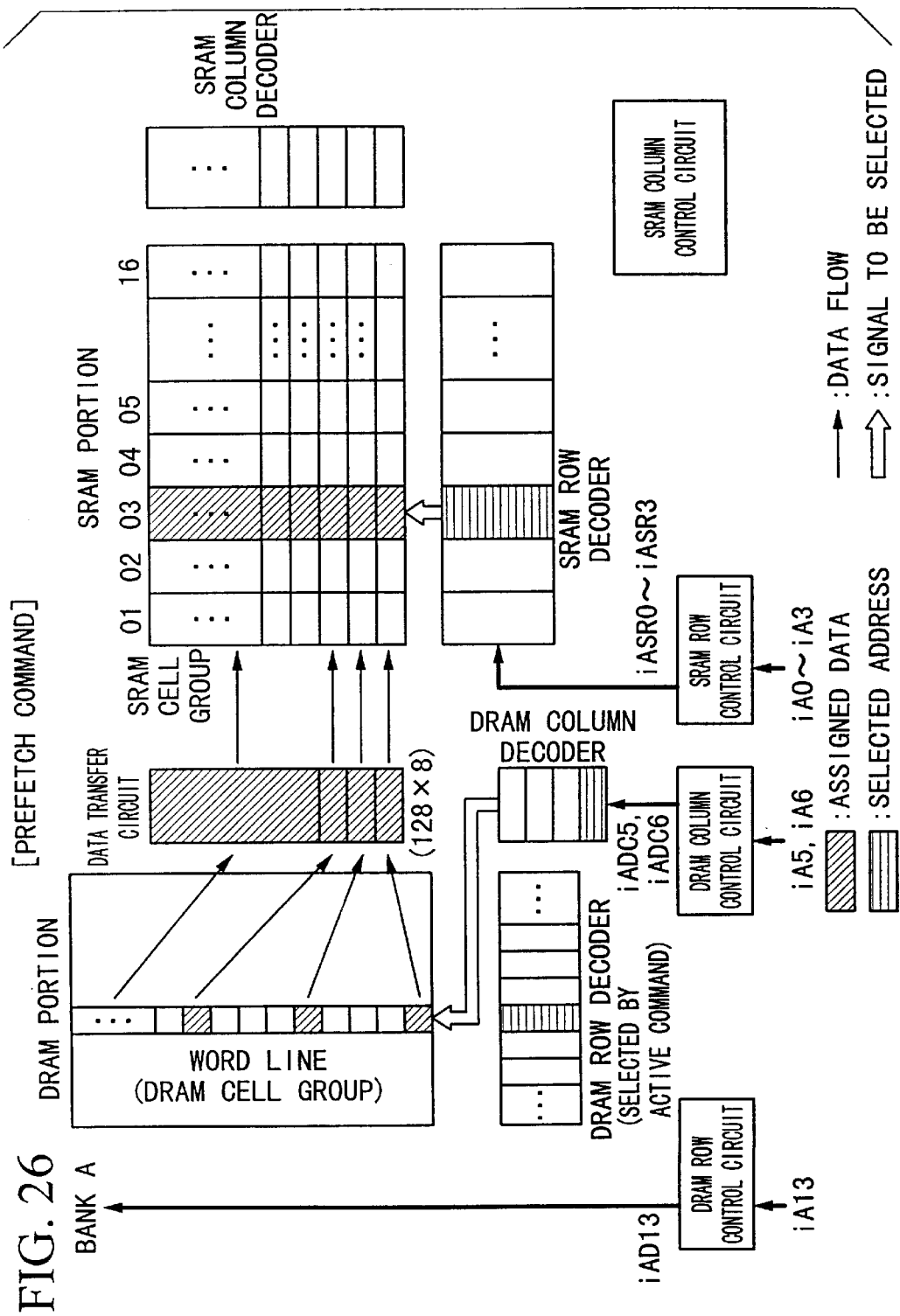
FIG. 26 is a flowchart of an address assignment and data in a prefetch command operation.

FIG. 26 shows an address signal and a data flow in an internal operation according to this prefetch command. Among DRAM cell groups already selected by an active command to be described later, an SRAM cell in a bank assigned by iA13 is selected. In this embodiment, the bank A is selected. Bit lines of the DRAM cell group assigned by the addresses iA5 and iA6 are selected. Data of the bit lines is amplified by the sense amplifier at the time of the active command and the data of the selected bit lines is transmitted to a data transfer bus line through the data transfer circuit. The cells on the row of the SRAM selected by the addresses iA0 to iA3 stop storing of the previous data, receive the data on the data transfer bus line, and store data transferred thereafter. An output from the sense amplifier through the data transfer circuit to the data transfer line is stopped after the data transfer. In this embodiment, the number of data transferred by the prefetch command at once is 128×8.

4. [Prefetch Command with Auto Precharge]

Figure 9:
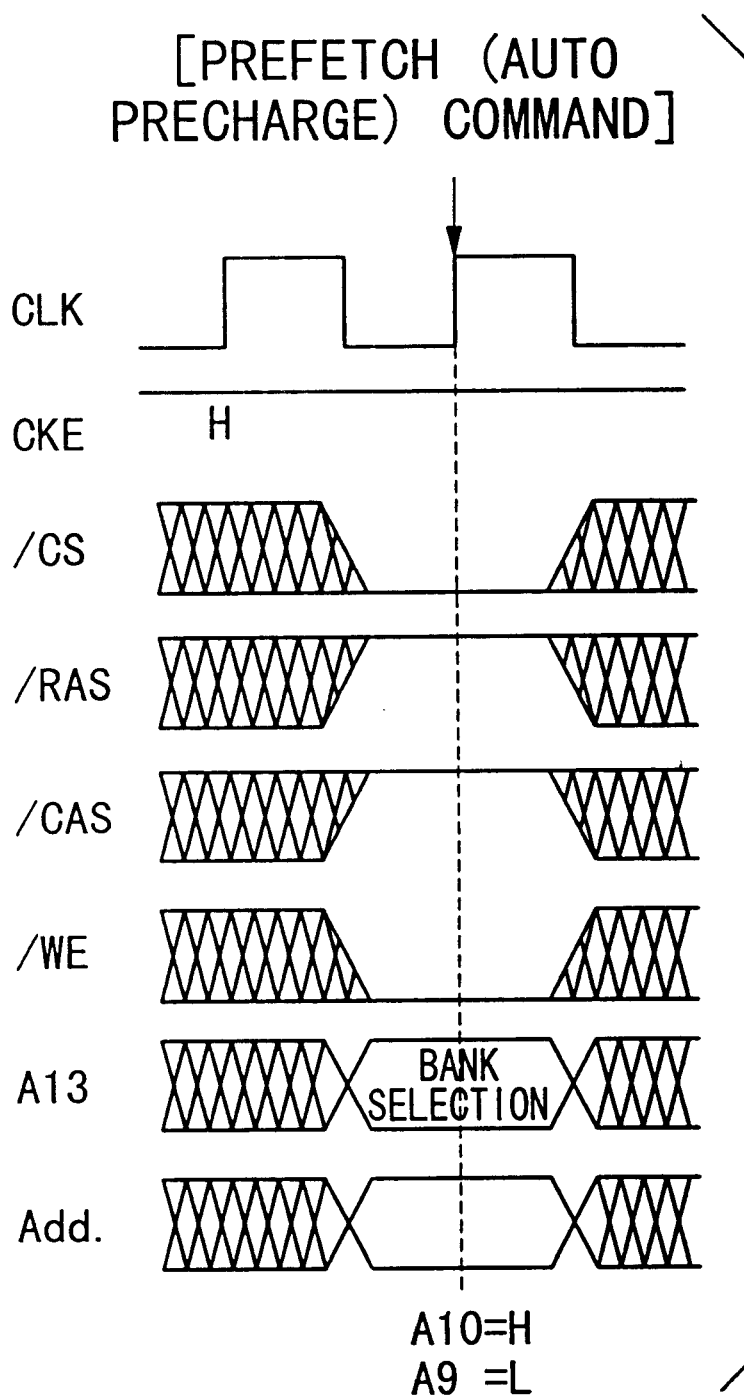
FIG. 9 shows states of the external terminals showing the prefetch command with auto precharge shown in FIG. 5.

The prefetch command with auto precharge is to transfer data from the DRAM cell group to the SRAM cell group and to automatically precharge the DRAM portion after data transfer. As shown in FIG. 9, the states of the respective input control signals at the rising edge of the external clock signal are CKE=H, /CS=L, /RAS=/CAS=H, and /WE=L. Further, A10=H and A9=L. Similarly to the above mentioned prefetch command, the addresses A0 to A3 are input as SRAM row selection addresses, the addresses A5 and A6 are input as DRAM column selection addresses, and A13 is input as a bank selection address of the DRAM array when the prefetch command with auto precharge is input.

Address signals in an internal operation and data flow caused by the prefetch command with auto precharge will be described. Among DRAM cell groups already selected by the active command to be described later, an SRAM cell in a bank assigned by iA13 is selected. Bit lines of the DRAM cell group assigned by the addresses iAs and iA6 are selected. Data of the bit lines is amplified by the sense amplifier at the time of the active command and the data of the selected bit lines is transmitted to a data transfer bus line. The cells on the row of the SRAM selected by the addresses iA0 to iA3 stop storing of the previous data, receive the data on the data transfer bus line, and store data transferred thereafter. An output from the sense amplifier through the data transfer circuit to the data transfer line is stopped after the data transfer. After a predetermined time from the stoppage of output to the data transfer bus line, the word line is set to a non-selection state, and the internal operation (potential equilibration of the bit line and the sense amplifier) to be described for the precharge command is performed. After a predetermined time from the input of the prefetch command with auto precharge, the DRAM is automatically made in a precharge (non selection) state.

5. [Restore Command]

The restore command is to perform a data transfer from the SRAM cell group to the DRAM cell group. As shown in FIG. 10, this command is a continuous input command extending over the external clock signals CLK1 and CLK2. The states of the respective input control signals at the rising edge of the external clock signal shown in FIG. 10 are CKE=H, /CS=L, /RAS=/CAS=H, and /WE=L. Further, A10=L and A9=H.

At the rising edge of the first external clock signal CLK1, the addresses A0 to A3 are input as SRAM row selection addresses, and the addresses A5 and A6 are input as DRAM column selection addresses. At the rising edge of the second external clock signal CLK2, addresses A0 to A12 are input as row selection addresses of the DRAM array which is a destination of transfer. The addresses A13 are input as the bank selection addresses of the DRAM array at the rising edges of the CLK1 and CLK2. The A13 addresses input by the CLK1 and CLK2 must be identical.

Figure 27:
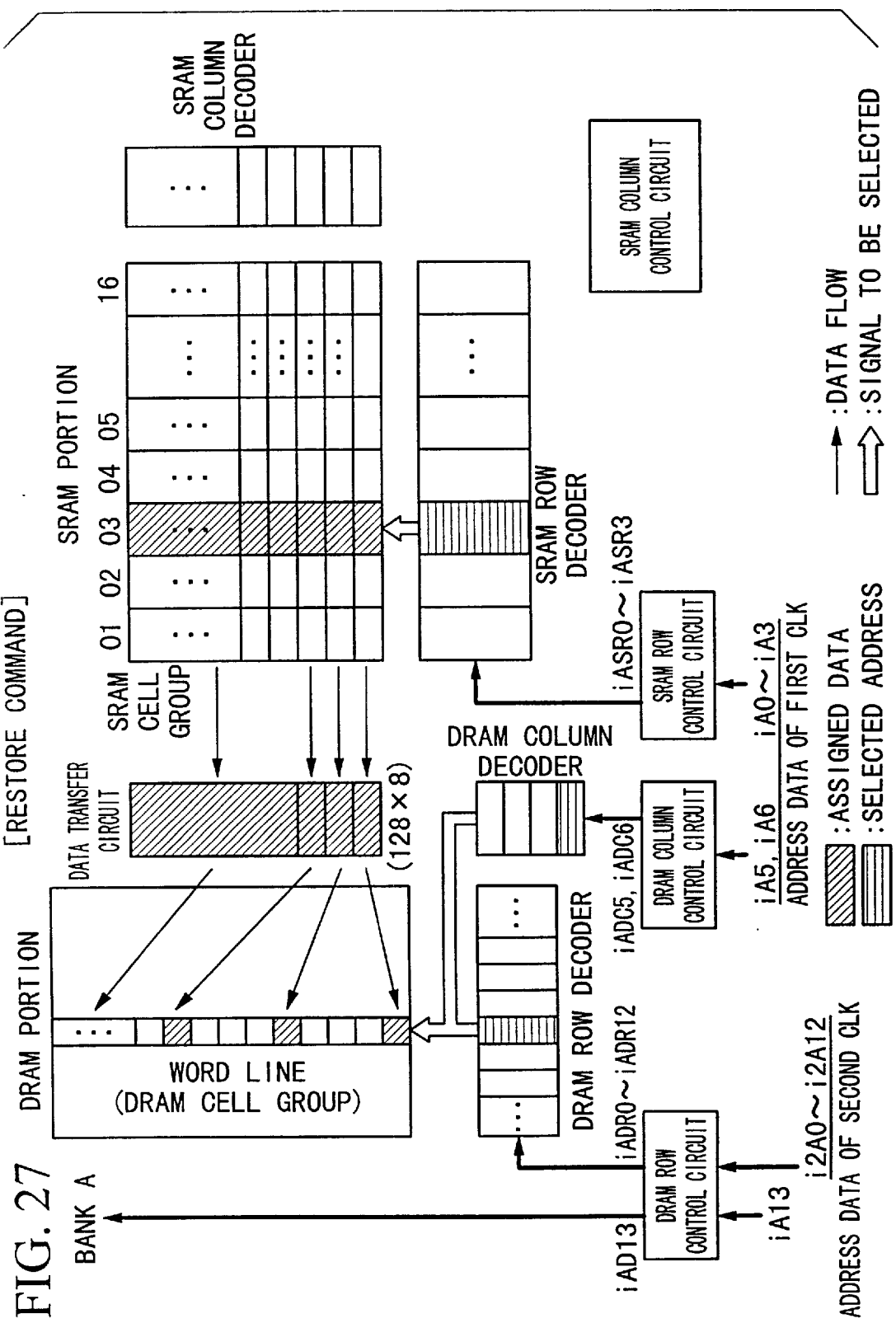
FIG. 27 is a flowchart of an address assignment and data in a restore command operation.

FIG. 27 shows address signals in an internal operation and data flow caused by this restore command. Internal address signals i1A0 to i1A12 shown in FIG. 27 are internal address data at the time of the first clock CLK1 and internal address signals i2A0 to i2A12 are internal address data at the time of the second clock CLK. Data of identical internal address signal line being shown for each clock. Data of the SRAM cell group selected by the addresses i1A0 to i1A3 generated from the address at the first clock CLK1 is transferred to a data transfer bus line of a bank selected by the address iA13. Thereafter, the data of the data transfer bus line is transferred to bit lines of the DRAM selected by the addresses i1A5 and i1A6.

Further, word lines of the DRAM are selected by the addresses i2A0 to i2A12 and iA13 are selected, and data of the cell groups on the selected word lines are output to corresponding bit lines, respectively. Sense amplifiers corresponding to the bit lines of the DRAM detect and amplify the data of the DRAM cell groups output to the bit lines, respectively. The sense amplifiers corresponding to the bit lines selected by the addresses i1A5 and i1A6 detect and amplify write data transmitted from the data transfer bus line. A data output through the data transfer bus line to the bit lines of the DRAM is stopped after the word line is raised. In this embodiment, the number of data transferred at once is 128×8.

6. [Restore Command with Auto Precharge]

Figure 11:
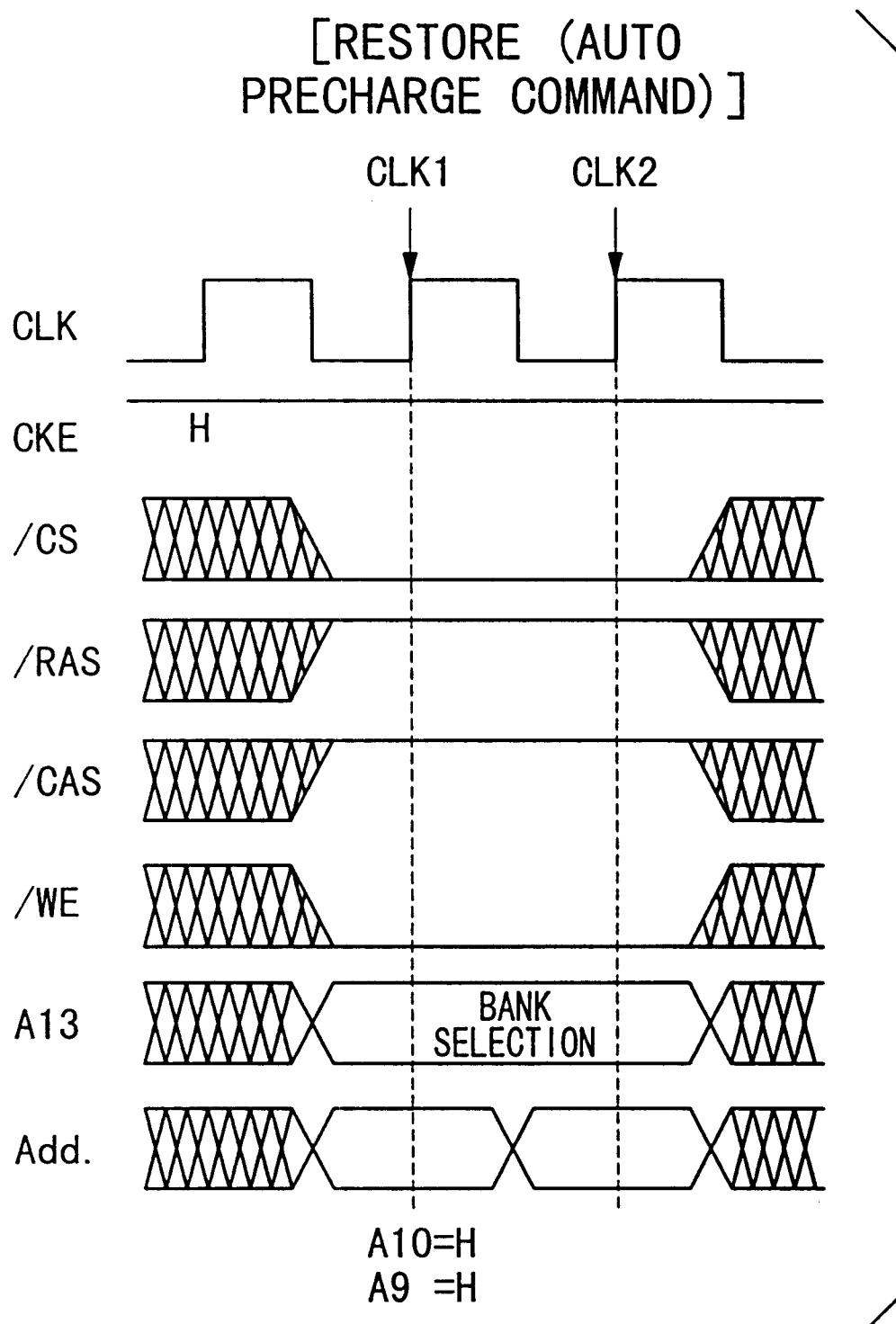
FIG. 11 shows states of the external terminals showing the restore command with auto precharge shown in FIG. 5.

The restore command with auto precharge is to perform a data transfer from an SRAM cell group to a DRAM cell group and to automatically perform a precharge of the DRAM portion after the data transfer. As shown in FIG. 11, the states of the respective input control signals at the rising edges of the external clock signal CLK1 and CLK2 are CKE=H, /CS=L /RAS=/CAS=H and /WE=L and, further, A10=H and A9=H.

At the rising edge of the first external clock signal CLK1, the addresses A0 to A3 are input as SRAM row selection addresses, and the addresses A5 and A6 are input as DRAM column selection addresses. At the rising edge of the next, a second external clock signal CLK2, and addresses A0 to A12 are input as row selection addresses of the DRAM array which is a destination of transfer. The addresses A13 are input as the bank selection addresses of the DRAM array at the rising edges of the CLK1 and CLK2. The A13 addresses input by the CLK1 and CLK2 must be identical.

Address signals in an internal operation and data flow caused by this restore command with auto precharge will be described. Data of the SRAM cell group selected by the addresses i1A0 to i1A3 generated from the addresses at the time of the first clock CLK1. is transmitted to the data transfer bus line of the bank selected by the address iA13. Thereafter, the data of the data transfer bus line is transmitted to the bit line of the DRAM selected by the addresses i1A5 and i1A6. Then, word lines of the DRAM are selected by the addresses i2A0 to i2A12 and iA13 generated by the addresses at the time of the next clock CLK2, and data of the cell groups on the selected word lines are output to corresponding bit lines.

The sense amplifiers corresponding to the respective bit lines detect and amplify data of the DRAM cell group output to the bit lines, and the sense amplifiers corresponding to the bit lines selected by the addresses i1A5 and i1A6 detect and amplify write data transferred from the data transfer bus line. The output to the bit lines of the DRAM through the data transfer bus line is stopped after the word line is raised, then the word line is set to a non-selection state after a predetermined time, and an internal operation (equilibration of the bit line and the sense amplifier) indicated by a precharge command to be described later is performed. After a predetermined time from the command, the DRAM automatically switches to a precharge (non-selection) state.

7. [Active Command]

Figure 12:
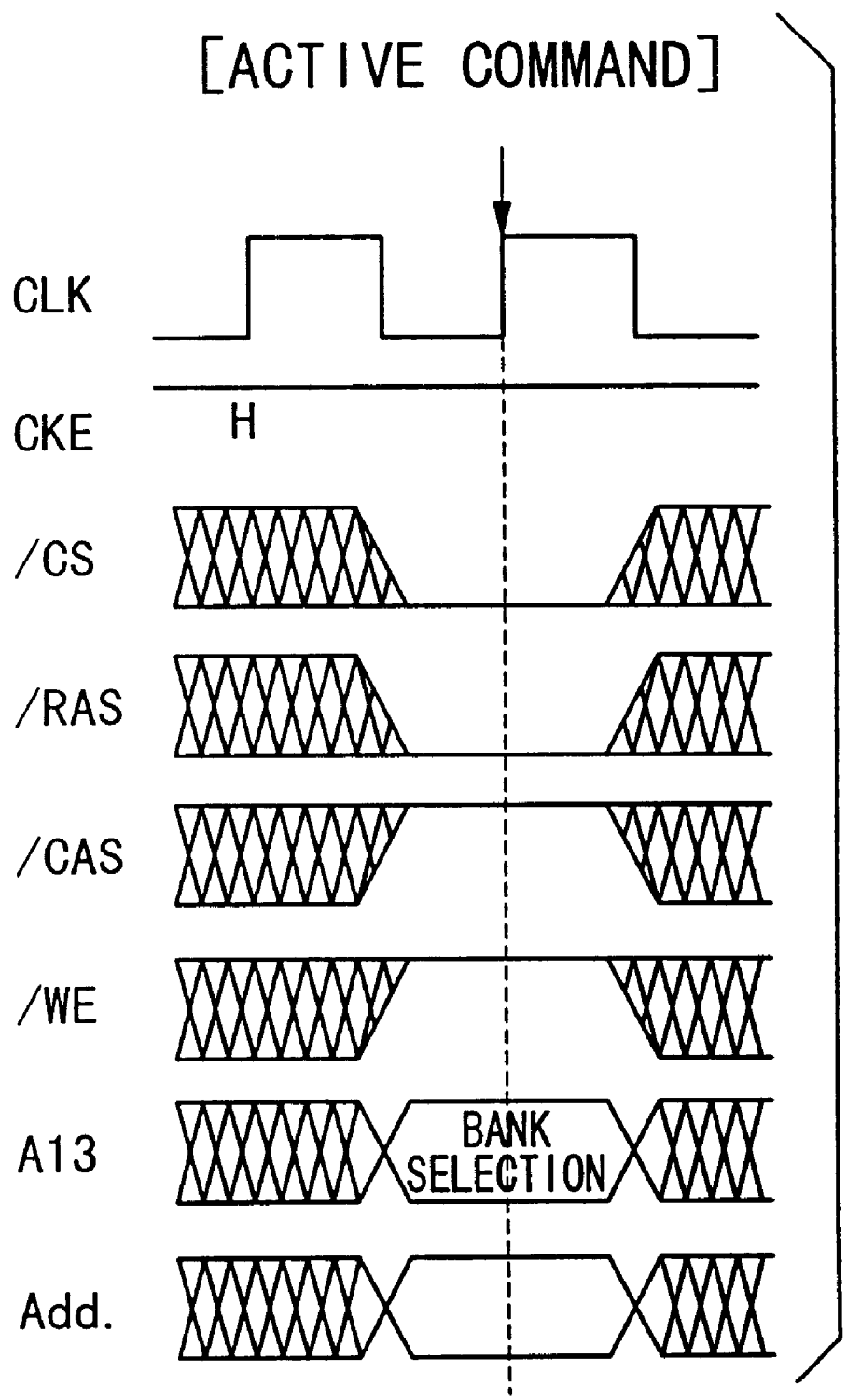
FIG. 12 shows states of the external terminals showing the active command shown in FIG. 5.

The active command is to activate a bank selected from the DRAM array. As shown in FIG. 12, the states of the respective input control signals at the rising edges of the external clock signal are CKE=H, /CS=/RAS=L, and /CAS=/WE=H. An address A13 at the input time of this active command is input a bank selection address of the DRAM, and addresses A0 to A12 are input as row selection address of the DRAM.

Figure 28:
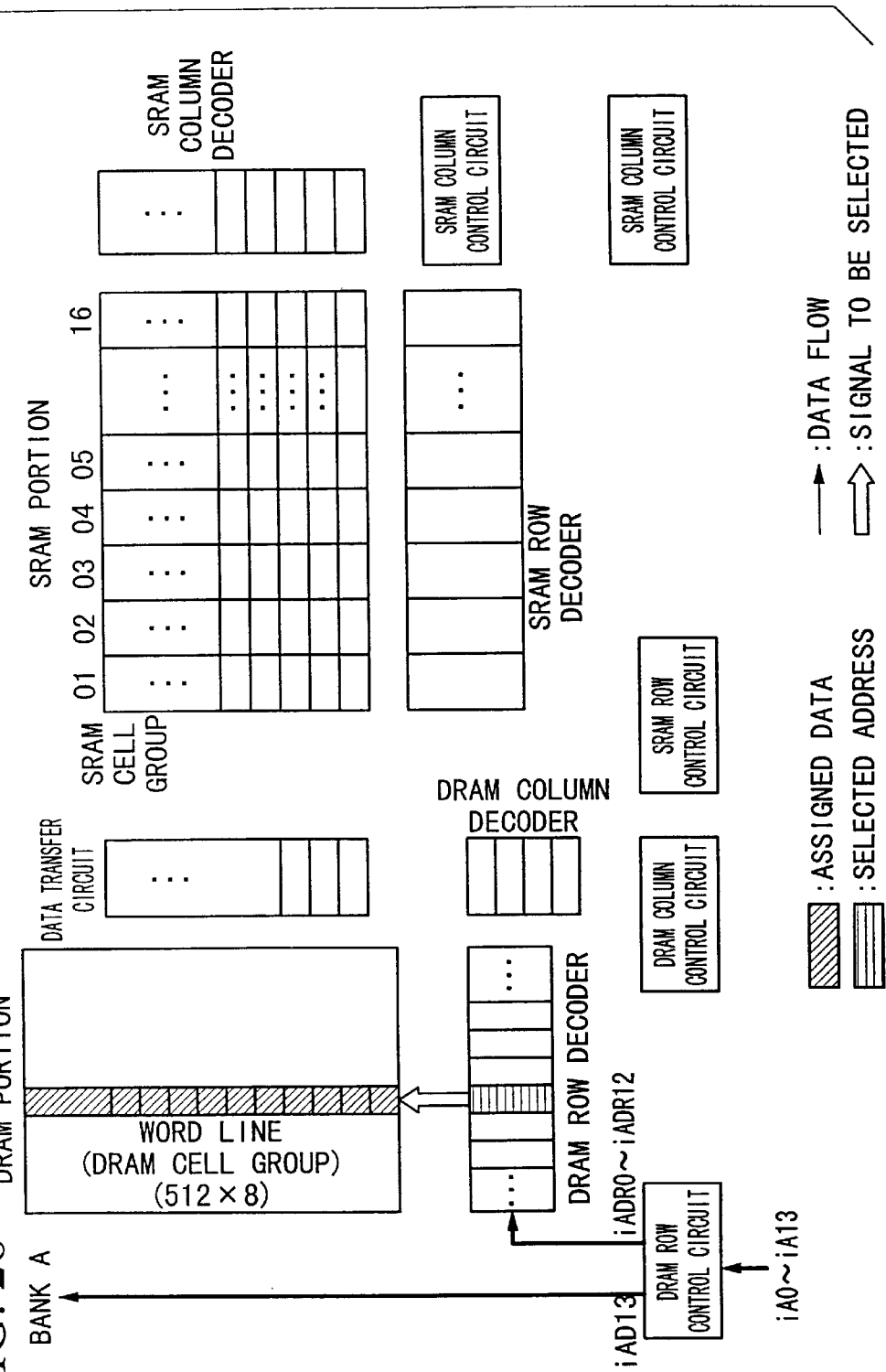
FIG. 28 is a flowchart of an address assignment and data in an active command operation.

FIG. 28 shows address signals in an internal operation caused by the active command and data flow. In the bank selected by the address iA13, the word lines of the DRAM are selected by the addresses iA0 to iA12. Data of DRAM cell groups on the selected word lines are output to bit lines connected thereto, and the sense amplifiers corresponding to the respective bit lines detect and amplify the data of the DRAM cell groups output to the bit lines. In this embodiment, the number of data transferred at one time is 512×8.

When another word line selection is to be performed with respect to a bank which is already activated, it is necessary to make the bank in a precharge state and then to newly input an active command. This command corresponds to a case where a /RAS signal of a usual DRAM is set to LOW.

8. [Precharge Command]

Figure 13:
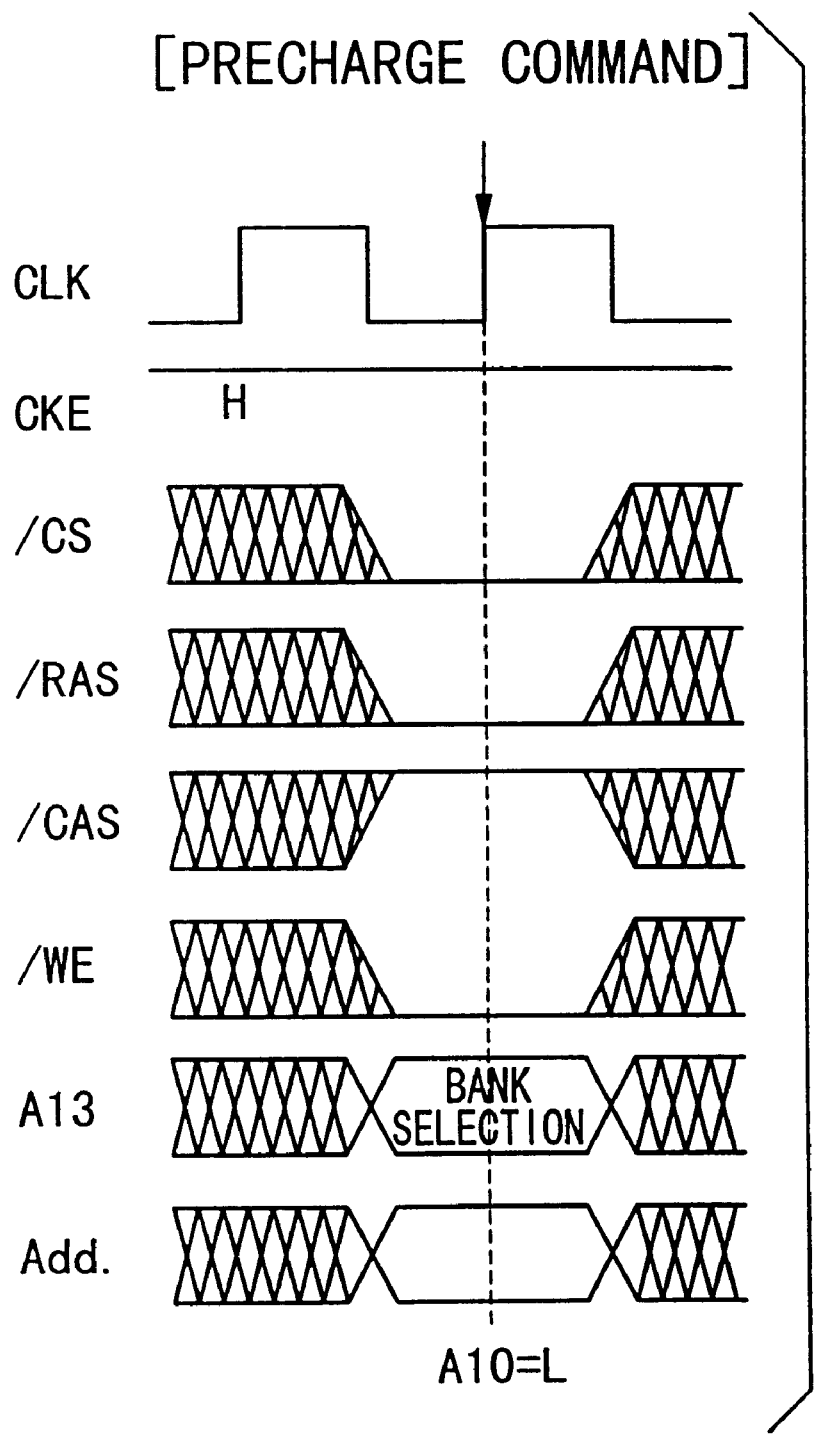
FIG. 13 shows states of the external terminals showing the precharge command with auto precharge shown in FIG. 5.

The precharge command is to precharge (inactivation) a bank selected from a DRAM array. As shown in FIG. 13, the states of the respective input control signals at the rising edges of the external clock signal are CKE=H, /CS=/RAS=L, /CAS=H and /WE=L. When, upon the input of the precharge command, A10=L and A13=valid data, a bank assigned by data of the address A13 is precharged (non-selection). The bank is selected at the active command input prior to this precharge, and, when there is no active command input into the bank assigned by this precharge command prior to the input of the latter command thereto, the precharge command is invalid.

Address signals in an internal operation caused by the precharge command and data flow will be described. Bit line potential and sense amplifier potential are equilibrated by switching a word line of a DRAM whose bank selected by the address iA13 is activated to a non-selection state. After the operation of the precharge command completes, the selected bank becomes ready to receive a next active command. The precharge command corresponds to a case where a /RAS signal of a usual DRAM is set to HIGH.

9. [All Bank Precharge Command]

Figure 14:
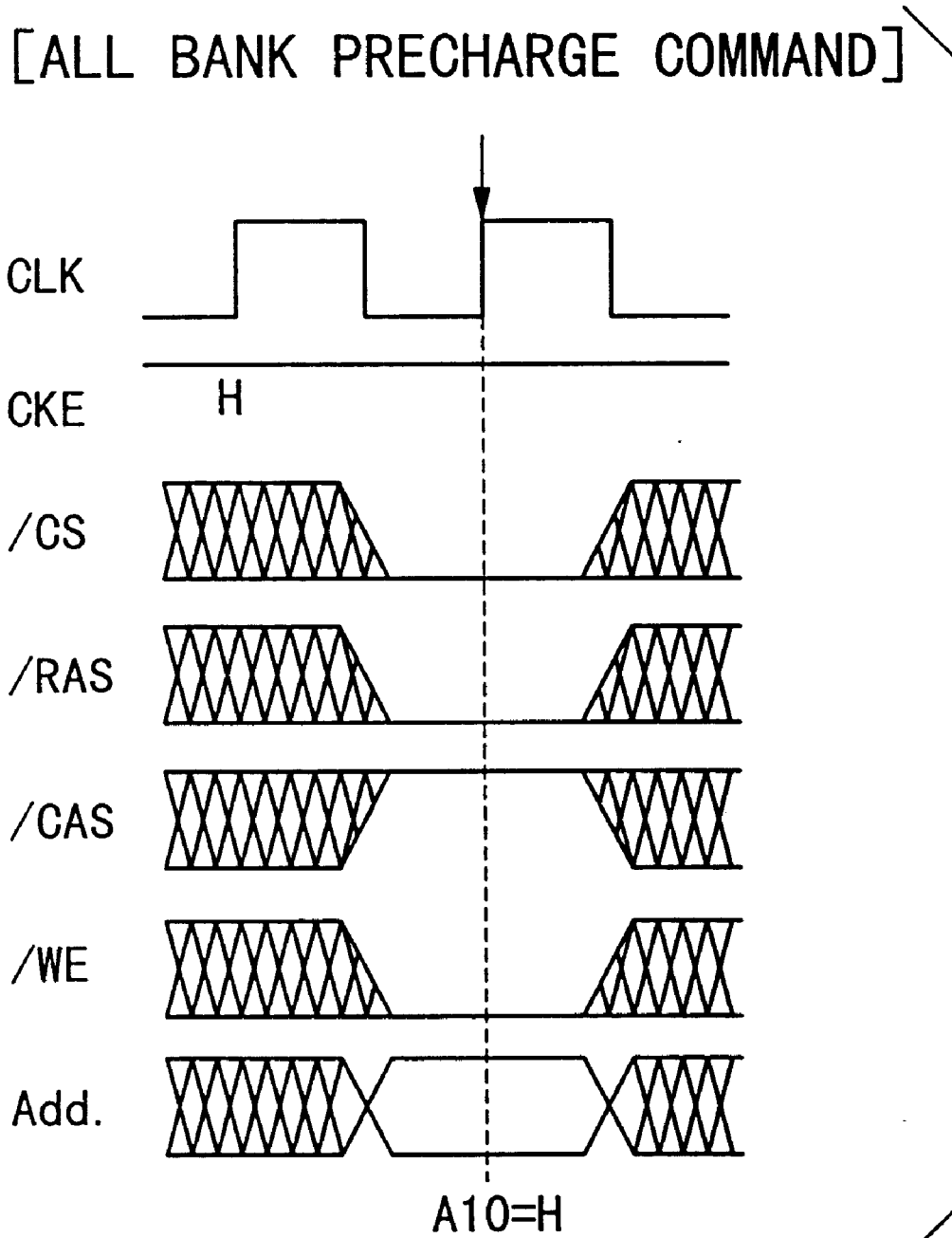
FIG. 14 shows states of the external terminals showing the whole bank precharge command shown in FIG. 5.

The all bank precharge command is to precharge (inactivation) all banks of a DRAM array. With this command, the DRAM portion is set to a precharge state and the active state of all banks can be ended. As shown in FIG. 14, the states of the respective input control signals at the rising edges of the external clock signal CLK are CKE=H, /CS=/RAS=L, /CAS=H, and /WE=L. Further, A10=H.

Address signals in an internal operation caused by the precharge command and data flow will be described. Bit line potential and sense amplifier potential are equilibrated by setting all word lines of a selected DRAM to a non-selection state. After the operation of this command is completed, all banks become ready to receive a next active command input. The all bank precharge command corresponds to a case where a /RAS signal of a usual DRAM is set to HIGH.

10. [CBR Refresh Command]

The CBR refresh command is to refresh cell data of a DRAM portion. The address signal necessary for the refresh is automatically generated internally. As shown in FIG. 15, the states of the respective input control signals at the rising edges of the external clock signal are CKE=H, /CS=/RAS=/CAS=L and /WE=H.

Address signals in an internal operation caused by the CBR refresh command and data flow will be described. Addresses iA0 to iA12 and iA13 are automatically generated internally. A bank is selected by the internally generated address iA13, word lines of a DRAM are selected by the internally generated addresses iA0 to iA12, DRAM cell groups on the selected word lines output their data to corresponding bit lines, respectively. Sense amplifiers corresponding to the respective bit lines detect and amplify the data of the DRAM cell groups output to the bit lines. The data detected and amplified by the sense amplifiers are written in the DRAM cell groups again through the bit lines. After a predetermined time from the re-write of the data, the word lines are switched to a non-selection state to equilibrate the bit line and sense amplifiers potential, completing a refresh operation.

11. [Non-Operation Command]

Non-operation commands of CKE=H, /CS=L, and /RAS=/CAS =/WE=H shown in FIG. 16 are not execution commands.

12. [Device Non-Selection Command]

Device non-selection commands of CKE=H, /CS=H shown in FIG. 17 are not execution commands.

13. [Register Setting Command]

Figure 19:
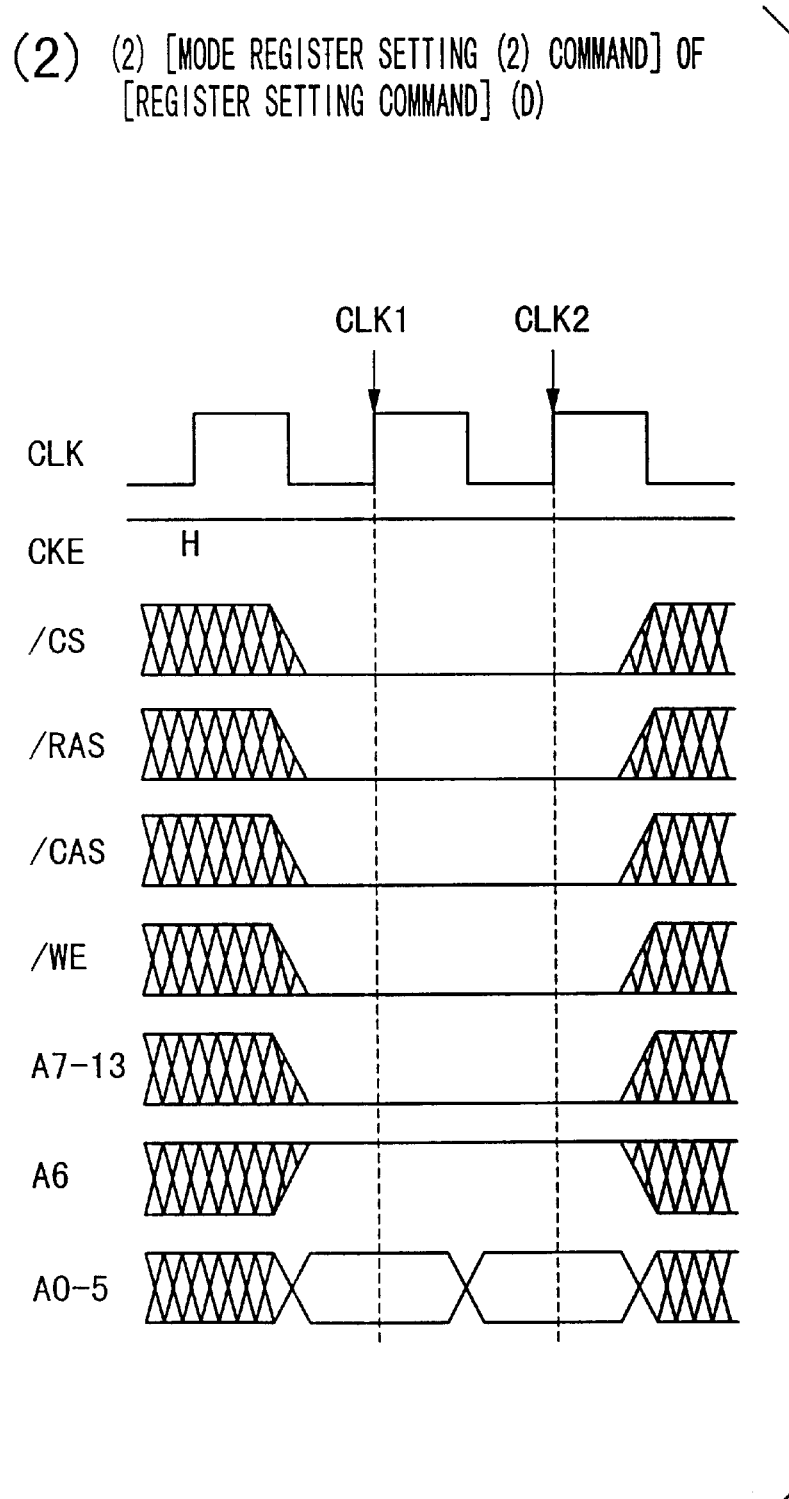
FIG. 19 shows states of the external terminals showing the register setting command (2) shown in FIG. 5.

The register setting command is to set setting data in various operation modes in a register. As shown in FIGS. 18 and 19, the states of the respective input control signals at the rising edges of the external clock signal are CKE=H, and /CS=/RAS=/CAS=/WE=L. At a time of input of this command, valid data of the addresses A0 to A13 are input as setting data of operation modes. An input of a register setting by this command is necessary in order to initialize a device after a power source is connected.

FIG. 20 shows an operation by address data at the register setting command. Portions of register setting commands (a), (b), (c) and (d) shown in FIG. 20 are input by one clock shown in FIG. 18 and another portion of the register setting command (d) to be described later is input by two clocks shown in FIG. 19. The register setting command (a) in FIG. 20 is a test set of a refresh counter, which is similar to that of a usual synchronous DRAM. This address set is selected upon the input of A7=H and A8=L. The register setting command (b) in FIG. 20 is an unused set. This address set is selected upon the input of A7=L and A8=H. The register setting command (c) in FIG. 20 is a device test set. This address set is selected upon the input of A7=H and A8=H. The register setting command (d) in FIG. 20 is a mode register setting set. This address set is selected upon the input of A7=L and A8=L, and various data input/output modes to be described later are set. A mode register stores data input/output modes of the respective SRAM cell groups of the sub memory portion.

FIG. 21 is a list of detailed setting items of the mode register setting. A mode register setting (1) command is to switch between a latency mode and an input/output address sequence (lap type). This command is input by one clock of an external clock signal such as shown in FIG. 18. This address set is selected when A6=L, A7=L, and A8=L. The latency mode setting is determined by data of A1, A2 and A3 input simultaneously, and the input/output sequence (lap type) is set by data of A0. The latency mode is set to latency=2 when A1=L, A2=H, and A3=L and, otherwise, switches to nonsetting or unused state. The input/output address sequence (lap type) is set to sequential when A0=L and to interleave when A0=H.

The mode register setting (2) command is an address data set for setting a burst length of every selected row of the SRAM and, in order to input the row assignment of the SRAM and the burst length data, is continuously input over two clocks of the external clock signal as shown in FIG. 19. This address set is selected when A6=H, A7=L, and A8=L. An SRAM cell group is selected by data of A0, A1, A2 and A3 of the first clock CLK1, and the burst length of the selected cell group is set by data of A3, A4, and A5 of the next clock CLK2. The burst length is set to 1 when A3=L, A4=L, and A5=L, to 2 when A3=H, A4=L, and A5=L, to 4 when A3=L, A4=H, and A5=L, to 8 when A3=H, A4=H and A5=L, and to 16 when A3=L, A4=L and A5=H.

Various data input/output modes will be described briefly.

Figure 22:
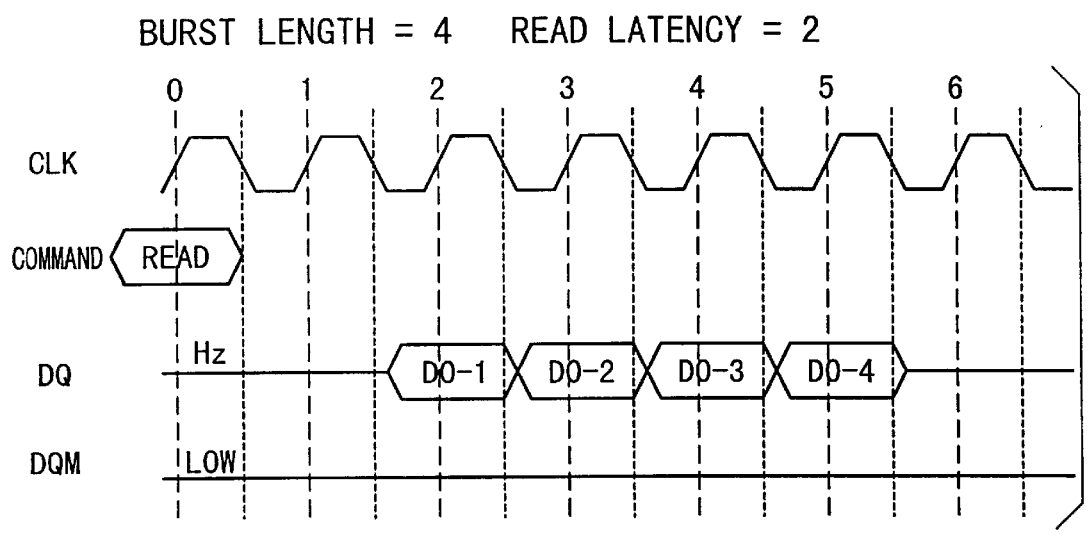
FIG. 22 shows an address sequence accessed corresponding to respective lap times and burst lengths of data input/output mode.
Figure 23:
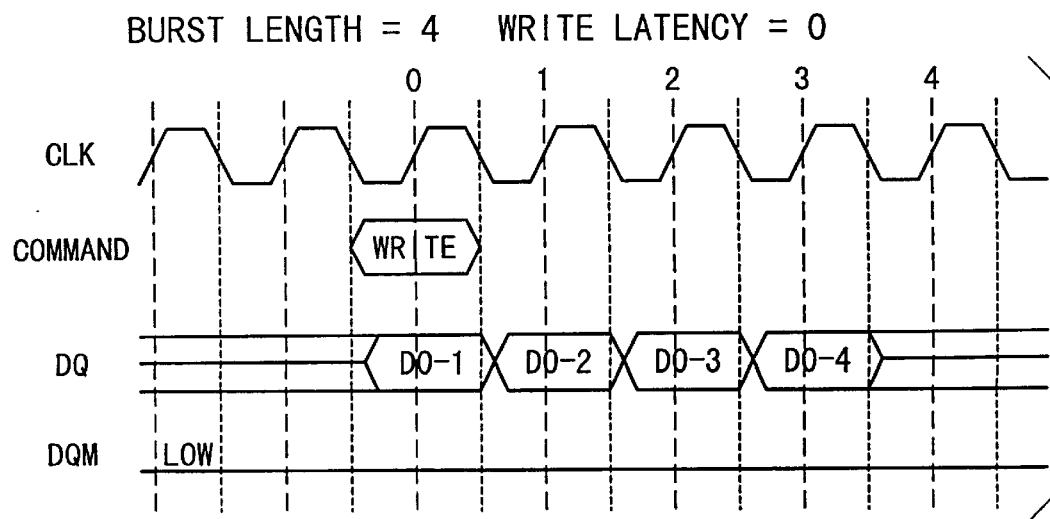
FIG. 23 is a timing chart of data output having a burst length of 4 and a read latency of 2 at a read command input.

Burst Length: burst length represents the number of data continuously input/output by the input of a read command or write command. The continuous data input/output is performed on the basis of a clock signal. FIG. 22 shows a timing of the respective signals for data read, in which the burst length is 4. That is, when the read command is input at CLK0, four data D0-1 to D0-4 are successively output at CLK2, CLK3, CLK4, and CLK5. FIG. 23 shows a timing of the respective signals for data write. Since the burst length is 4, when the write command is input at CLK0, four data D0-1 to D0-4 are successively input at CLK0, CLK1, CLK2, and CLK3.

Latency: latency represents a waiting time by the number of clocks from the input time of a read command or write command to a time at which data input/output becomes possible. FIG. 22 shows a timing of respective signals when the data is read. In this embodiment, the latency at data read is 2. That is, when a read command is input at CLK0, output of data to a DQ terminal is started at CLK2. FIG. 23 shows a timing of the respective signals when the data is written. In this embodiment, the latency when the data is written is 0. That is, when the write command is input at CLK0, the data take-in from the DQ terminal is started simultaneously with the CLK0 input.

Lap Type: Lap type (input/output address sequence) determines an address sequence of data input/output when data is input/output successively for a time corresponding to a set burst length, and includes sequence and interleave. Another operation is a function control by control of the clock enable signal CKE, as in the usual synchronous DRAM.

A portion of the operation of the semiconductor memory device according to the present invention will be described.

Read operation when there is externally assigned data in the SRAM portion: as shown in FIG. 24, data assigned by a read command is only output externally through a data amplifier.

Read when there is no externally assigned data in the SRAM portion: after the active command shown in FIG. 28 is completed, the prefetch command shown in FIG. 26 is executed, and the assigned data is transferred to the SRAM portion. Then, the assigned data is externally output through the data amplifier by the read command shown in FIG. 24.

Read when there is no externally assigned data in the SRAM portion and there is a write data which is not restored as yet: the write data is transferred to the DRAM portion by the restore command shown in FIG. 27. Thereafter, the active command shown in FIG. 28 and the prefetch command shown in FIG. 26 are executed, and the assigned data is transferred to the SRAM portion. Then, the assigned data is output externally through the data amplifier by the read command shown in FIG. 24.

(6) Layout

1. [Overall Layout]

Figure 30:
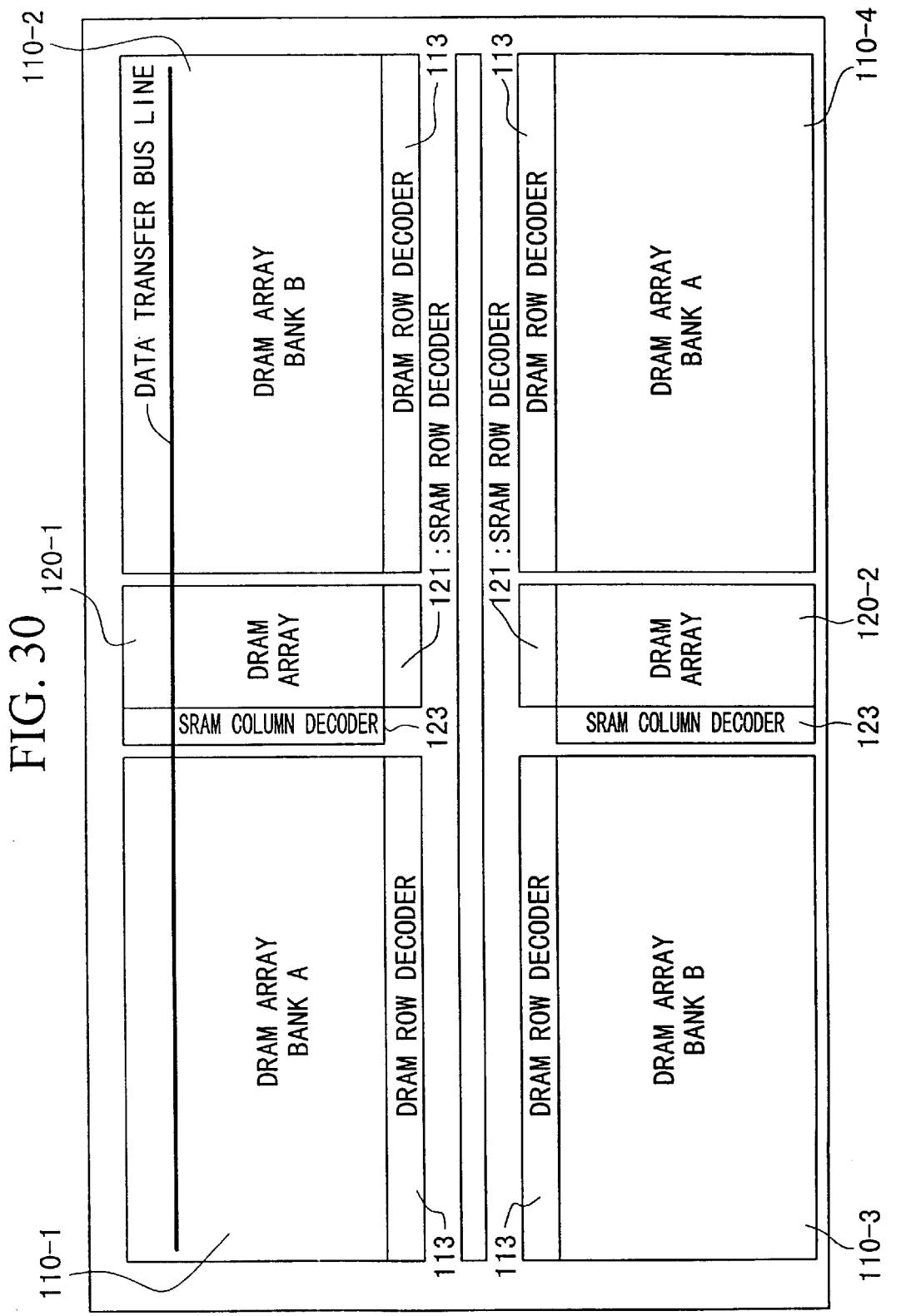
FIG. 30 schematically shows a whole layout of chips of a semiconductor memory device according to an embodiment of the present invention.

FIG. 30 shows an overall chip layout of an embodiment of the semiconductor memory device to which the present invention is applied. The semiconductor memory device shown in FIG. 30 includes a 64-Mbit DRAM array of x8-bit, 2-bank construction as the main memory portion, a 16-Kbit SRAM array as a sub memory portion, and a synchronous interface. However, it is possible to construct the semiconductor memory device in other ways.

A cross-shaped area including a vertical center portion and a lateral center portion is provided as shown in FIG. 30. DRAM arrays 110-1, 110-2, 110-3 and 110-4 each having a memory capacity of 16 Mbits are arranged in four areas divided by the cross-shaped area, respectively. The overall memory capacity of the DRAM arrays 110-1, 110-2, 110-3 and 110-4 is 64 Mbits. DRAM row decoders 113 are provided adjacent to the lower portions of the DRAM arrays 110-1 and 110-2, respectively. Similarly, DRAM row decoders 113 are arranged adjacent to upper portions of the DRAM arrays 110-3 and 110-4, respectively.

An SRAM row decoder 121 and an SRAM column decoder 123 are arranged between the DRAM arrays 110-1 and 110-2 serve as an SRAM array 120-1. Similarly, an SRAM array 120-2, an SRAM row decoder 121, and a column decoder 123 are arranged between the DRAM arrays 110-3 and 110-4. The data transfer bus line traverses the DRAM array 110-1, the SRAM array 120-1, and the DRAM array 110-2 such that the data transfer between selected DRAM cell groups and a selected SRAM cell group is possible. Similarly, the data transfer bus line traverses the DRAM array 110-3, the SRAM array 120-2, and the DRAM array 110-4 such that selected DRAM cell groups and a selected SRAM cell group is possible. An operation control circuit and a data control circuit, etc., are arranged in other portions of FIG. 30. Although other arrangements may be possible, an input/output signal terminal is arranged in the lateral center portion in the shown embodiment.

Figure 31:
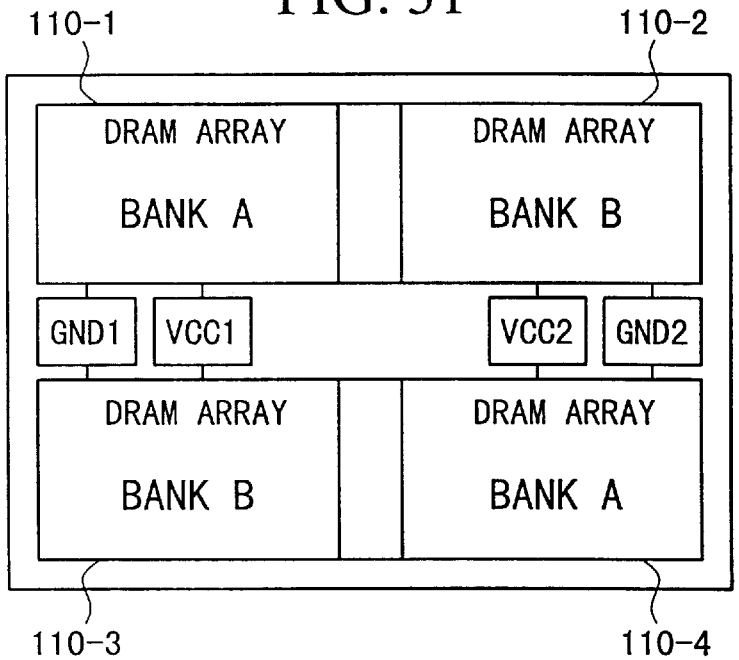
FIG. 31 schematically shows blocks which use a common power source of a semiconductor memory device according to an embodiment of the present invention.

In FIG. 30, the main memory portion has the 2-bank construction having a layout in which portions which are selected simultaneously are not concentrated in a portion so that, when the bank A is selected, the DRAM arrays 110-1 and 110-4 are selected simultaneously and, when the bank B is selected, the DRAM arrays 110-2 and 110-3 are selected simultaneously. FIG. 31 shows an internal power source wiring VCC and an internal ground wiring GND. Thus, a load on an internal power source wiring VCC and an internal ground wiring GND, etc., is not one sided because areas to be selected simultaneously are dispersed.

In the following, the arrangement of the banks, the power source wiring, and the ground wiring are explained in more detail. In the embodiment shown in FIG. 30, the DRAM arrays 110-1 and 110-4 constitute the bank A, and the DRAM arrays 110-2 and 110-3 constitute the bank B. That is, each of the banks A and B is comprised of a plurality of memory arrays.

As shown in FIG. 31, the memory arrays constituting the respective banks have the power source wiring and the ground wiring. In other words, one source for supplying the power source potential and the ground potential (a pad or an internal power source circuit) is connected to banks which are not to be simultaneously activated. In this example, in the bank A, the DRAM array 110-1 is connected the power source wiring VCC1 and the ground wiring GND1, and the DRAM array 110-4 is connected to the power source wiring VCC2 and the ground wiring GND2. In the bank B, the DRAM array 110-2 is connected to the power source wiring VCC2 and the ground wiring GND2, and the DRAM array 110-3 is connected to the power source wiring VCC1 and the ground wiring GND1. Thus, in one bank, the power source wiring and the ground wiring for one of the memory arrays are separated from those for the other memory arrays.

Both the power source wiring and the ground wiring need not be always separated, and at least one of the power source and the ground may be separated.

Further, the power source and the ground for the DRAM arrays may not be separated, and may be electrically connected. In this case, power source pads or setting pads corresponding to the respective DRAM arrays are provided, and the electric potential for the power source wiring or the setting wiring for the respective DRAM arrays may be stabilized.

In the embodiment shown in FIG. 30, the memory arrays in the same banks are diagonally located. The neighboring memory arrays belong to different banks, so that the memory arrays in the same bank are not adjacent. As shown in FIG. 31, the power source wiring and the ground wiring are used in common by the memory cell arrays which belong to different banks. Specifically, the DRAM array 110-1 in the bank A and the DRAM array 110-3 in the bank B use in common the power source wiring VCC1 and the ground wiring GND1, and the DRAM array 110-2 in the bank B and the DRAM array 110-4 in the bank A use in common the power source wiring VCC2 and the ground wiring GND2.

While the memory arrays, which are diagonally positioned, belong to the same bank in the embodiment shown in FIGS. 30 and 31, bank A may be comprised of the DRAM arrays 110-1 and 110-3, and bank B may be comprised of the DRAM arrays 110-2 and 110-4. The number of the divisions may be increased, and the areas, which are to be simultaneously selected, may be dispersed or decreased. When the bank A is comprised of the DRAM arrays 110-1 and 110-3 and the bank B is comprised of the DRAM arrays 110-2 and 110-4, the power source wiring VCC1 and the ground wiring GND1 are assigned to the DRAM arrays 110-1 and 110-3, the power source wiring VCC2 and the ground wiring GND2 are assigned to the DRAM arrays 110-3 and 110-4, and the power source wiring and the ground wiring must be modified so that the different power source wiring and the different ground wiring are assigned to the respective DRAM arrays in the same bank. According to the assignment of the power source wiring and the ground wiring to the DRAM arrays in the banks, the current flowing through the power source wiring and the ground wiring is dispersed, and it is possible to reduce noise in the connections due to this current.

The function for reducing the noise will be explained.

To transfer data between the DRAM portion (main memory) and the SRAM portion (sub memory), one of the banks A and B in the DRAM portion is selected. That is, the two banks are not simultaneously activated. In FIGS. 30 and 31, assuming that the bank A is selected, the DRAM array 110-1 in the bank A uses the power source wiring VCC1 and the ground wiring GND1, and the DRAM array 110-4 uses the power source wiring VCC2 and the ground wiring GND2. That is, the DRAM arrays uses the different power source wiring and the ground wiring, and the power source wiring and the ground wiring of one of the arrays are separated from those of the other array.

When bank A is activated and the DRAM arrays 110-1 and 110-4 in the bank A become the targets of the read/write operation, the power source potential and the ground potential are supplied to these DRAM arrays through different power source wiring and ground wiring. While the power source wiring VCC1 and the ground wiring GND1 are connected to the DRAM array 110-3 as well as the DRAM array 110-1 and the power source wiring VCC2 and the ground wiring GND2 are connected to the DRAM array 110-2 as well as the DRAM array 110-4, the operating current does not flow in the DRAM arrays 110-2 and 110-3 because the bank B is not activated.

As the result, the current does not concentrate on a part of the power source wiring and the ground wiring, and the operating current for the DRAM arrays is not concentrated. Further, because the two banks are not simultaneously activated, the power source wiring and the ground wiring do not simultaneously supply the power source potential and the ground potential to the DRAM arrays in banks A and B. Thus, the noise on the power source wiring and the ground wiring for the arrays is reduced and suppressed.

Similarly, when the bank B is activated, the current in the DRAM array in the bank B is dispersed, and the noise due to this current is effectively suppressed.

In the embodiment shown in FIGS. 30 and 31, one DRAM array is in proximity to another DRAM array which belongs to the different bank, and the DRAM arrays which belong to the same bank are not in proximity. That is, the positions of the DRAM arrays in the same bank are dispersed. One of the banks is selectively activated, and the activated DRAM arrays are not in proximity. Thus, the arrays to be activated on the chip do not concentrate. The circuits which consume electric power are dispersed, and thus heated portions are dispersed. This improves the reliability of the circuit in addition to the reduction in noise.

As shown in the embodiment, the present invention separates the power source wiring from the ground wiring, and disperses the DRAM arrays in the respective banks, thereby reducing the noise on the power source and the ground, and improving the reliability.

(7) Detailed Description of the Respective Blocks

The respective circuit blocks of the overall block diagram shown in FIG. 1 will be described in detail. It should be noted that the following description is simply for a embodiment and this invention is not limited thereto.

1. {Operation Control Circuit}

Figure 32:
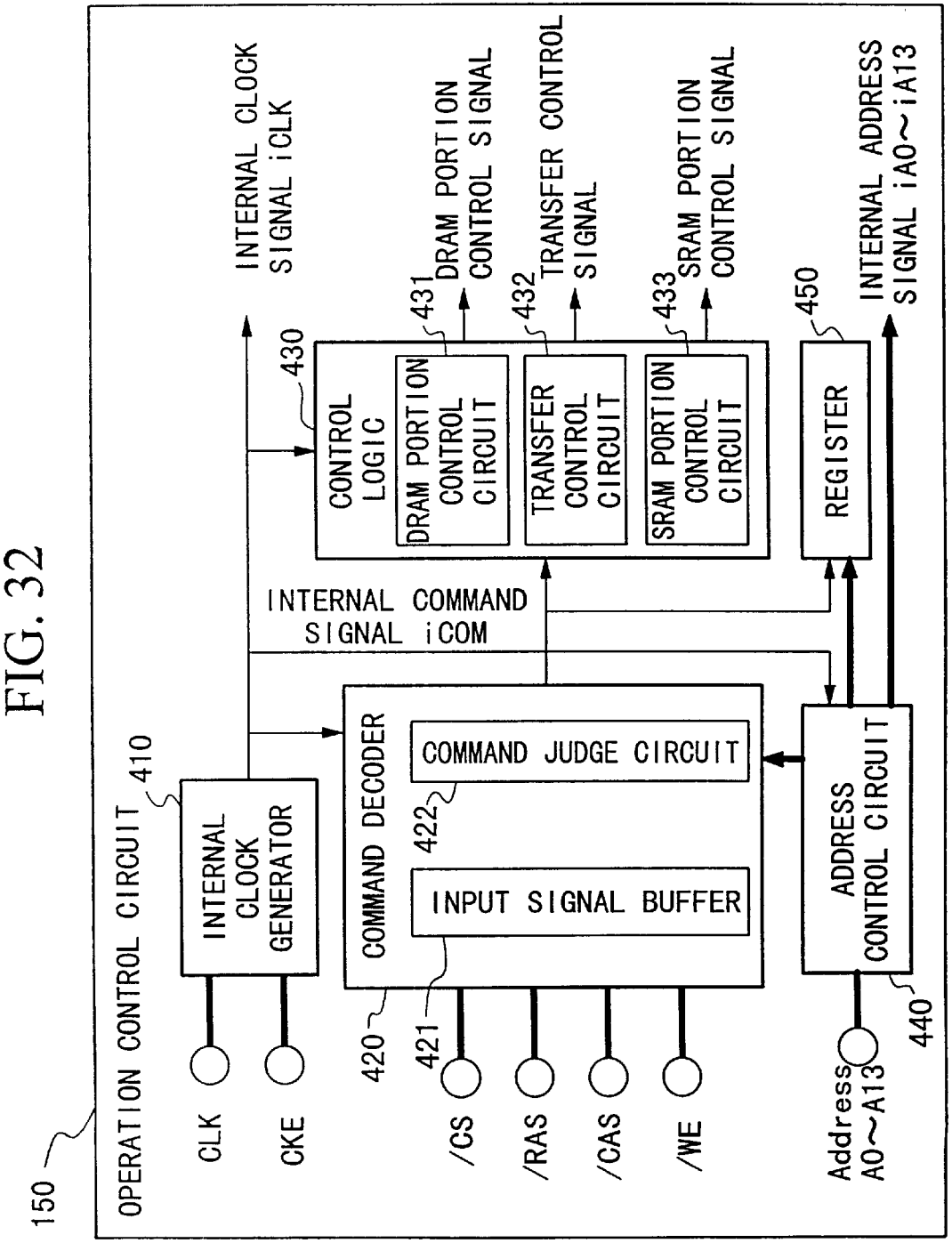
FIG. 32 is a block diagram of an operation control circuit of the semiconductor memory device shown in FIG. 1.

FIG. 32 is a circuit diagram of the operation control circuit 150. The operation control circuit 150 is constructed with an internal clock generator circuit 410, a command decoder 420, a control logic 430, an address control circuit 440 and a mode register 450. The internal clock generator circuit 410 generates an internal clock signal iCLK from the external input signals CLK and CKE. The internal clock signal iCLK is supplied to the command decoder 420, the control logic 430, the address control circuit 440, and the data control circuit to control the timing of the respective portions.

The command decoder 420 includes a buffer 421 for receiving the respective input signals and a command judge circuit 422. The /CS signal, the /RAS signal, the /CAS signal and the /WE signal are transmitted to the command judge circuit 421 in synchronism with the internal clock signal iCLK to generate an internal command signal iCOM. The command generator circuit 421 responds to the respective input signals in the manners indicated in the correspondence table of the commands and the respective input terminal states as shown in FIG. 5. The control logic 430 responds to the internal command signal iCOM, the internal clock signal iCLK, and the register signal iREG to generate the control signal necessary to perform operations assigned by these signals.

The control logic 430 includes a DRAM control circuit 431, a transfer control circuit 432, and an SRAM control circuit 433 which generate respective control signals. The register 450 functions to store data defined by a combination of data of a specific address input when it receives a specific register write signal from the command judge circuit, and stores the data until a register write signal is input again. The data held in the register is referenced when the control logic 430 is operated.

2. {DRAM Portion}

[DRAM Portion and Data Transfer Circuit]

Figure 33:
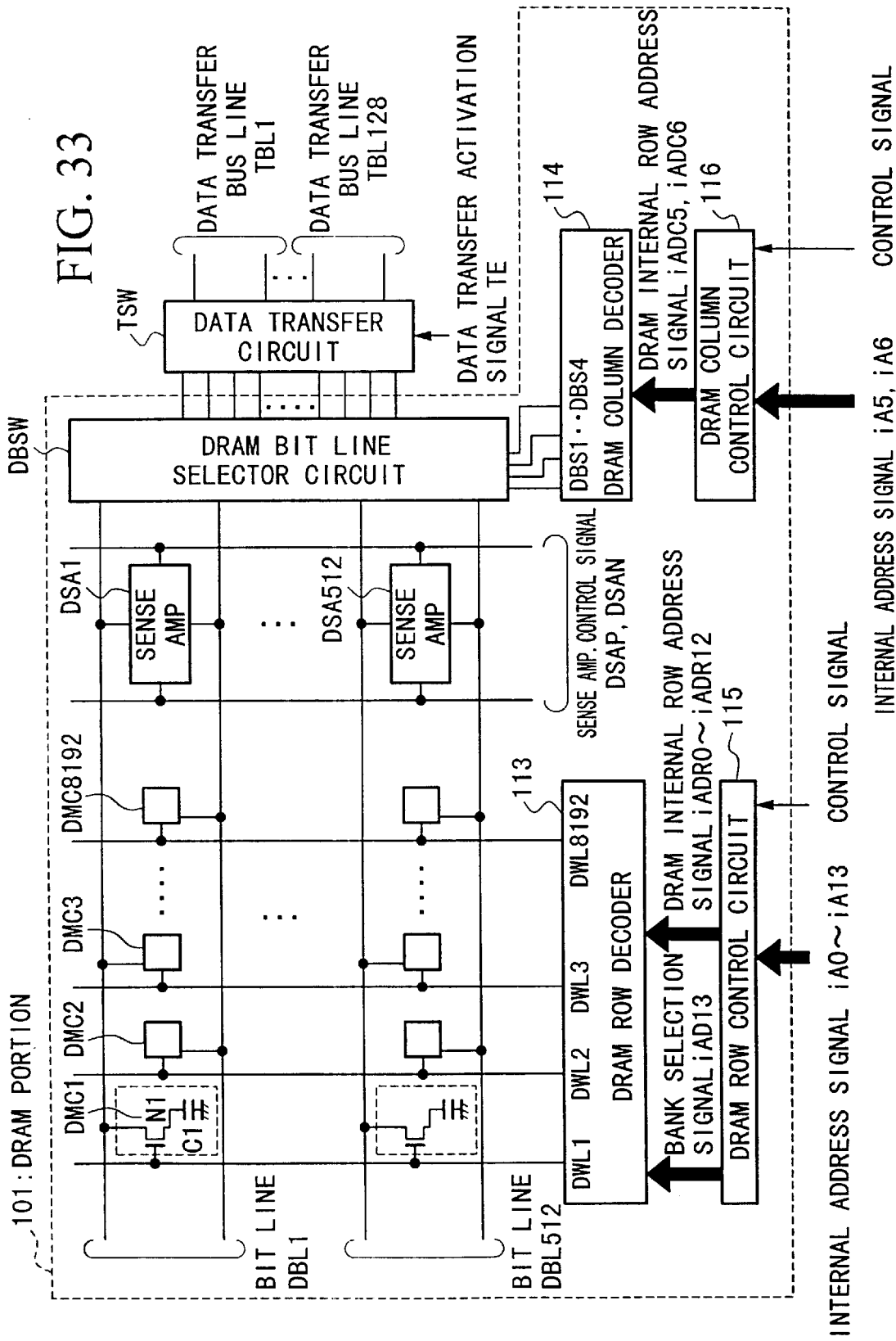
FIG. 33 shows in detail a construction of the DRAM portion and the data transfer circuit shown in FIG. 1.

FIG. 33 shows a concrete construction of the DRAM portion and the data transfer circuit shown in FIG. 1. In FIG. 33, the DRAM portion 101 includes a plurality of dynamic memory cells DMC arranged in a matrix. Each memory cell DMC includes a memory transistor N1 and a memory capacitor C1. A constant potential Vgg (1/2 Vcc, etc.) is applied to one terminal of the memory capacitor C1. Further, the DRAM portion 101 includes DRAM word lines DWL to which the DRAM cells DMC are connected in rows, and DRAM bit lines DBL to which the DRAM cells DMC are connected in columns. Each bit line is paired with a complementary bit line. The DRAM cells DMC are positioned at cross points of the word lines DWL and the bit lines DBL, respectively.

The DRAM portion 101 includes DRAM sense amplifiers DSA correspondingly to the bit lines DBL. The sense amplifier DSA functions to detect and amplify a potential difference between the paired bit lines, and is controlled by sense control signals DSAP and DSAN. Since the DRAM array has a x8-bit, 2-bank construction and has a memory capacity of 64 Mbits, the DRAM array includes word lines DWL1 to DWL8192, bit lines DBL1 to DBL512 and sense amplifiers DSA1 to DSA512. This is a construction corresponding to x1 bit of 1 bank.

The DRAM portion 101 includes the DRAM row decoder 113 for selecting one of the word lines DWL1 to DWL8192, and the DRAM row control circuit 115 for generating DRAM internal row address signals iADR0 to iADR12 and bank selection signal iAD13. Further, the DRAM portion 101 includes a DRAM bit line selection circuit DBSW which selects one of four bit line pairs by the DRAM bit line selection signals DBS1 to DBS4 generated by the DRAM column decoder 114, and connects it to the data transfer bus line TBL through the data transfer circuit 103. Further, the DRAM portion 101 includes a DRAM column control circuit 116 for generating DRAM column address signals iADC5 and iADC6 which are used by the DRAM column decoder.

Figure 34:
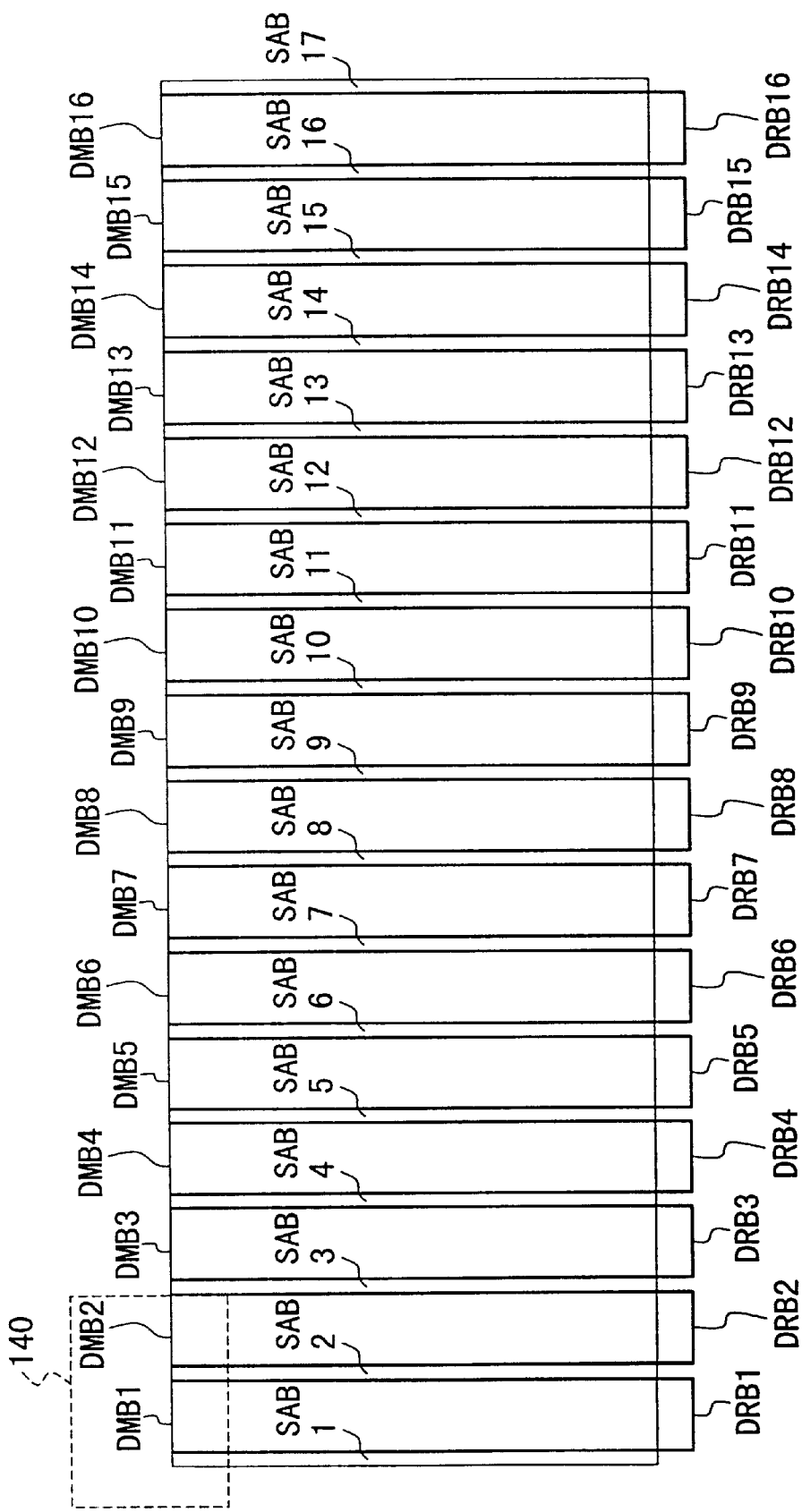
FIG. 34 shows in detail an example of the array construction of a DRAM array 110-1 of the whole layout which is an embodiment of the present invention shown in FIG. 30.

FIG. 34 shows an example of a concrete array construction of the DRAM array 110-1 of the overall layout shown in FIG. 30. In FIG. 34, the DRAM array is divided into 16 memory cell blocks DMB1 to DMB16. DRAM row decoders DRB1 to DRB16 corresponding to the respective memory cell blocks DMB1 to DMB16, and blocks SAB1 to SAB17 corresponding to (sense amplifier+DRAM bit line selector circuit+data transfer circuit) are provided. In this figure, each memory cell blocks DMB1 to DMB16 has a memory capacity of 1 Mbits in 512 rows×2048 columns. It should be noted that the number of memory cell blocks is not limited to 16.

As shown in FIG. 34, when the DRAM memory cell array is divided into a plurality of portions, the length of each bit line is shortened. Therefore, the capacitance of the bit line is reduced, and it is possible to increase the potential difference between the paired bit lines when data is read out. Further, since, during the operation, only the sense amplifier corresponding to the memory block including the word line selected by the row decoder is operated, it is possible to reduce power consumption due to charging/discharging of the bit line.

Figure 35:
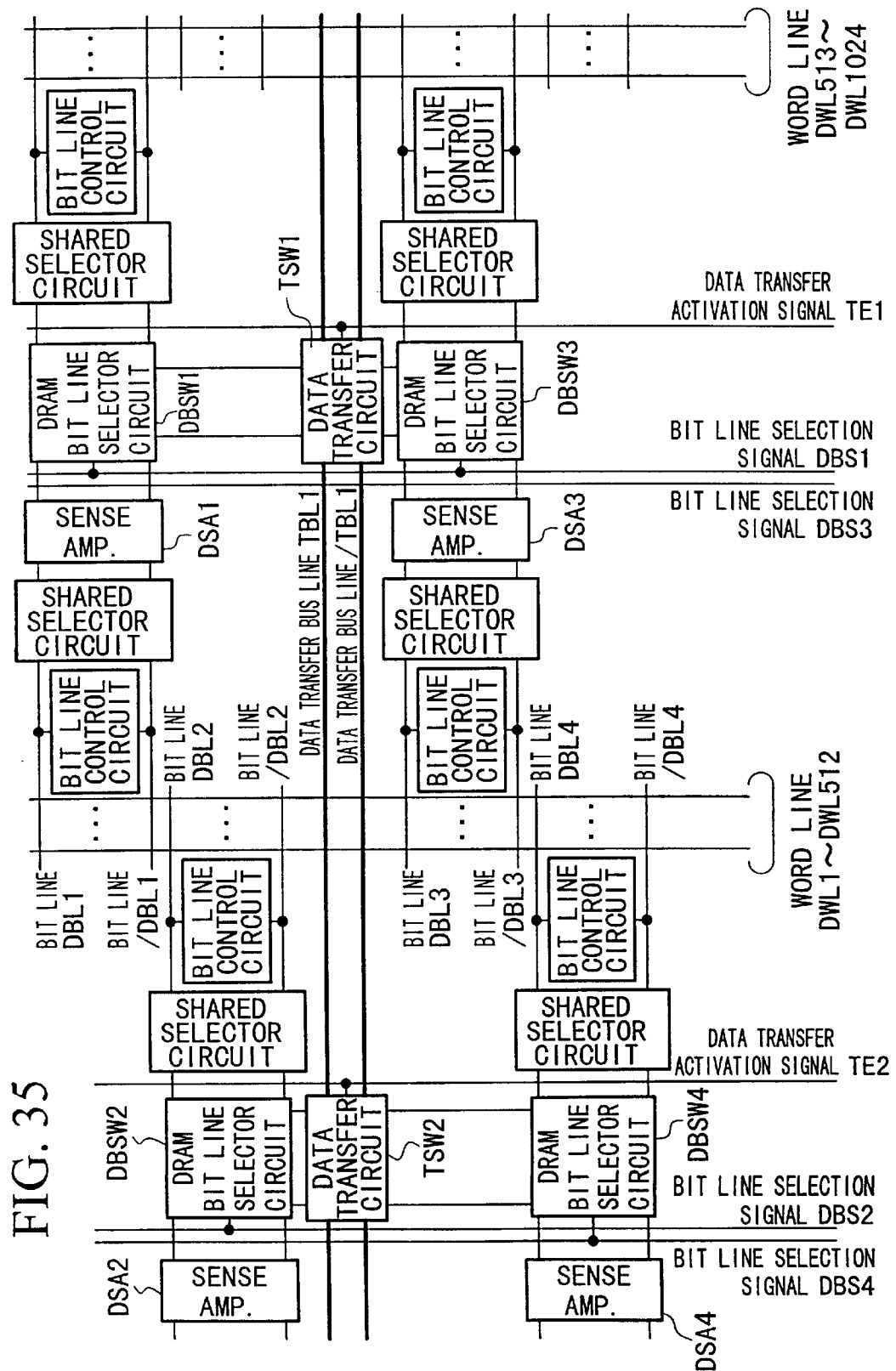
FIG. 35 shows in detail an example of the connection relationship between the transfer bus line and the bit lines for a portion (corresponding to 4 pairs of bit lines) of the layout shown in FIG. 34.

FIG. 35 shows, in detail, an example of a connecting relation between the transfer bus line and bit lines in a portion 140 (including 4 pairs of bit lines) of the layout shown in FIG. 34. In FIG. 35, sense amplifiers DSA are arranged in zigzag manner such that a sense amplifier DSA1 corresponding to one column is located in one end of a memory cell block and a sense amplifier DSA2 corresponding to a next column is located in the other end of the memory cell block, etc. Such a zigzag arrangement of the sense amplifiers is employed for the reason that, although the size of the memory cell can be miniaturized in the recent process technology, the miniaturization of sense amplifier in proportion to the miniaturization of memory cell has not been achieved, and become necessary when there is no margin for arranging the sense amplifiers correspondingly to the bit line pitch. Therefore, when the bit line pitch is large enough, the sense amplifiers can be arranged in only one end of the memory cell block. One sense amplifier DSA is commonly used by two memory cell blocks through a shared selector circuit. Each bit line pair is provided with a bit line control circuit for equilibrating a potential difference between the bit lines thereof and precharging. The bit line control circuit may be used by two memory cell blocks similarly to the sense amplifier.

Figure 36:
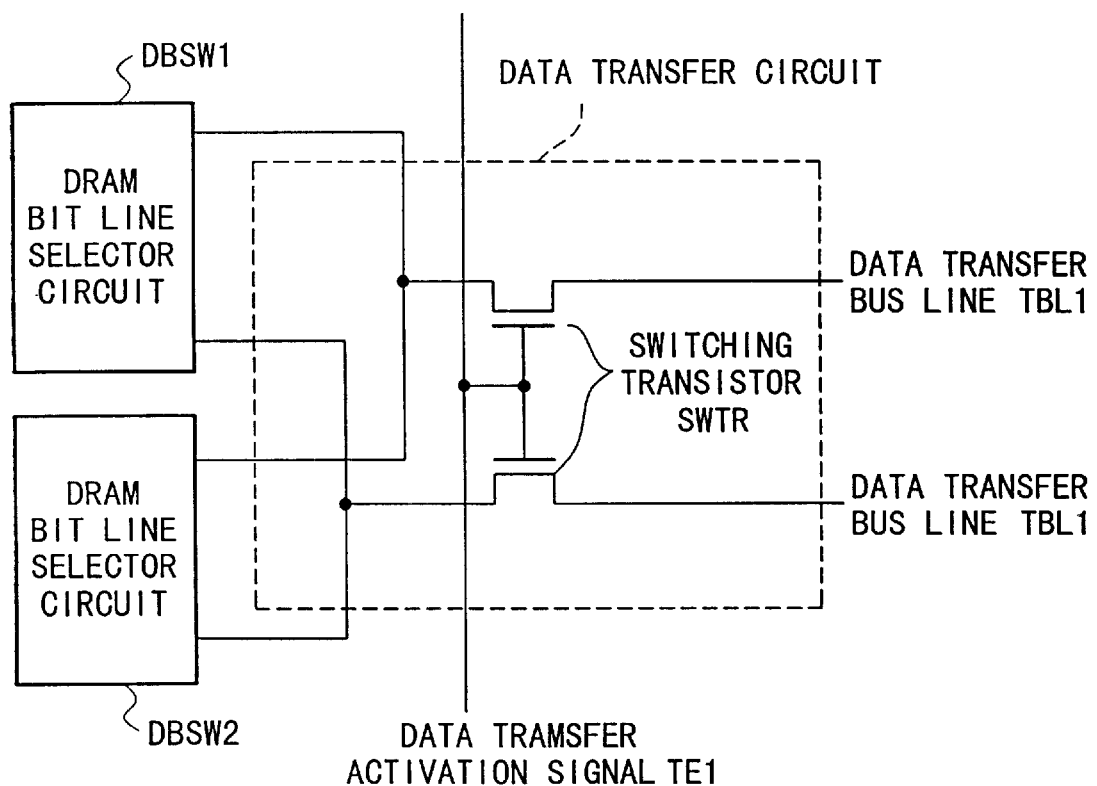
FIG. 36 is a circuit diagram showing the data transfer circuit in detail.

The bit lines and the data transfer bus lines are connected through DRAM bit line selector circuits DBSW1 to DBSW4 selected by DRAM bit line selection signals DBS1 to DBS4 and data transfer circuits TSW1 and TSW2 which use switching transistors SWTR each shown in FIG. 36, in detail. Data transfer activation signals TE1 and TE2 for activating the data transfer circuits are obtained by logical operation of the transfer control signal generated by the operation control circuit shown in FIG. 32 and the address signals for selecting the memory cell block. In FIG. 35, since the bit line is connected to the data transfer bus line through the data transfer circuit, the data transfer circuit of a memory cell block, which is not activated, is in a non-conduction state and there is no load on a DRAM bit line selection circuit connected thereto. There, it is possible to minimize the load on the data transfer bus line in operation. In the construction shown in FIG. 35, however, there is the problem that the chip area is increased since the data transfer circuits are required and the wiring for transmitting the data transfer activation signal for activating the data transfer circuits must be provided.

Figure 37:
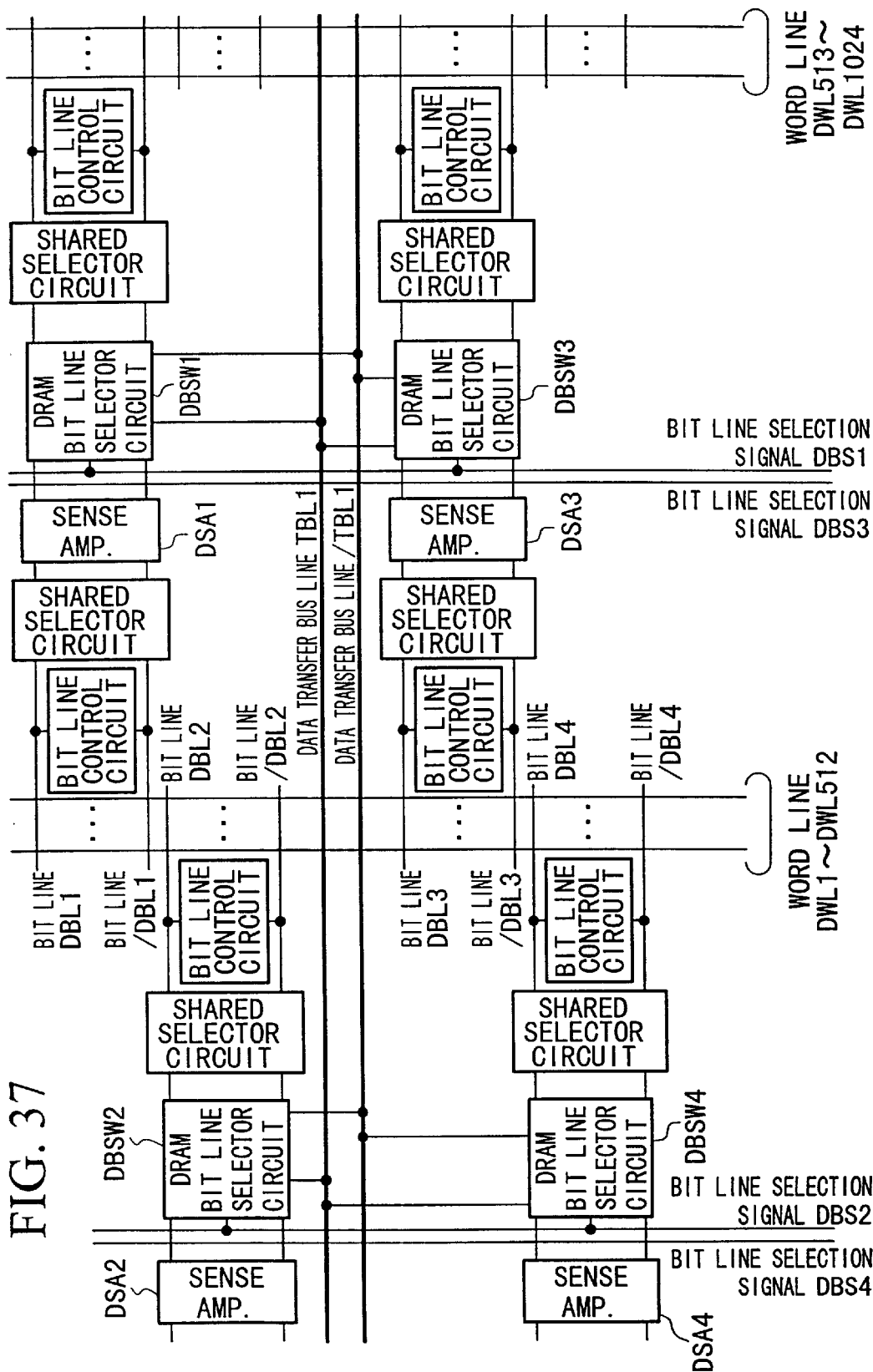
FIG. 37 shows an example of a construction for solving the problem of the example shown in FIG. 35.

FIG. 37 shows an example of construction which solves such problem. In FIG. 37, the bit line and the data transfer bus line are connected to each other through only the DRAM bit line selector circuits DBSW1 to DBSW4 selected by the DRAM bit line selection signals DBS1 to DBS4. This construction can be realized by providing the function of the data transfer circuit by adding a logic of the data transfer activation signal to the DRAM column decoder generating the DRAM bit line selection signal DBS1 to DBS4. Although the load on the data transfer bus line is increased during operation, it is possible to make the chip area very small.

The activation of the DRAM portion and the column selection and data transfer operation will be described with reference to FIGS. 33 and 35. The activation of the DRAM portion will be described first. In FIG. 33, when the DRAM row selection control signal, which is one of the DRAM portion control signals generated by the operation control circuit shown in FIG. 32, and the internal address signal iA0 to iA13 are input into the DRAM row control circuit 115, the bank selection signal iAD13 and the internal DRAM row address signal iADR0 to iADR12 are generated and the word line DWL of the bank assigned by the DRAM row decoder 113 is selected. With the selected word line DWL, data held in the cell DMC is output to the bit line DBL. The potential difference between the paired bit lines is detected and amplified by the sense amplifier DSA in response to the sense amplifier drive signals DSAN and DSAP. The number of sense amplifiers activated simultaneously in the DRAM portion 101 is 512, and, since the DRAM portion has the x8-bit construction, the total number of the simultaneously activated sense amplifiers becomes 512×8=4096.

The column selection of the DRAM portion and the data transfer will be described. The DRAM column selection circuit 116 shown in FIG. 33 is input with a control signal which is one of the DRAM portion control signals generated by the operation control circuit shown in FIG. 32 in response to the internal address signals iA5 and iA6 and generates the DRAM column address signals iADC5 and iADC6. The DRAM column address signals iADC5 and iADC6 are input into the DRAM column decoder 114, and, after the DRAM bit line selection signals DBS1 to DBS4 are generated and the bit line is selected, data of the bit line is transmitted to the data transfer bus line TBL by the data transfer activation signal TE obtained by a logic between the transfer control signal generated by the operation control circuit shown in FIG. 32 and the address signal for selecting the memory cell block. As shown in FIG. 37, with the logic of the data transfer activation signal in the DRAM column decoder, it is possible to provide the data transfer circuit function, and the DRAM bit line selection signals DBS1 to DBS4 can be made signals with which the column selection and the transfer operation are performed simultaneously.

Assuming, in FIG. 37, that the DRAM bit line selection signal DBS1 is selected, a signal synchronized with the transfer control signal is input into the DRAM bit line selection circuit DBSW1, and the data on the bit lines DBL1 and /DBL1, which is amplified by the sense amplifier DSA1, is transmitted to the data transfer bus lines TBL1 and /TBL1. The DRAM portion 101 shown in FIG. 37 includes 128 each of the portions shown in FIG. 33, and, since it has the x8-bit construction, a total number of data transferred simultaneously from the bit line to the transfer bus line is 128×8= 1024. This number of data transferred simultaneously is the same in other bit constructions.

[DRAM Row Control Circuit and DRAM Row Decoder]

Figure 38:
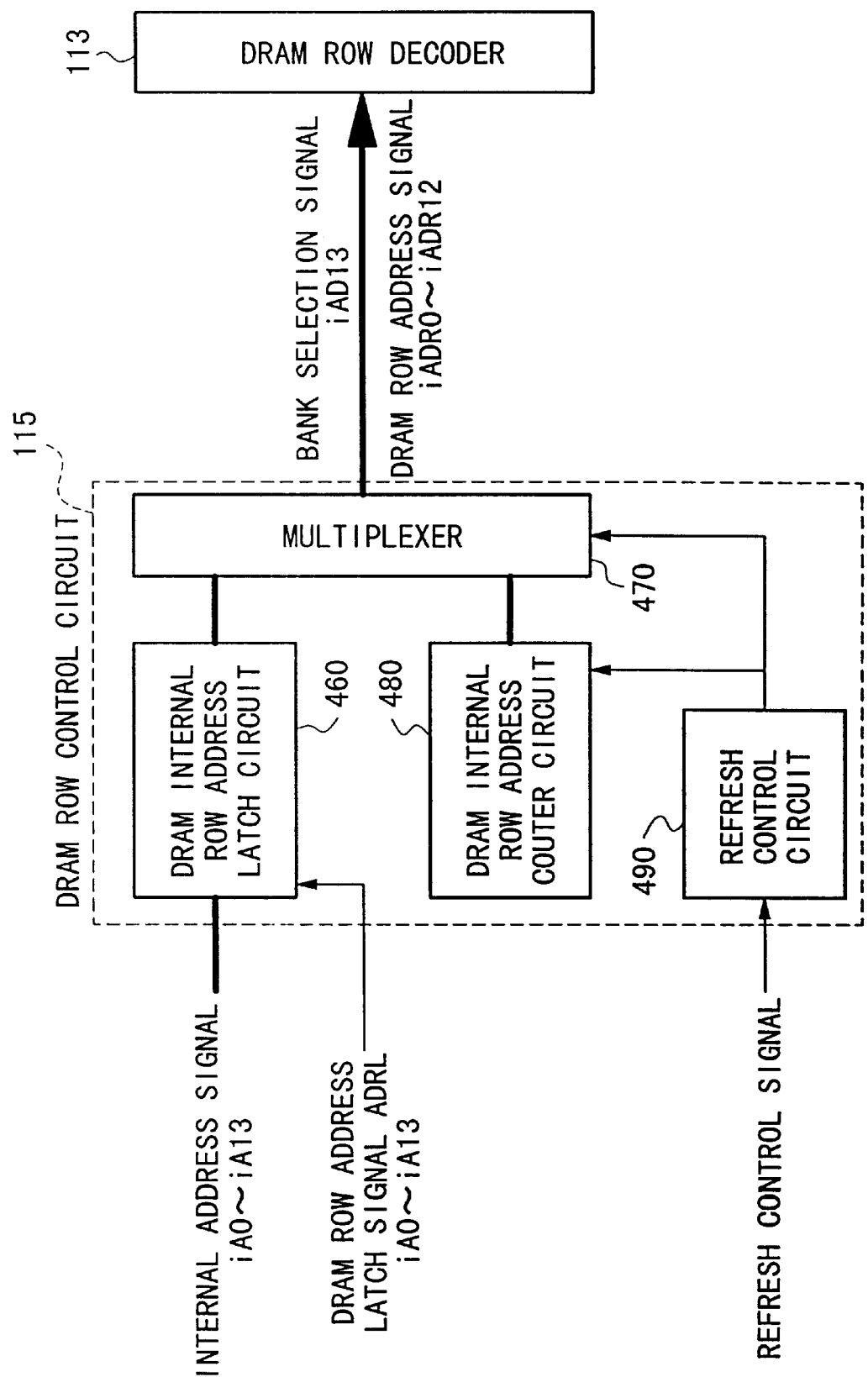
FIG. 38 is a block diagram showing an example of a DRAM line control circuit.

FIG. 38 is a block diagram of the DRAM row control circuit 115. The DRAM row control circuit 115 includes a DRAM internal row address latch circuit 460, a multiplexer 470, an internal address counter circuit 480, and a refresh control circuit 490. In the usual activation of the DRAM portion, the address latch circuit 460 receives the DRAM row address latch signal ADRL, and the internal address signal iA0 to iAi3 to the DRAM row decoder 113. The DRAM row control circuit 115 outputs the DRAM internal row address signal iADR0 to iADR12 and the bank selection signal iAD13 through the multiplexer 470 from the address latch circuit 460.

In the refresh operation, the DRAM row control circuit 115 receives the refresh control signal, and the refresh control circuit 490 operates the internal address counter circuit 480 to control the multiplexer 470 such that the selection signal from the internal address counter circuit is output. As a result, the DPAM internal row address signal iADR0 to iADR12 and the bank selection signal iAD13 are output to the DRAM row decoder 113 without input of the address signal. The internal address counter circuit 480 automatically adds or subtracts the address according to a predetermined method every time the refresh operation is performed, making an automatic selection of all of the DRAM rows possible.

[DRAM Column Control Circuit and DRAM Column Decoder]

Figure 39:
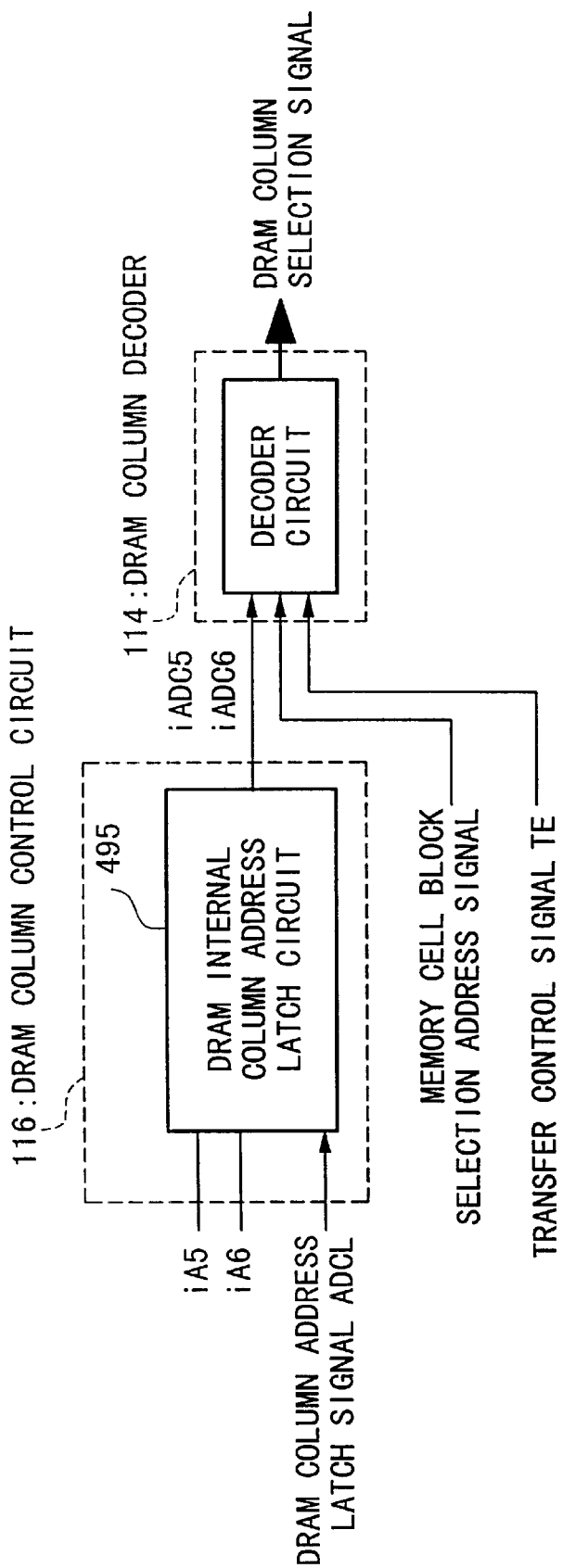
FIG. 39 shows an example of a concrete construction of a DRAM row control circuit and a DRAM row decoder shown in FIG. 33.

FIG. 39 shows a concrete example of the DRAM column control circuit and the DRAM column decoder shown in FIG. 33. In FIG. 39, the DRAM column control circuit 116 comprises a DRAM internal column address latch circuit 495, and the DRAM internal column address signals iADC5 to iADC6 are generated by the internal address signals iA5 and iA6 and the DRAM column address latch signal ADCL in a clock cycle of a command input of data transfer from the DRAM cell to the SRAM cell (prefetch transfer operation) and data transfer from the SRAM cell to the DRAM cell (restore transfer operation).

The DRAM column address latch signal ADCL is one of the transfer control signals generated in the operation control circuit shown in FIG. 32. Further, the DRAM column decoder 114 decodes the DRAM internal column address signals iADC5 and iADC6 generated by the DRAM column control circuit 116, and outputs the DRAM column selection signal generated only when the memory block selection address signal and the transfer control signal TE are activated. Therefore, the activation signals TE1 and TE2 of the data transfer circuit shown in FIG. 35 are the output signal of the DRAM column decoder 114, and the function of the data transfer circuit is performed by the DRAM bit line selection circuit to be described later.

[DRAM Bit Line Selection Circuit]

Figure 40:
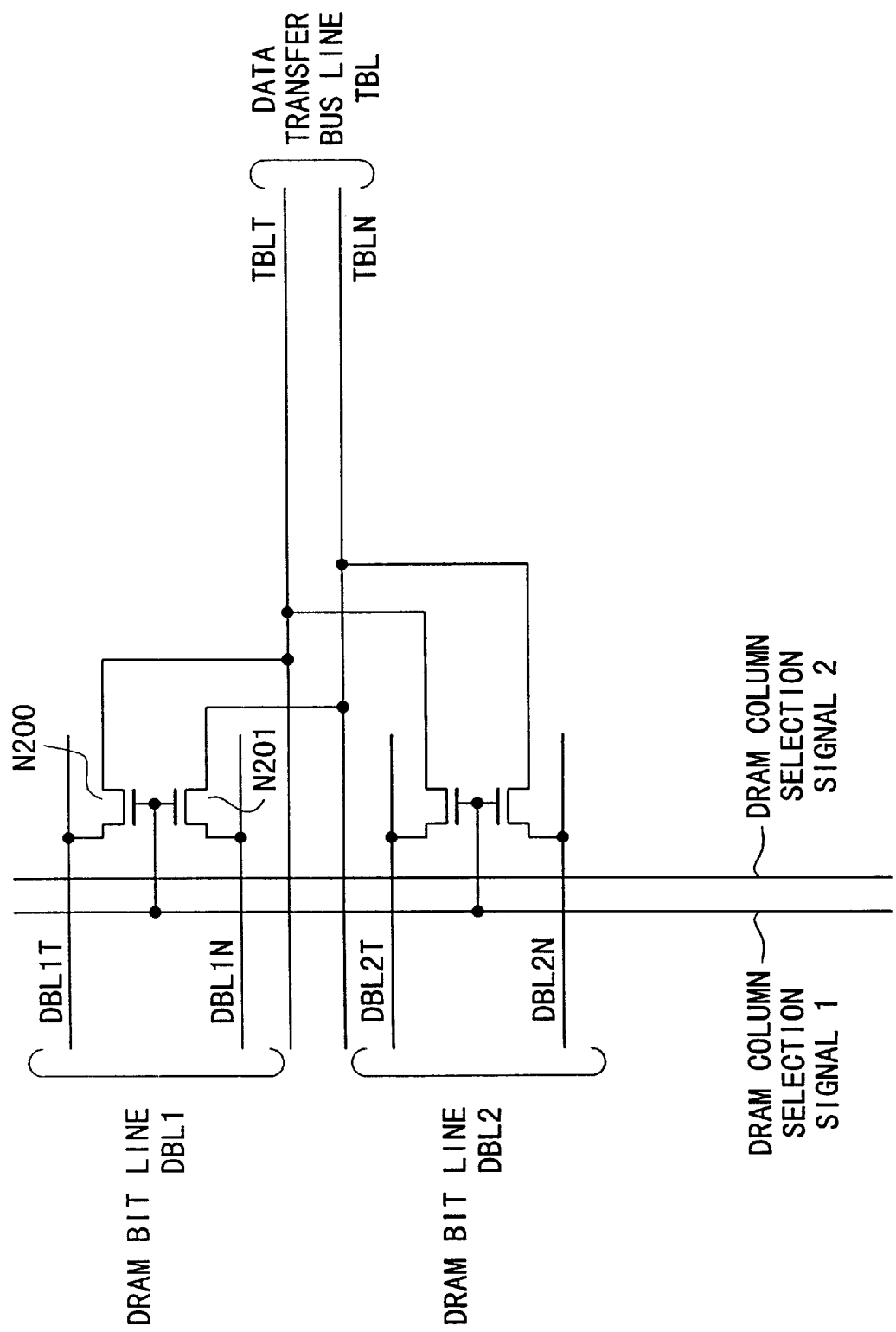
FIG. 40 shows an example of a concrete circuit construction of a DRAM bit line selection circuit.

FIGS. 40 to 43 show concrete examples of the circuit construction of the DRAM bit line selection circuit shown in FIG. 37. FIG. 40 shows the simplest construction including N channel MOS switching transistors (referred to as NMOS transistors, hereinafter) N200 and N201, in which the DRAM bit line DBL and the data transfer bus line TBL are connected by the DRAM column selection signal.

Figure 41:
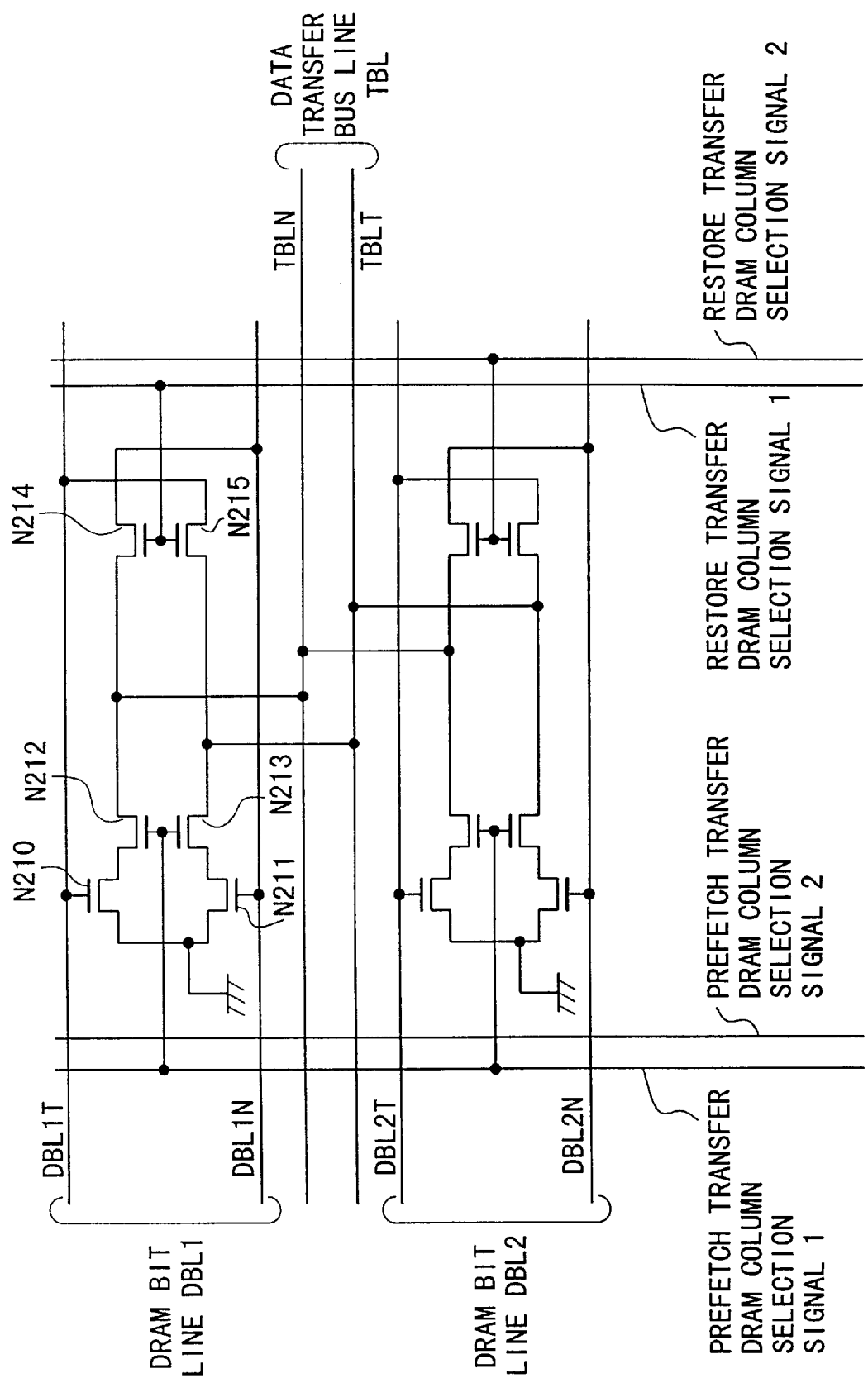
FIG. 41 shows an example of a concrete circuit construction of a DRAM bit line selection circuit.

FIG. 41 shows another construction of the DRAM bit line selection circuit which comprises a switching transistor circuit including: NMOS transistors N210 and N211 having gates connected to respective paired DRAM bit lines and differentially amplifying data on the DRAM bit lines when the data on the DRAM bit lines DBL is transmitted to the data transfer bus line TBL; and NMOS transistors N212 and N213 for transmitting the amplified signal to the data transfer bus line TBL by the prefetch transfer DRAM column selection signal. One terminals of the NMOS transistors N210 and N211 are connected to. a fixed potential such as ground potential. Further, when the data on the data transfer bus line TBL is transmitted to the DRAM bit line DBL, the DRAM bit line selection circuit comprises a switching transistor circuit composed of NMOS transistors N214 and N215 as in the circuit shown in FIG. 40, and the DRAM bit line DBL and the data transfer bus line TBL are connected by the restore transfer DRAM column selection signal.

Figure 42:
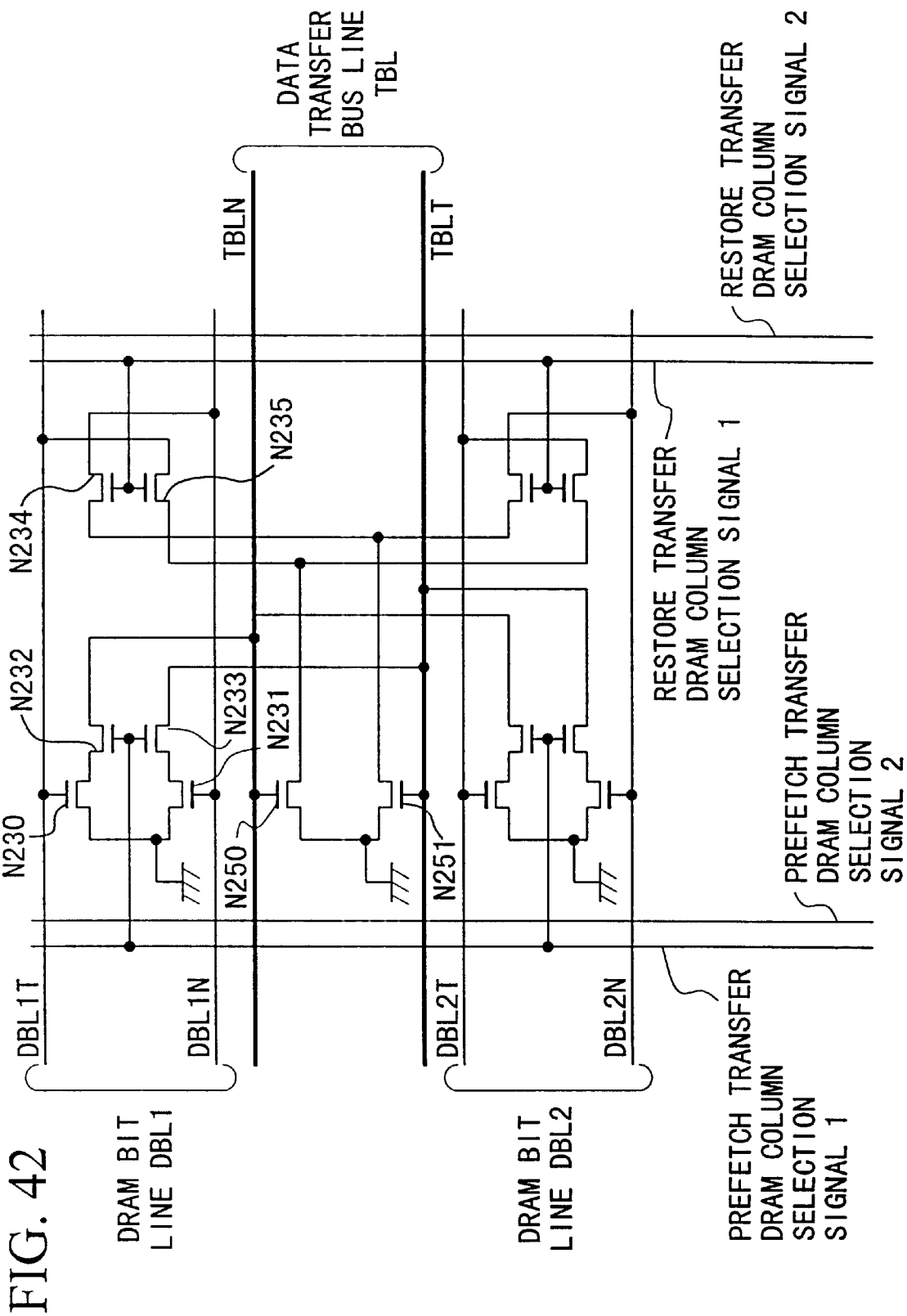
FIG. 42 shows an example of a concrete circuit construction of a DRAM bit line selection circuit.

FIG. 42 shows another construction of the DRAM bit line selection circuit, which comprises a switching transistor circuit including: NMOS transistors N230 and N231 having gates connected to respective paired DRAM bit lines and differentially amplifying data on the DRAM bit lines when the data on the DRAM bit lines DBL is transmitted to the data transfer bus lines TBL; and NMOS transistors N232 and N233 for transmitting the amplified signal to the data transfer bus lines TBL by the prefetch transfer DRAM column selection signal, as in the construction shown in FIG. 41. One terminal of the NMOS transistors N230 and N231 are connected to a fixed potential such as ground potential.

Further, when the data on the data transfer bus lines TBL is transmitted to the DRAM bit lines DBL, the DRAM bit line selection circuit comprises a switching transistor circuit composed of: NMOS transistors N250 and N251 having gates connected to respective paired DRAM bit lines and differentially amplifying data on the data transfer bus lines TBL; and NMOS transistors B234 and N235 for transmitting the amplified signal to the DRAM bit lines DBL by a restore transfer DRAM column selection signal. One end of each of the NMOS transistors N250 and N251 is connected to a fixed potential such as ground potential.

Figure 43:
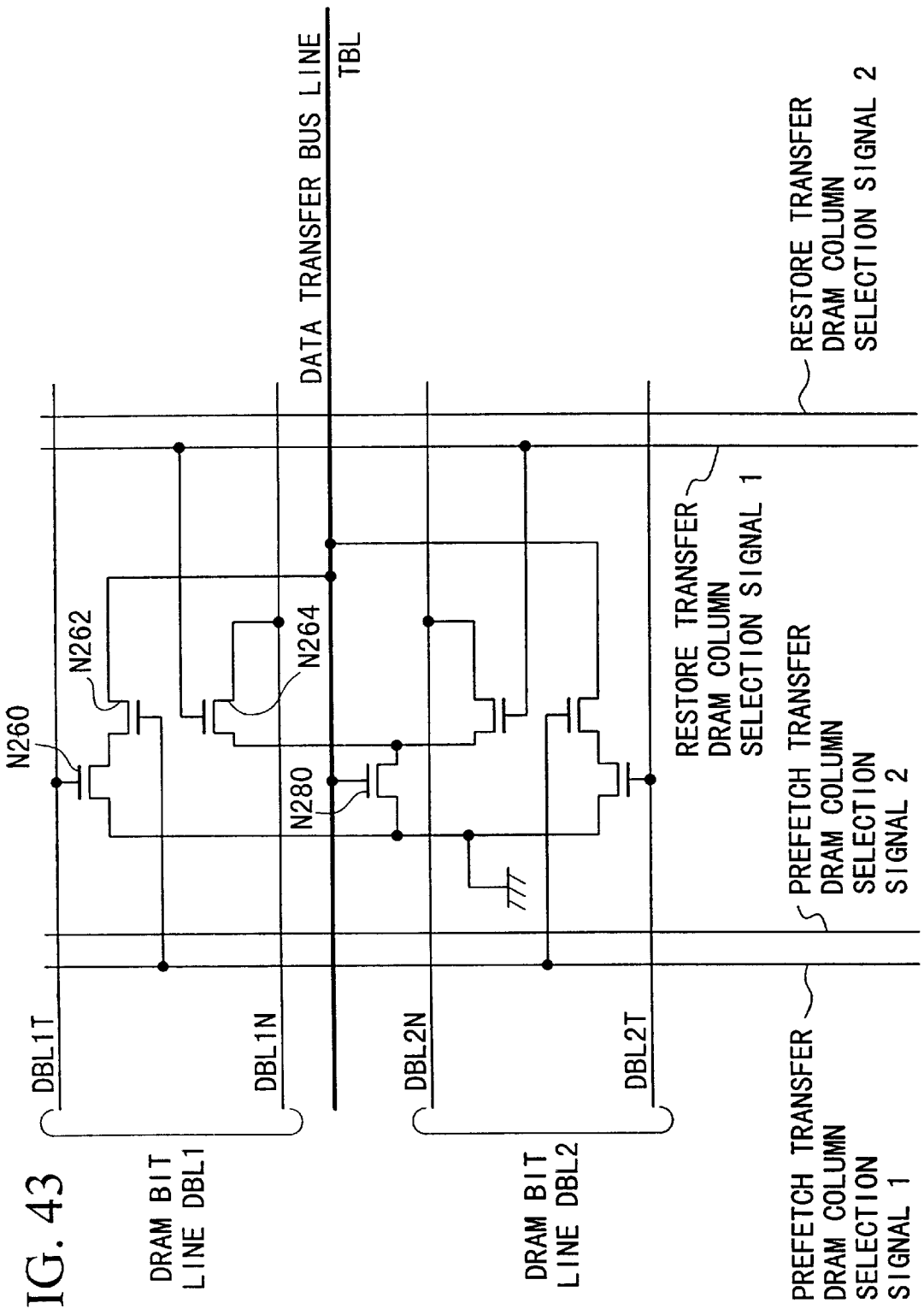
FIG. 43 shows an example of a concrete circuit construction of a DRAM bit line selection circuit.

FIG. 43 shows another construction of the DRAM bit line selection circuit which realizes the construction shown in FIG. 42 using only one data transfer bus line. In the construction shown in FIG. 43, an NMOS transistor N260 does not differentially amplify the data on the DRAM bit lines DBL but removes the data transfer bus line depending on the potential of the DRAM bit line. An NMOS transistor N280 is operated similarly. Alternatively, this may be constructed with only a switching transistor circuit as in the case shown in FIG. 40. By using only one data transfer bus line, the wiring layout becomes simple and it is possible to reduce noise between the data transfer bus lines.

Further, in the constructions in which data is received by the DRAM bit lines or the data transfer bus lines and transmitted, as shown in FIGS. 41 to 43, the DRAM bit lines can be completely separated from the data transfer bus lines. Therefore, noise generated in one side is hardly transmitted to the other and a high speed operation becomes possible.

[Construction of DRAM Bit Line Selection Circuit and SRAM Cell]

Figure 29:
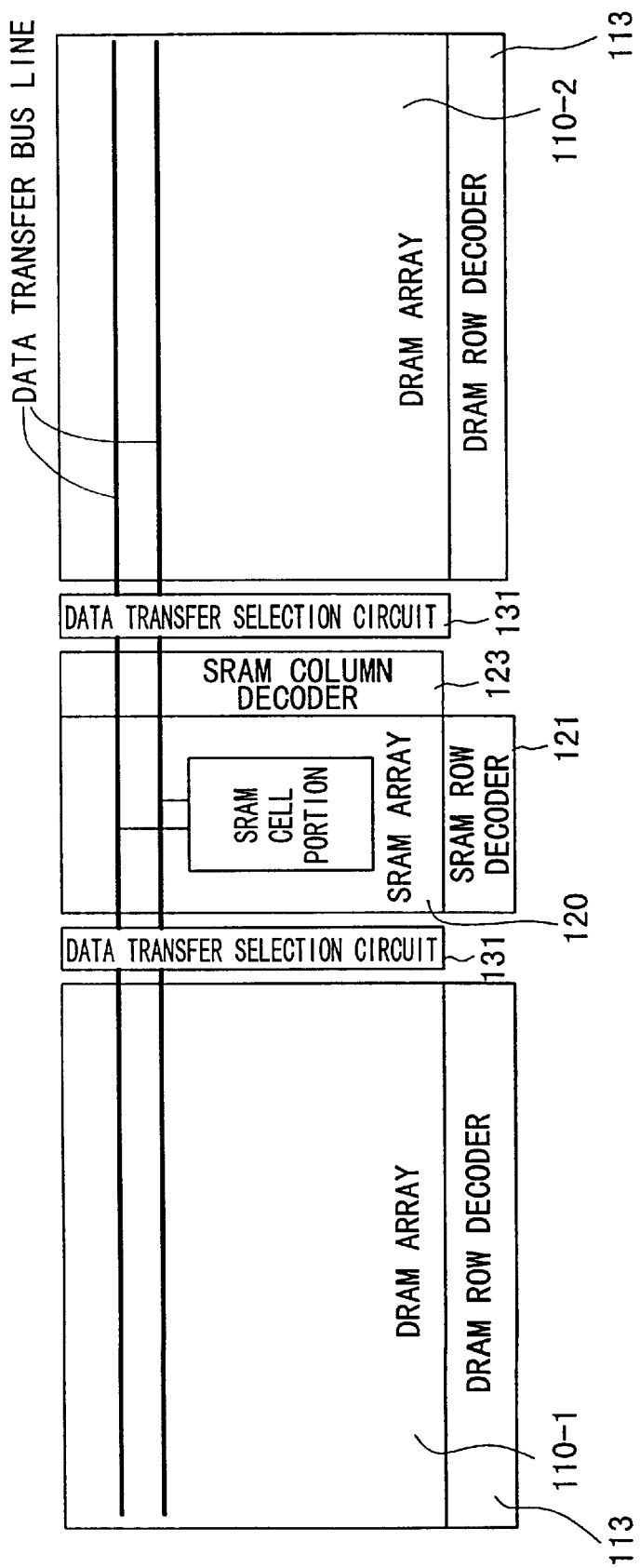
FIG. 29 is a layout of arrays schematically showing an array arrangement of a semiconductor memory device according to an embodiment of the present invention.
Figure 44:
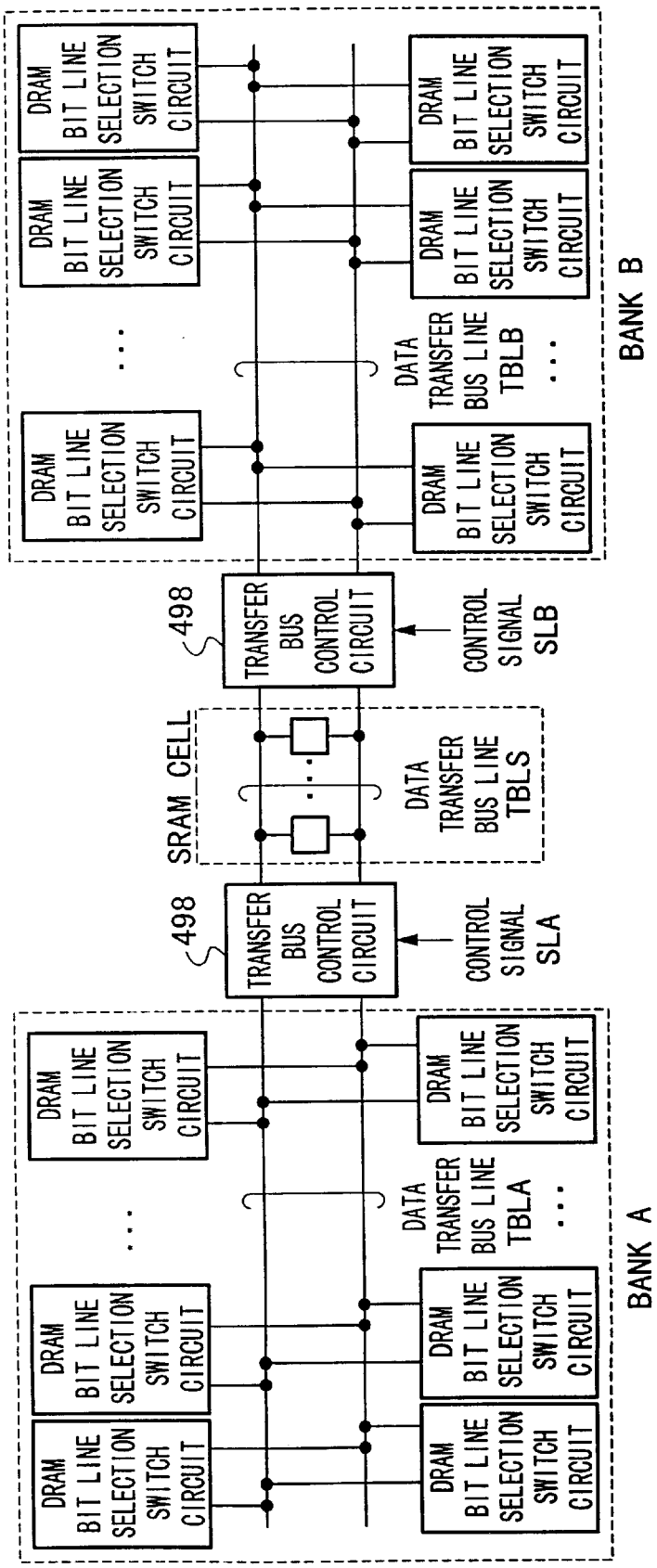
FIG. 44 shows a relation between a pair of data transfer bus lines, the DRAM bit line selection circuit, and the SRAM cells in the array layout shown in FIG. 29.
Figure 45:
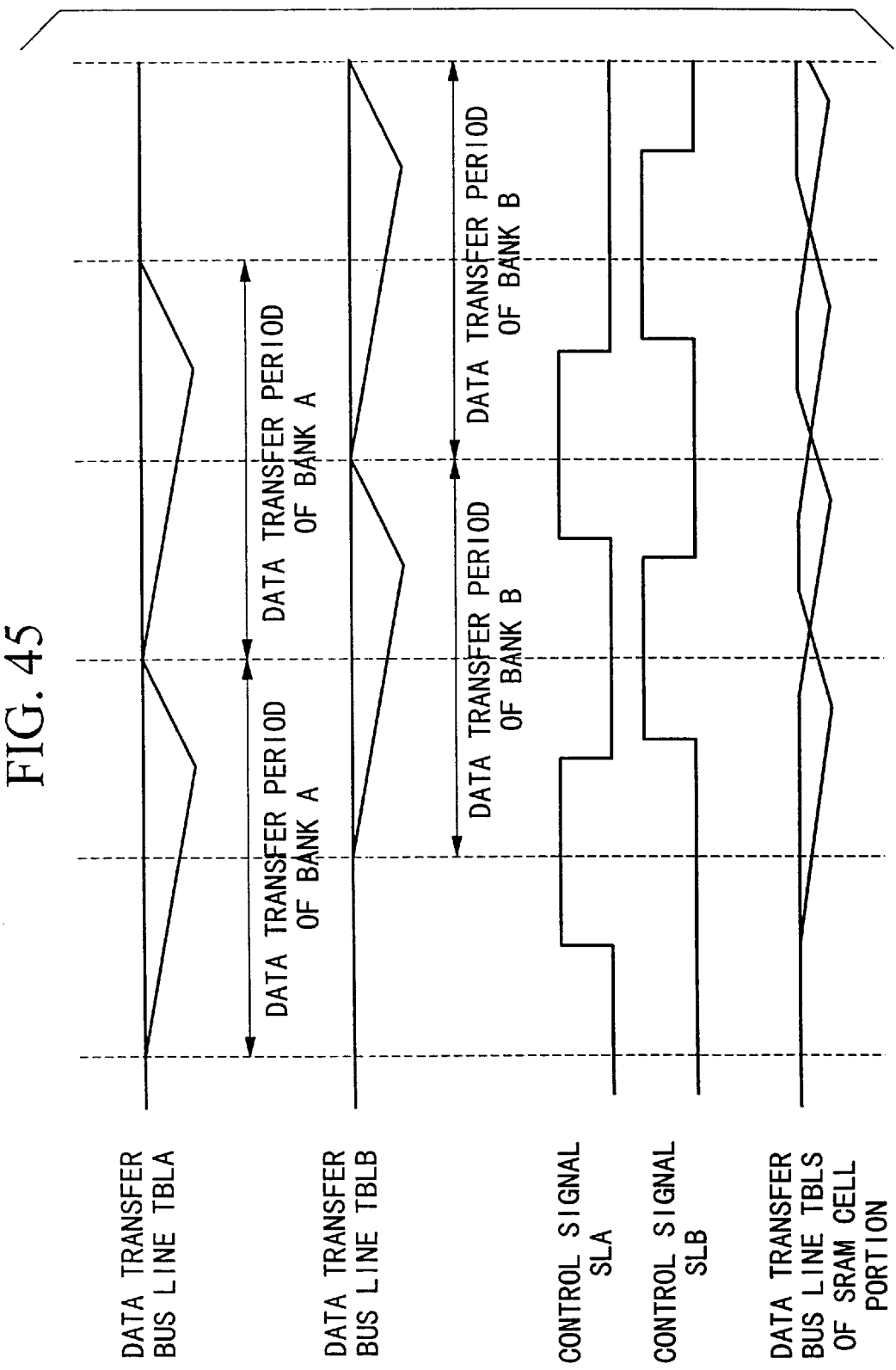
FIG. 45 shows signal waveforms showing an operation of the respective data transfer bus lines in FIG. 44.

FIG. 44 is a constructive diagram showing a relation between paired data transfer bus lines, the DRAM bit line selection circuit, and the SRAM cells in the layout shown in FIG. 29. In FIG. 44, memory cells on one column of the DRAM cell array are connected to the data transfer bus lines through the DRAM bit line selection circuit, so that data transfer between the cells and cells on one column of the SRAM cell array is possible. Further, the data transfer bus lines and the SRAM cell array are connected to each other through transfer bus control circuits 498. The data transfer bus control circuit 498 includes a circuit for selecting and connecting one of DRAM arrays (in this example, banks A and B) arranged on both sides of the SRAM cell array so that only an activated bank can be connected and, therefore, it is possible to realize a reduction of charging/discharging current and speeding up of data transfer by the reduction of THE load on the data transfer bus lines. Further, since, in performing data transfer of the both banks alternately (bank ping-pong operation), the data transfer bus line of one bank can be separated from the other as shown in FIG. 45, it is possible to execute the data transfers on the both banks simultaneously to thereby shorten an effective data transfer period.

As mentioned previously, since the number of bits which can be transmitted at once by the semiconductor memory device according to this embodiment is 1024 bits, and the load on the data transfer bus lines is very large, the peak current and current consumption become very large when the amplitude of the voltage of all data transfer bus lines is increased to the power source voltage level. In order to substantially reduce the peak current and current consumption, the amplitude of voltage of the data transfer bus lines is limited to a half of the power source voltage at most.

However, if the amplitude of the voltage of the data transfer bus line is small, the data of the SRAM cell must be amplified by such a small potential difference, and so the data transfer speed is lowered to some extent. In order to allow only the voltage of the data transfer bus line TBLS in the SRAM cell portion fully changed, a differential amplifier circuit connected to the gate of the data transfer bus line TBLA or TBLB in the DRAM bank for differentially amplifying may be provided in the transfer bus control circuits 498. Alternatively, a sense amplifier for amplifying only the voltage on the data transfer bit line TBLS in the DRAM bank in a state where the data transfer bus line TBLA or TBLB in the DRAM bank is separated may be provided. Alternatively, the transfer bus control circuit 498 includes a circuit for equilibrating or precharging.

3. {SRAM portion}

[Construction of SRAM Portion and Data Input/Output Terminal]

Figure 46:
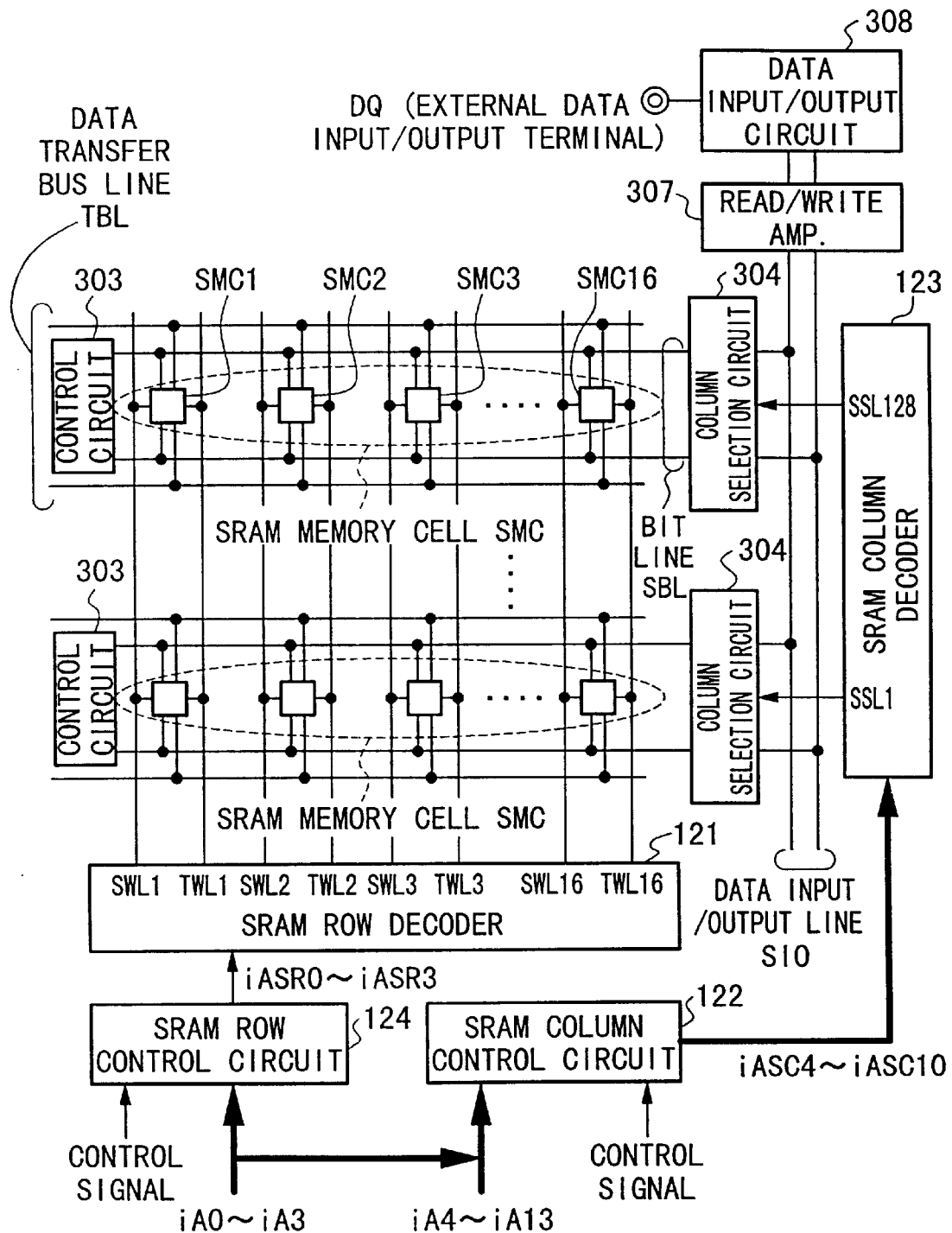
FIG. 46 shows a concrete example of the SRAM portion and the data input/output terminals shown in FIG. 1.

FIG. 46 shows an example of a concrete construction of the SRAM portion shown in FIG. 1 corresponding to one bit of the data input/output terminal DQ. Although this embodiment has the 16-Kbit, x8-bit construction, the present invention is not limited thereto and can take various constructions in combination of the construction of the main memory portion, with similar effect.

Figure 47:
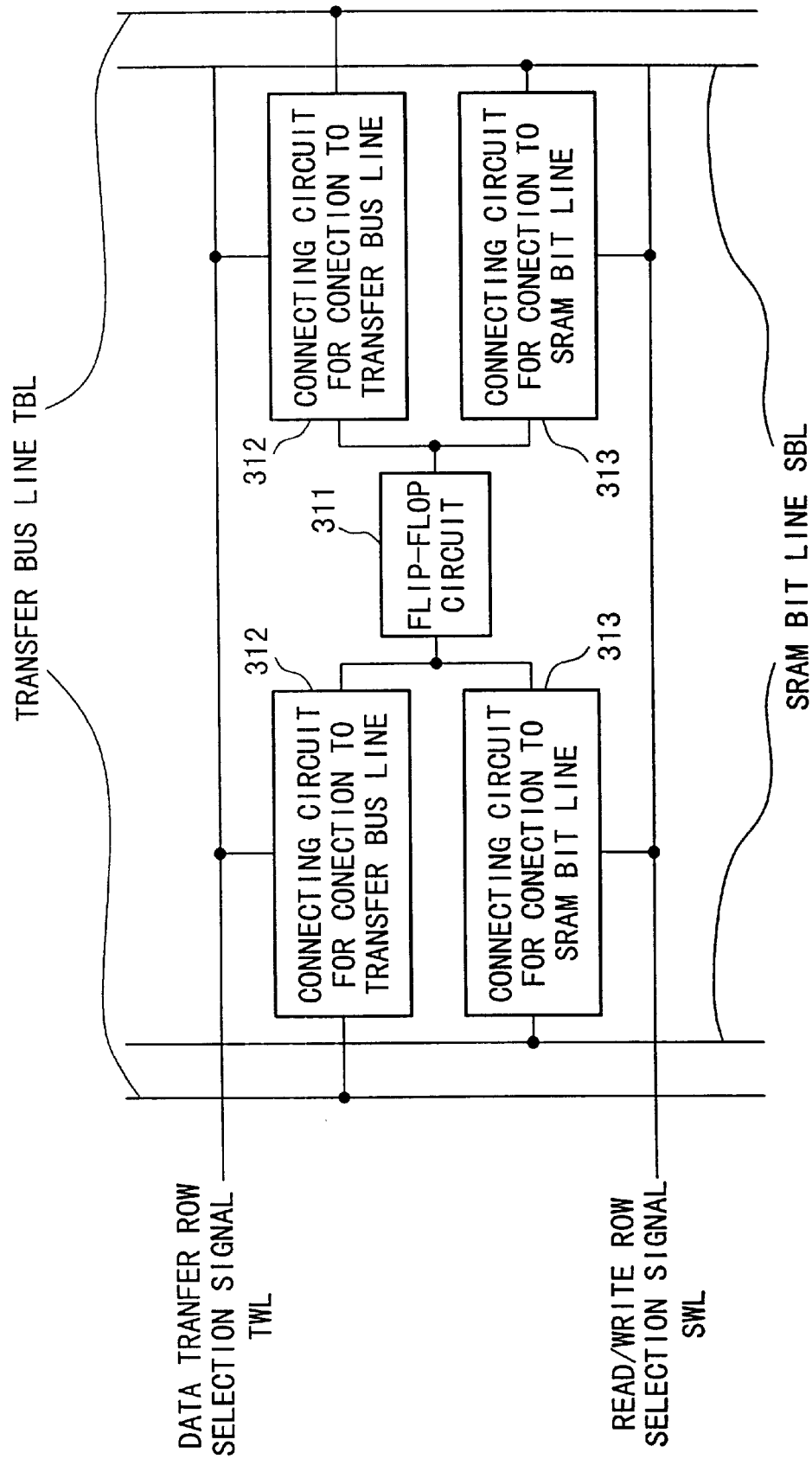
FIG. 47 shows an example of a construction of the SRAM memory cell.

In FIG. 46, the SRAM portion includes the SRAM memory cells SMC, each in turn including a flip-flop circuit 311, which may be any other circuit provided that it can store static data, connecting circuits 312 provided on both sides of the flip-flop circuit 311 for connection to the data transfer bus lines TBL and connecting circuits 313 also provided on the both sides of the flip-flop circuit 311 for connection to the SRAM bit lines SBL, as shown in FIG. 47. The SRAM portion further includes: the SRAM row decoder 121 for generating SRAM cell data transfer row selection signals TWL1 to TWL16 for activating the connecting circuits 312 in transferring data between the DRAM cell and the SRAM cell and the SRAM cell read/write row selection signals SWL1 to SWL16 in performing read or write; and the SRAM row control circuit 124 for generating the SRAM internal row address signals iASR0 to iASR3 input into the SRAM row decoder 121 on the basis of the internal address signals iA0 to iA3 and the SRAM portion control signal. It is, of course, possible to commonly use the SRAM cell data transfer row selection signals TWL and the SRAM cell read/write row selection signals SWL.

The SRAM bit lines SBL have the SRAM bit line control circuit 303 for equilibrating and/or precharging the bit lines, the SRAM column selection circuit 304 for connecting the data input/output line SIO to and the SRAM bit line SBL.

The SRAM portion further includes: the SRAM column decoder 123 for generating the selection signals SSL1 to SSL128 input into the SRAM column selection circuit 304; and the SRAM column control circuit 122 for generating the SRAM internal column address signals iASC4 to iASC10 on the basis of the internal address signals iA0 to iA13, and the SRAM portion control signal. The SRAM bit line control circuit 303 may include sense amplifier circuits for detecting and amplifying levels of the SRAM bit lines SBL.

Further, the data input/output lines SIO are connected to the external data input/output terminals DQ through the data input/output circuit 308 and the read/write amplifier 307. The data input/output lines SIO may be provided for read and write separately. Since the transfer bus lines TBL for data transfer and the SRAM bit lines SBL for read are provided, it is possible to perform the read operation regardless of the data transfer operation.

[Connection Circuits for SRAM Bit Line and Data Transfer Bus Line]

Figure 48:
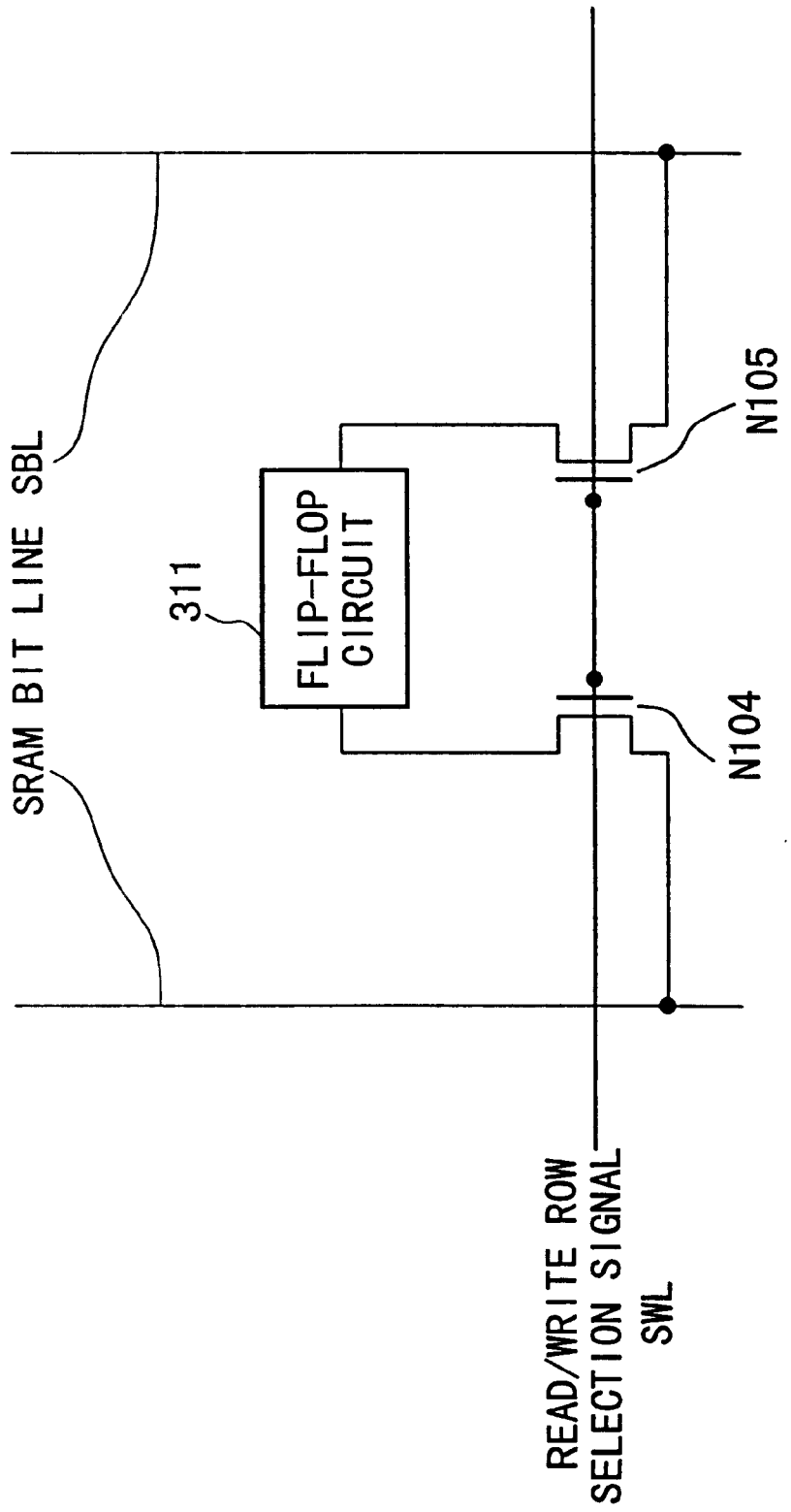
FIG. 48 shows a concrete example of a connecting circuit for connecting the SRAM bit lines shown in FIG. 47.
Figure 49:
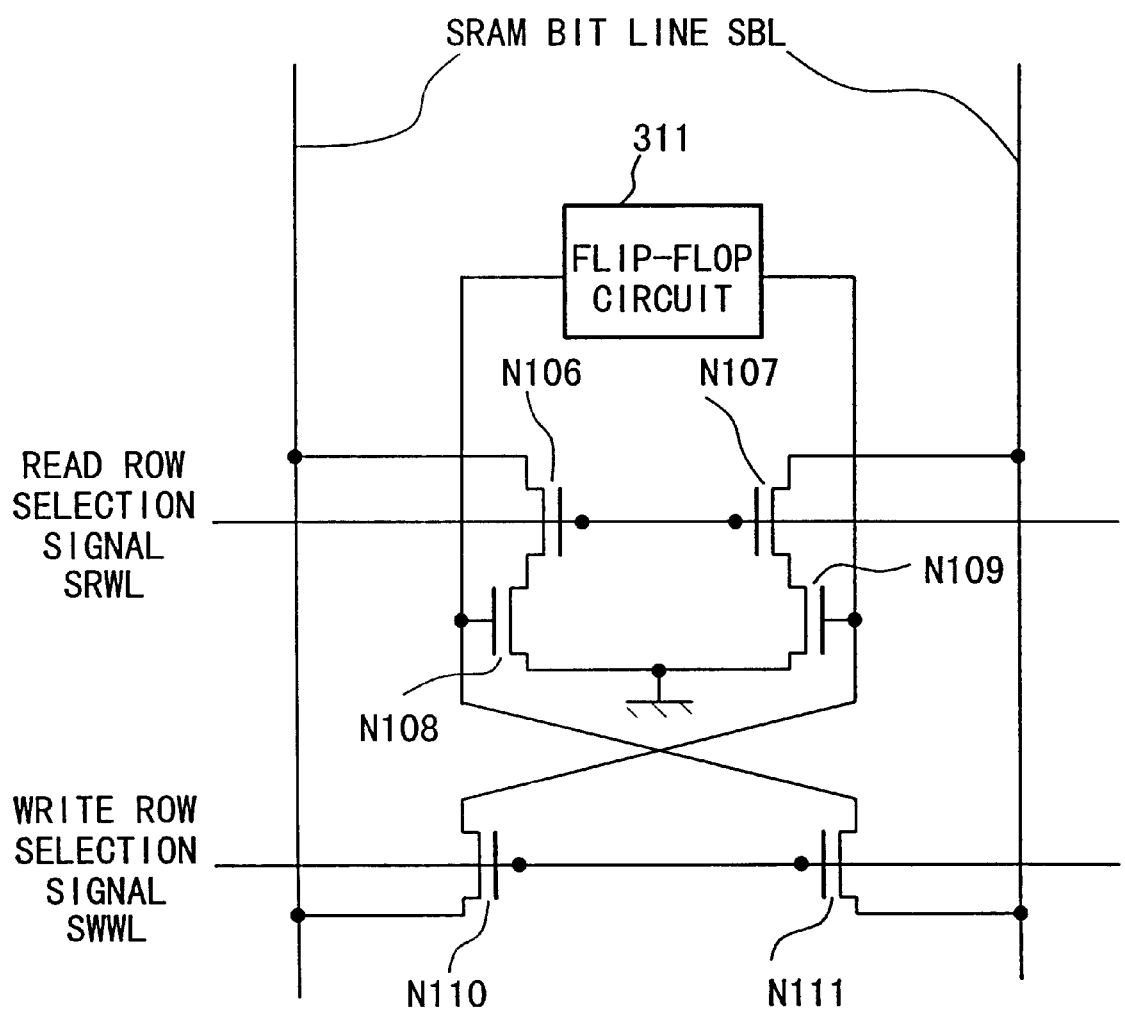
FIG. 49 shows a concrete example of a connecting circuit for connecting the SRAM bit lines shown in FIG. 47.
Figure 50:
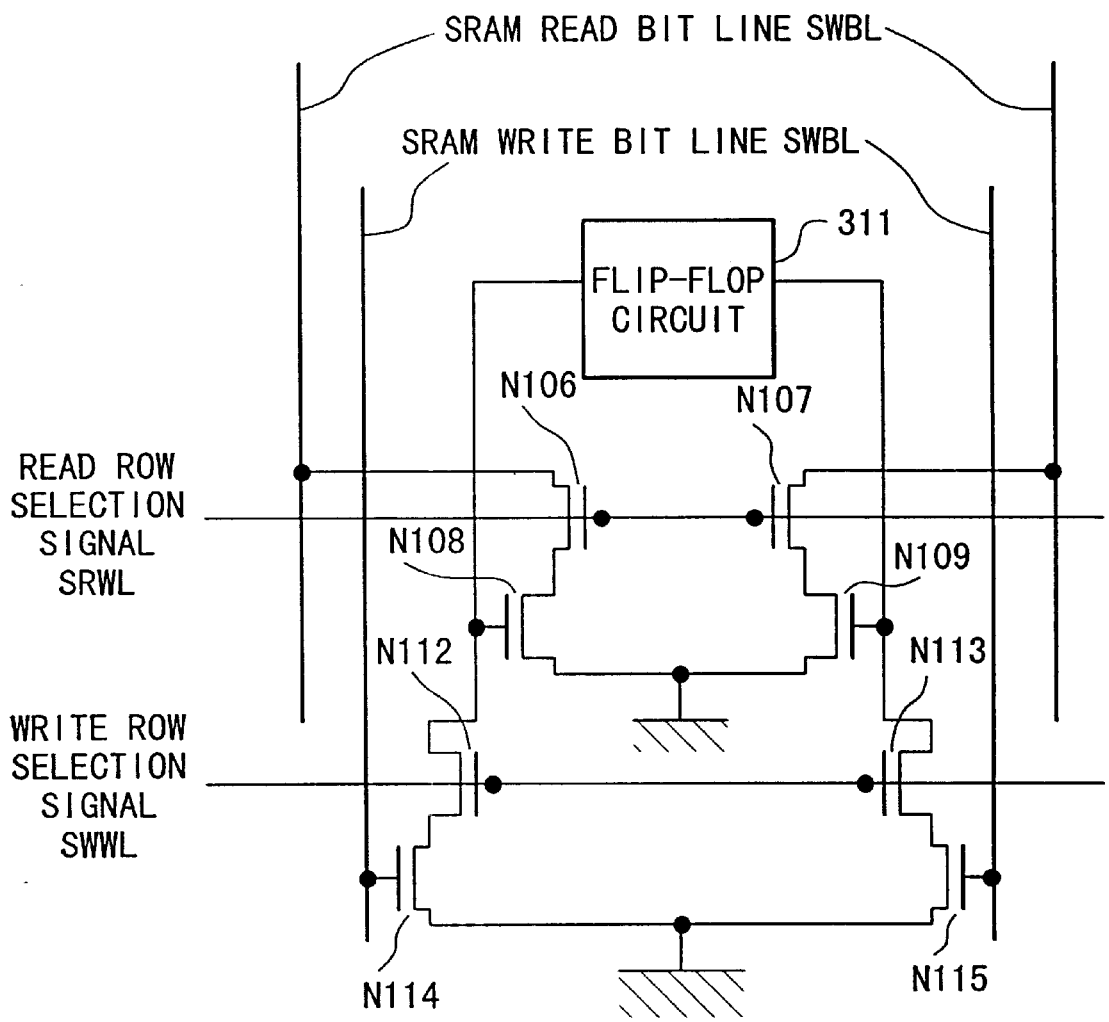
FIG. 50 shows a concrete example of a connecting circuit for connecting the SRAM bit lines shown in FIG. 47.

FIGS. 48 to 50 show circuit examples of the connection circuits for connection to the SRAM bit lines SBL.

FIG. 48 shows the simplest construction which includes NMOS switching transistor N104 and N105 and is connected to the SRAM bit lines SBL by a read/write row selection signal SWL.

The construction shown in FIG. 49 includes a switching transistor circuit composed of: NMOS transistors N108 and N109 having gates connected to the respective opposite terminals of the flip-flop circuit for differentially amplifying signals on the terminals when reading data from the flip-flop circuit; and NMOS transistors N106 and N107 for transmitting the amplified signals to the SRAM bit lines SBL by a read row selection signal SRWL. One terminal of each of the NMOS transistors N108 and N109 is connected to a fixed potential such as ground potential. To write data in the flip-flop circuit, the construction shown in FIG. 48 further includes a switching transistor circuit composed of NMOS transistors N110 and N111, as shown in FIG. 49, which connect the SRAM bit lines SBL to the flip-flop circuit by a write row selection signal SWWL.

A construction shown in FIG. 50 includes a switching transistor circuit composed of: NMOS transistors N108 and N109 having gates connected to the respective opposite terminals of the flip-flop circuit for differentially amplifying signals on the terminals in reading data from the flip-flop circuit as in the case shown in FIG. 49; and NMOS transistors N106 and N107 for transmitting the amplified signals to the SRAM bit lines SRBL for SRAM read by a read row selection signal SRWL. One terminal of each of the NMOS transistors N108 and N109 is connected to a fixed potential such as ground potential.

Figure 51:
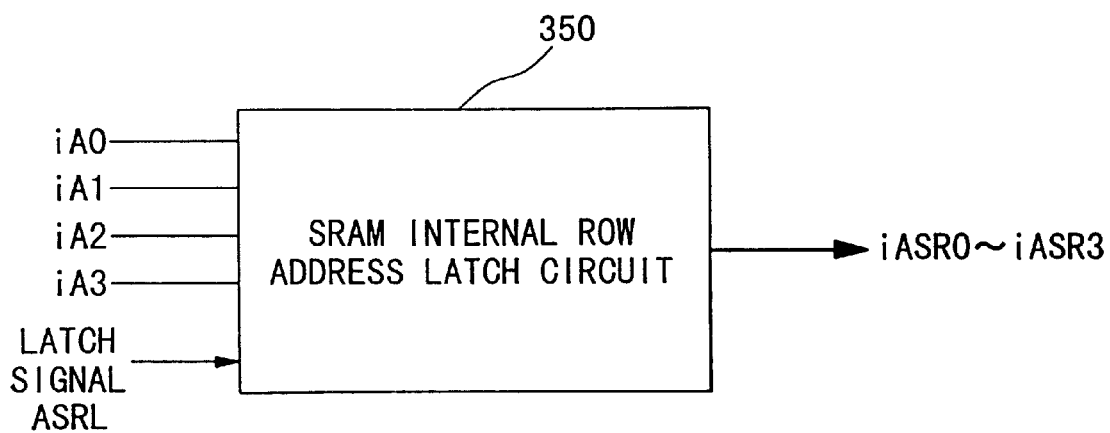
FIG. 51 shows a concrete example of a SRAM row control circuit shown in FIG. 46.

To write data in the flip-flop circuit, the construction shown in FIG. 51 further includes a switching transistor circuit composed of. NMOS transistors N114 and N115 having gates connected to the SRAM write bit line pair for differentially amplifying the signals on the SRAM write bit lines SWBL to write data in the flip-flop circuit; and NMOS transistors N112 and N113 for transmitting the amplified signals to the opposite terminals of the flip-flop circuit by a write row selection signal SWWL. One terminal of each of the NMOS transistors N114 and N115 is connected to a fixed potential such as ground potential.

In the construction shown in FIG. 49 or 50 in which data is transferred by connecting the opposite ends of the flip-flop circuit or the SRAM bit lines SBL to the gates of the transistors, it is possible to completely separate the opposite terminals of the flip-flop circuit from the SRAM bit lines SBL. Therefore, only a minimum amount of noise generated in one side is transmitted to the other and a high speed operation becomes possible. It is possible to construct the connection circuit to the data transfer bus lines TBL in the same manner as in the case shown in FIG. 48, 49 or 50.

[SRAM Row Control Circuit]

FIG. 51 shows, in detail, the circuit construction of the SRAM row control circuit shown in FIG. 46. In FIG. 51, the SRAM row control circuit is constructed with a SRAM internal row address latch circuit 350, and SRAM internal row address signals iASR0 to iASR3 are generated by the internal address signals iA0 to iA3 and a latch signal ASRL, which receives the internal address signals in a clock cycle of a read/write command input. The latch signal ASRL is one of the SRAM control signals generated by the operation control circuit shown in FIG. 32.

[SRAM Column Control Circuit]

Figure 52:
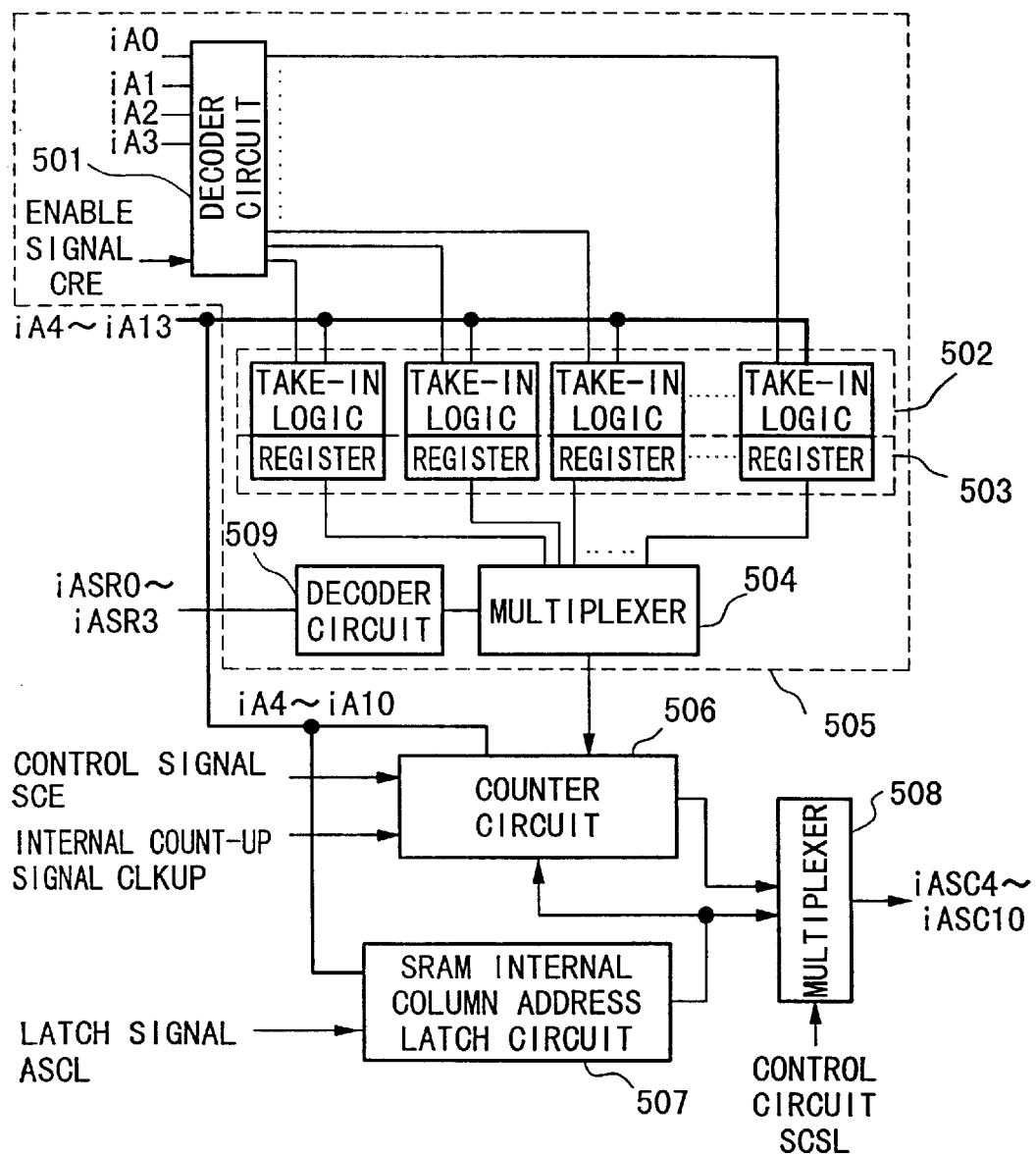
FIG. 52 shows a concrete example of a SRAM column control circuit shown in FIG. 46.

FIG. 52 shows, in detail, the construction of the SRAM column control circuit shown in FIG. 46. In FIG. 52, the SRAM column control circuit includes: an SRAM internal column address latch circuit 507 for latching the internal address signals iA4 to iA10 by a latch signal ASCL generated by the clock cycle at the read/write command input; and a counter circuit 506 for receiving the output of the SRAM internal column address latch circuit 507 by a control signal SCE and counting up in a predetermined sequence by an internal count-up signal CLKUP operable during a burst operation for performing read/write with respect to the SRAM. The SRAM internal column address signals iASC4 to iASC10 are output through a multiplexer 508 which passes the output of either the latch circuit 507 or the counter circuit 506. The multiplexer 508 selects the output of the latch circuit 507 in the clock cycle at the read/write command input, and is controlled by the control signal SCSL such that the SRAM internal column address signal can be output at as high speed as possible.

Further, the SRAM column control circuit according to the present invention includes a data input/output mode memory portion 505 which, in order to set completely different data input/output modes, for example, burst length, data input/output address sequence and latency, etc., for a plurality of SRAM cell groups (in this example, SRAM cell groups divided every row), receives the data input/output modes according to the states of the internal address iA0 to iA13 in the previously mentioned mode register setting (2) command cycle (in this example, although only the burst length can be set for the respective SRAM cell groups, it is possible to set their data input/output address sequence, latency, etc., for them) and stores the data input/output modes.

The data input/output mode memory portion 505 includes: receiving logic 502 provided in respective divided SRAM cell groups for generating setting data to be taken in according to the states of the internal addresses iA0 to iA13; registers 503 provided for the respective receiving logic for receiving in the setting data (outputs of the receiving logic 502) of the data input/output modes of the respective SRAM cell groups by an output of the decoder circuit 501 which is selected by the enable signal CRE generated in the previously mentioned mode register setting (2) command cycle; and a multiplexer 504 for passing one of the outputs of the registers 503 holding the setting data of the SRAM cell groups by selectively controlling the iASR0 to iASR3 output from the SRAM internal row address latch circuit 350 in the read/write command cycle by using the signal decoded by the decoder circuit 509.

The counter circuit 506 takes in an output of the multiplexer 504 to operate the semiconductor memory device in the data input/output mode set in the respective SRAM cell groups. The data input/output mode memory portion 505 must be provided for each of the data input/output modes to be set. The internal count-up signal CLKUP, the enable signal CRE, the control signals SCE and SCSL, and the latch signal ASCL are the SRAM portion control signals generated by the operation control circuit shown in FIG. 32. Of course, it is possible to use the same signal for the latch signal ASRL input to the SRAM internal row address latch circuit 350 and for the latch signal ASCL input to the SRAM internal column address latch circuit 507.

Instead of the setting of the data input/output mode memory portion 505 performed for the respective SRAM cell groups by the mode register setting (2) command cycle, it is possible to set the same setting data of two or more SRAM cell groups at once or to set the logic of addresses A4 and A5 in setting the SRAM row data of the mode register setting (2) command shown in FIG. 5. For example, when A4=L and A5=L, the data input/output mode is set in every SRAM cell group; when A4=H and A5=L, the data input/output mode is set in two SRAM cell groups ignoring the last bits of the SRAM row data, and when A4=L and A5=H, the data input/output mode is set in four SRAM cell groups ignoring the last two bits of the SRAM row data. In such manner, the data input/output mode memory portion 505 can be set in various combinations.

Further, the number of the receiving logic 502 as well as the registers 503 is not always the same as that of the divided SRAM cell groups, and it is possible to use one set of the receiving logic 502 and the register 503 commonly for a plurality of SRAM cell groups. Further, the addresses IASR0 to iASR3 are not always the signals from the SRAM internal row address latch circuit 350, and it is possible to provide a separate circuit therefore.

Figure 53:
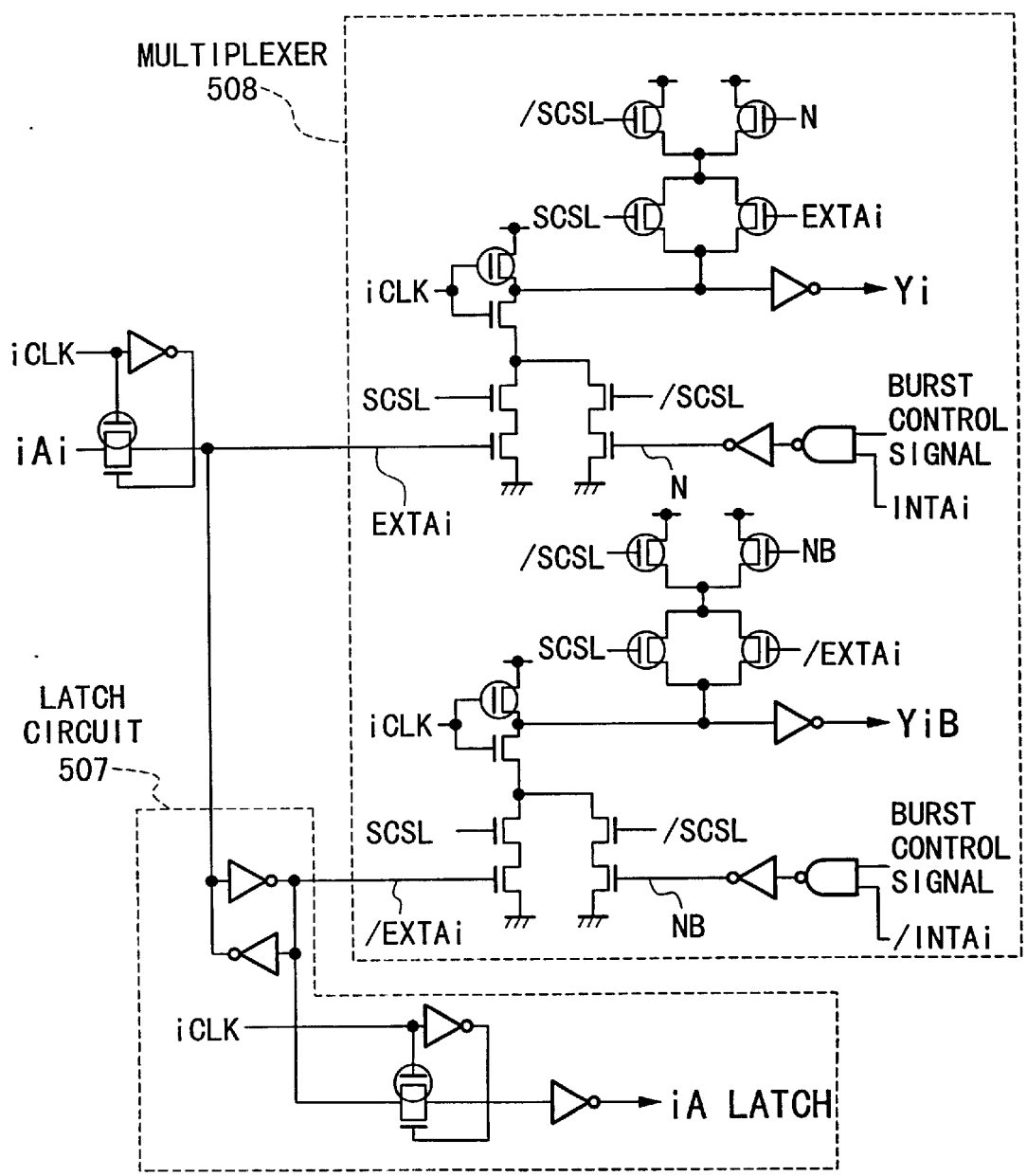
FIG. 53 shows a concrete example of a multiplexer and latch circuit shown in FIG. 52.
Figure 54:
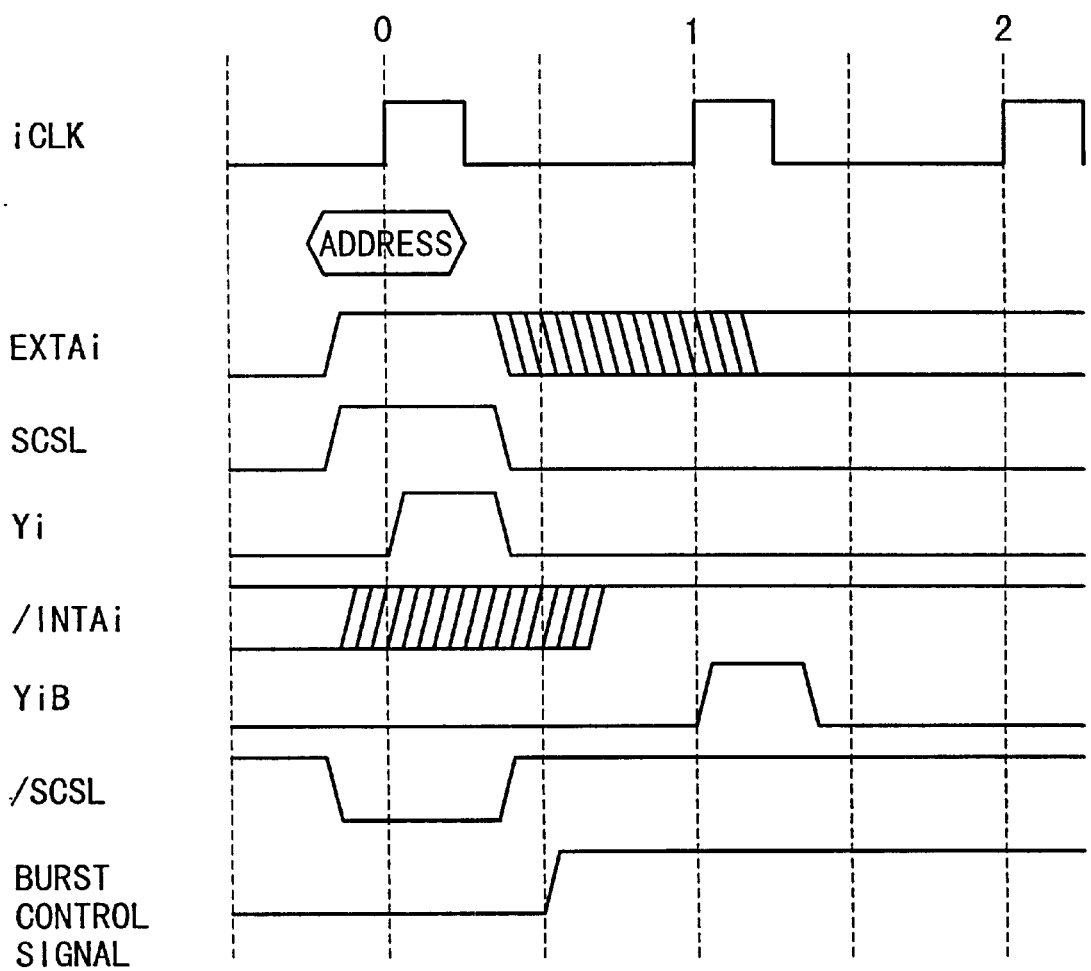
FIG. 54 shows signal waveforms showing an operation of the multiplexer shown in FIG. 53.

Further, it is possible to generate the internal address signals at high speed by constructing the SRAM internal column address latch circuit 507 and the multiplexer 508 such that the internal address is output immediately after a logic in which the internal address and the internal clock signal iCLK are synchronized with the external reference clock signal, as shown in FIG. 53. In FIG. 53, INTAi and /INTAi are address signals from the counter circuit 506 and EXTAi and /EXTAi are address signals generated from the internal address signal iAi. These signals are switched by the control signals SCSL and /SCSL and the burst control signal. SCSL is the control signal and /SCSL is a control signal having a phase opposite to that of the control signal SCSL. FIG. 54 shows an example of operation of this circuit. In this circuit construction, a delay from the internal clock iCLK to a time at which the internal address signal Yi is output corresponds to one stage of an inverter and is minimized. The internal address signals Yi and YiB are output as address pulse signals.

[SRAM Column Decoder and Data Control Circuit Construction]

Figure 55:
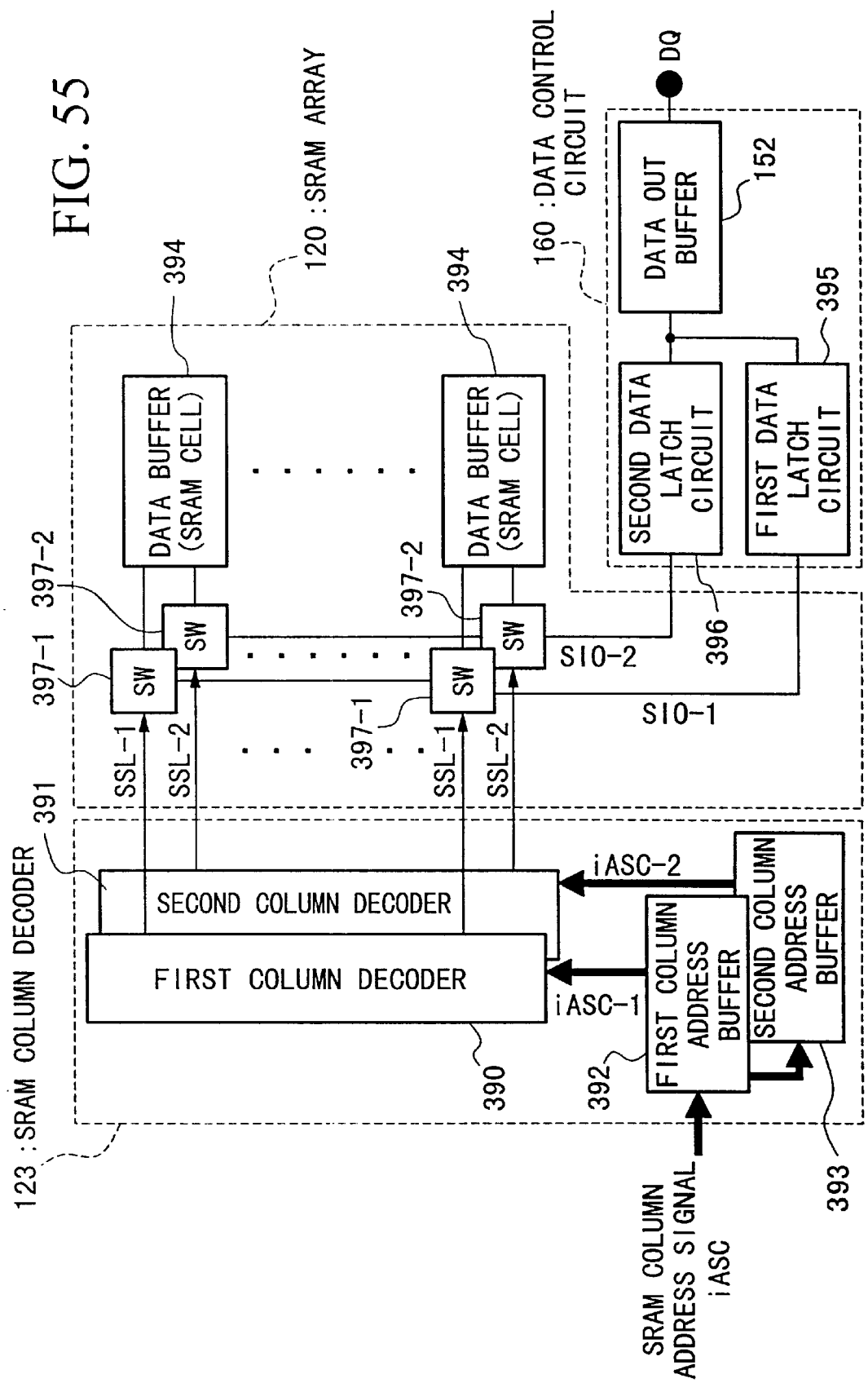
FIG. 55 is a block diagram showing the SRAM column decoder, the data control circuit, and the DRAM array shown in FIG. 1.

FIG. 55 shows the embodiment of the SRAM column decoder 123 and the data control circuit 160. In this embodiment, the SRAM portion 102 includes a plurality of systems for reading the stored data to the outside. That is, the SRAM column decoder 123 comprises a first column decoder 390, a second column decoder 391, a first column address buffer 392, and a second address buffer 393. The first column address buffer 392 receives an SRAM column address signal iASC from the SRAM column control circuit 122 and outputs a first SRAM column address signal iASC-1. The second column address buffer 393 also receives the SRAM column address signal iASC from the SRAM column control circuit 122 and output a second SRAM column address signal iASC-2.

The first column decoder 390 decodes the first SRAM column address signal iASC-1 from the first column address buffer 392, and outputs a second column decoded output signal SSL1. The second column decoder 391 decodes the first SRAM column address signal iASC-2 from the second column address buffer 393, and outputs a second column decoded output signal SSL-2.

In the SRAM array 120, data buffers 394, which include SRAM cells of flip-flops as main parts, are arranged in a matrix. First switch circuits 397-1, which become conductive depending on the first column decoded output signal SSL1, and second switch circuits 397-2, which become conductive depending on the second column decoded output signal SSL-2, are connected to the respective data buffers 394. The respective data buffers 394 are connected via the first switch circuits 397-1 and the second switch circuits 397-2 to a first data input/output line SIO-1 and a second data input/output line SIO-2.

The data control circuit 160 comprises: a first data latch circuit 396 whose input terminal is connected via the first data input/output line SIO-1 to the first switch circuits 397-1; a second data latch circuit 395 whose input terminal is connected via the second data input/output line SIO-2 to the second switch circuits 397-2; and a data-out buffer 152 connected to the output terminals of the first data latch circuit 396 and the second data latch circuit 395.

Figure 56:
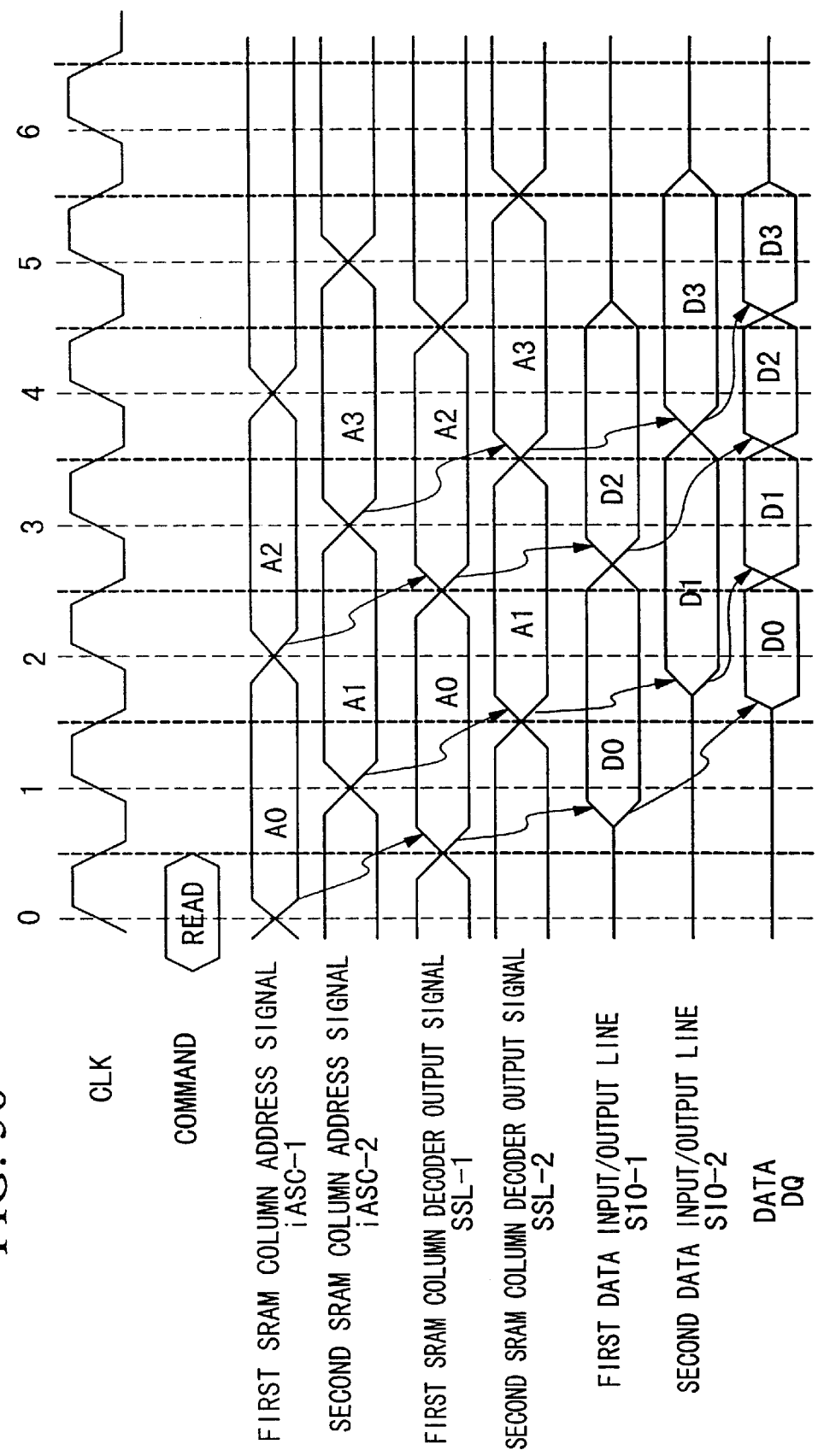
FIG. 56 shows signal waveforms showing an operation of the SRAM column decoder, the data control circuit, and the SRAM array shown in FIG. 55.

The operation of the construction shown in FIG. 55 will be explained with reference to FIG. 56 by way of an example in which the burst length is 4.

When a read command is executed at the rising edge of the clock signal CLK, the first column address buffer 392 outputs the first SRAM column address signal iASC-1 corresponding to the top address A, based on the SRAM column address signal iASC which is input from the outside. The first column decoder 390 receives the first SRAM column address signal iASC-1, and outputs the first SRAM column decoded output signal SSL-1 which is delayed from the output of the first SRAM column address signal iASC-1 by a half of one clock cycle. Upon reception of the signal SSL-1, the first switch circuit 397-1 becomes conductive so that the data D0 is output from the data buffer 394 specified by the address A0 to the data input/output line SIO-1. The data D0 is latched in the first data latch circuit 395, and is sent through the data-out buffer 152 as the data DQ.

Then, after one clock cycle from the output of the first SRAM column address signal iASC-1 corresponding to the address A0, the second column address buffer 393 receives the SRAM column address signal iASC transferred through the first column address buffer 392, and outputs the second SRAM column address signal iASC-2 corresponding to the address A1 which is next to the address A0. The second column decoder 391 receives the second SRAM column address signal iASC-2, and outputs the second SRAM column decoded output signal SSL-2 after a half of one clock cycle from the output of the second SRAM column address signal iASC-2. Upon reception of the signal SSL2, the second switch circuit 397-2 becomes conductive so that the data D1 is sent from the data buffer 394 specified by the address A1 to the data input/output line SIO-2. The data D1 is latched in the second data latch circuit 396. At that time, the data-out buffer 152 switches the input from the first data latch circuit 395 to the second data latch circuit 396, the data D1 latched in the second data latch circuit 396 is output as the data DQ.

Then, after one clock cycle from the output of the second SRAM column address signal iASC-2 corresponding to the address A1, the first column address buffer 392 outputs the first SRAM column address signal iASC-1 which indicates the address A2 next to the address A1. The first column decoder 390 receives the first SRAM column address signal iASC-1, and outputs the first SRAM column decoded output signal SSL-1 after a half of one clock cycle from the output the first SRAM column address signal iASC-1. Upon reception of the signal SSL-1, the first switch circuit 397-1 becomes conductive so that the data D2 is sent from the data buffer 394 corresponding to the address A2 to the data input/output line SIO-1. The data D2 is latched in the first data latch circuit 395. At that time, the data-out buffer 152 switches the input from the second data latch circuit 396 to the first data latch circuit 395, and the data D2 latched in the first data latch circuit 395 is sent as the data DQ.

Then, after one clock cycle from the output of the first SRAM column address signal iASC-1 corresponding to the address A2, the second column address buffer 393 outputs the second SRAM column address signal iASC-2, which indicates the address A3 next to the address A2. The second column decoder 391 receives the second SRAM column address signal iASC-2, and outputs the second SRAM column decoded output signal SSL-2 after a half of one clock cycle from the output the second SRAM column address signal iASC-2. Upon reception of the signal SSL-2, the second switch circuit 397-2 becomes conductive so that the data D3 is sent from the data buffer 394 corresponding to the address A3 to the data input/output line SIO-2. The data D3 is latched in the second data latch circuit 396. At that time, the data-out buffer 152 switches the input from the first data latch circuit 395 to the second data latch circuit 396, and the data D3 latched in the second data latch circuit 396 is sent as the data DQ.

As described above, the first circuit system includes the first column address buffer 392, the first column decoder 390, the first switch circuits 379-1, and the first data latch circuit 395, and the second circuit system includes the second column address buffer 393, the second column decoder 391, the second switch circuits 397-2, and the second data latch circuit 396. These first and second systems operate alternately so that the four continuous addresses in the SRAM array are successively specified from the address A0 in every clock cycle, and the data D0 to D3 are successively output in every clock cycle.

In the respective circuit systems, the internal circuits other than the data-out buffer 152 read the data DQ in two clock cycle unit. Thus, the operating frequency of the internal circuits can be reduced, and the data can be read at high speed from the data input/output terminal DQ in a requested cycle time without increasing the operating frequency of the circuits.

In the above-described construction, it is possible to accelerate the cycle of continuous data output or continuous data write without increasing the internal operating cycle. This is also true in the synchronous DRAM of DOUBLE DATA RATE (DDR). Particularly, the present invention is effective in a high-frequency synchronous multi-task DRAM in which a burst length and a lap type are changeable in the burst mode.

While in this embodiment the data is output in one clock cycle and the internal operations are performed in two clock cycles, the present invention is not limited to this and the clock may be changed according to design specification.

[Another embodiment of the SRAM column decoder and the data control circuit]

Figure 57:
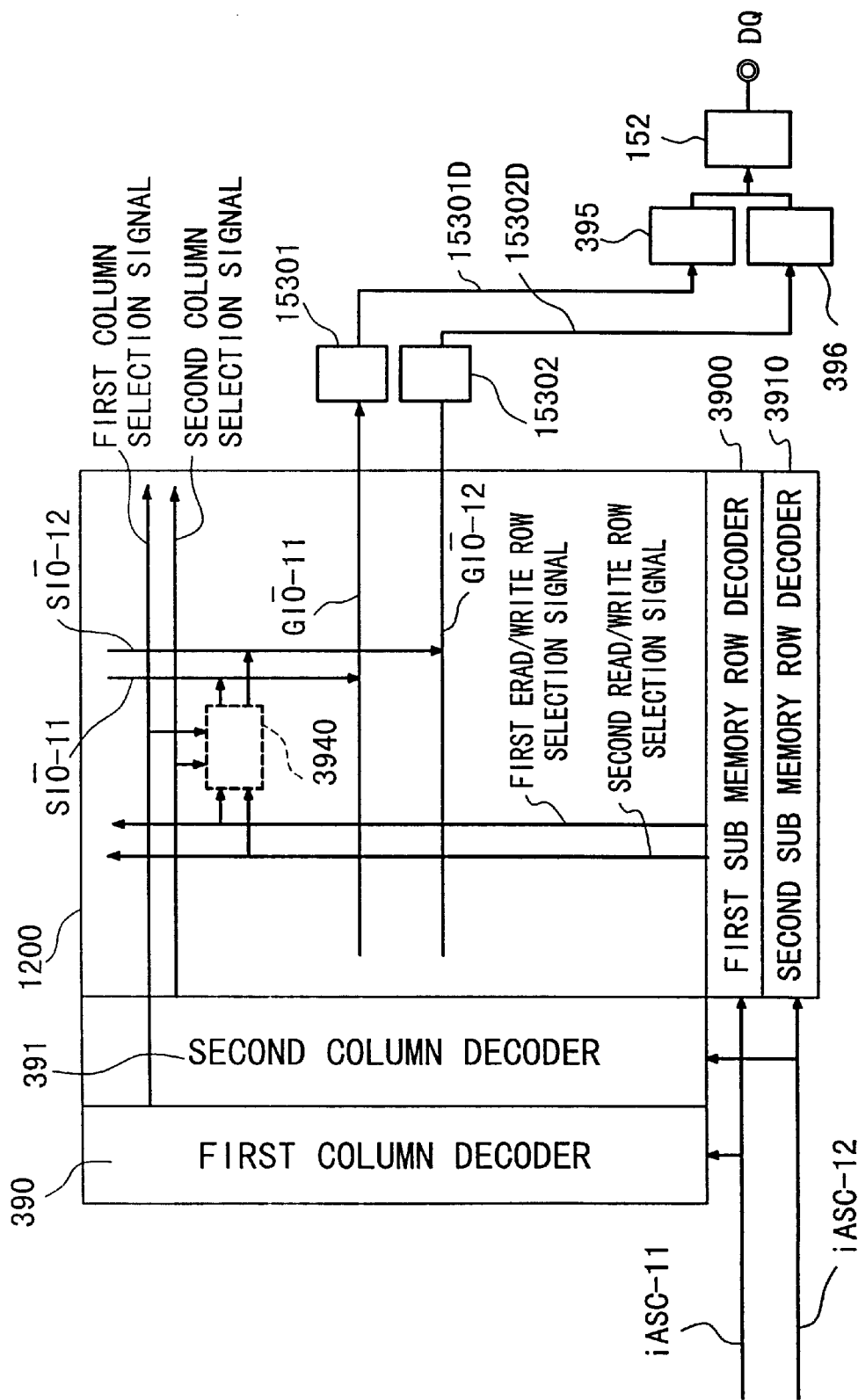
FIG. 57 is a block diagram showing another embodiment of the SRAM column decoder, the data control circuit, and the SRAM array shown in FIG. 1.
Figure 58:
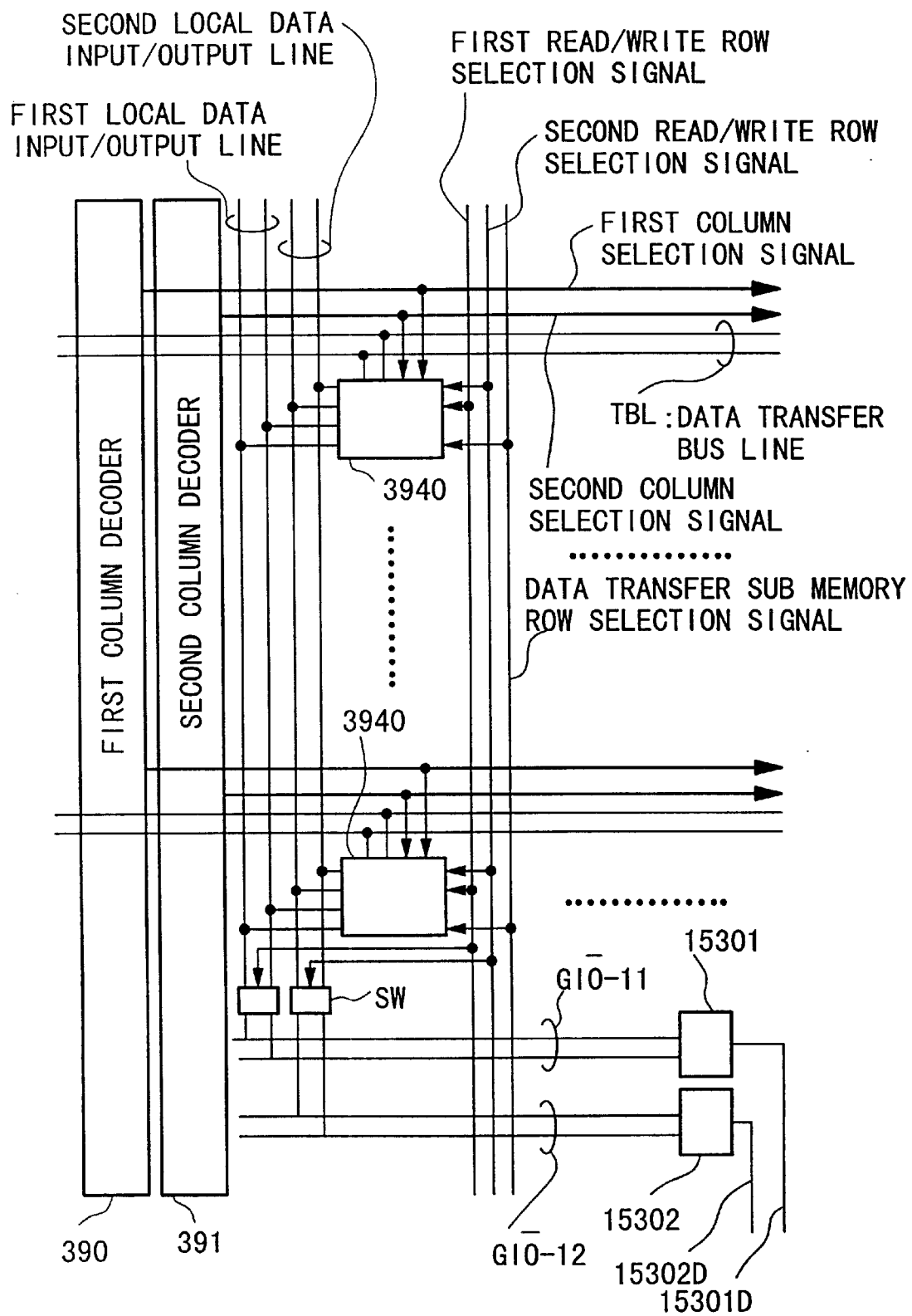
FIG. 58 is a block diagram showing in detail another embodiment of the SRAM column decoder, the data control circuit, and the SRAM array shown in FIG. 57.

FIG. 57 shows another embodiment of the SRAM column decoder 123 and the data control circuit 160. While in the above-described embodiment of the SRAM column decoder and the data control circuit includes a plurality of data read systems, this embodiment further comprises a first sub-memory row decoder 3900 and a second sub-memory row decoder 3910 which are row decoders, that is, includes a plurality of data read systems for rows and columns.

Figure 59:
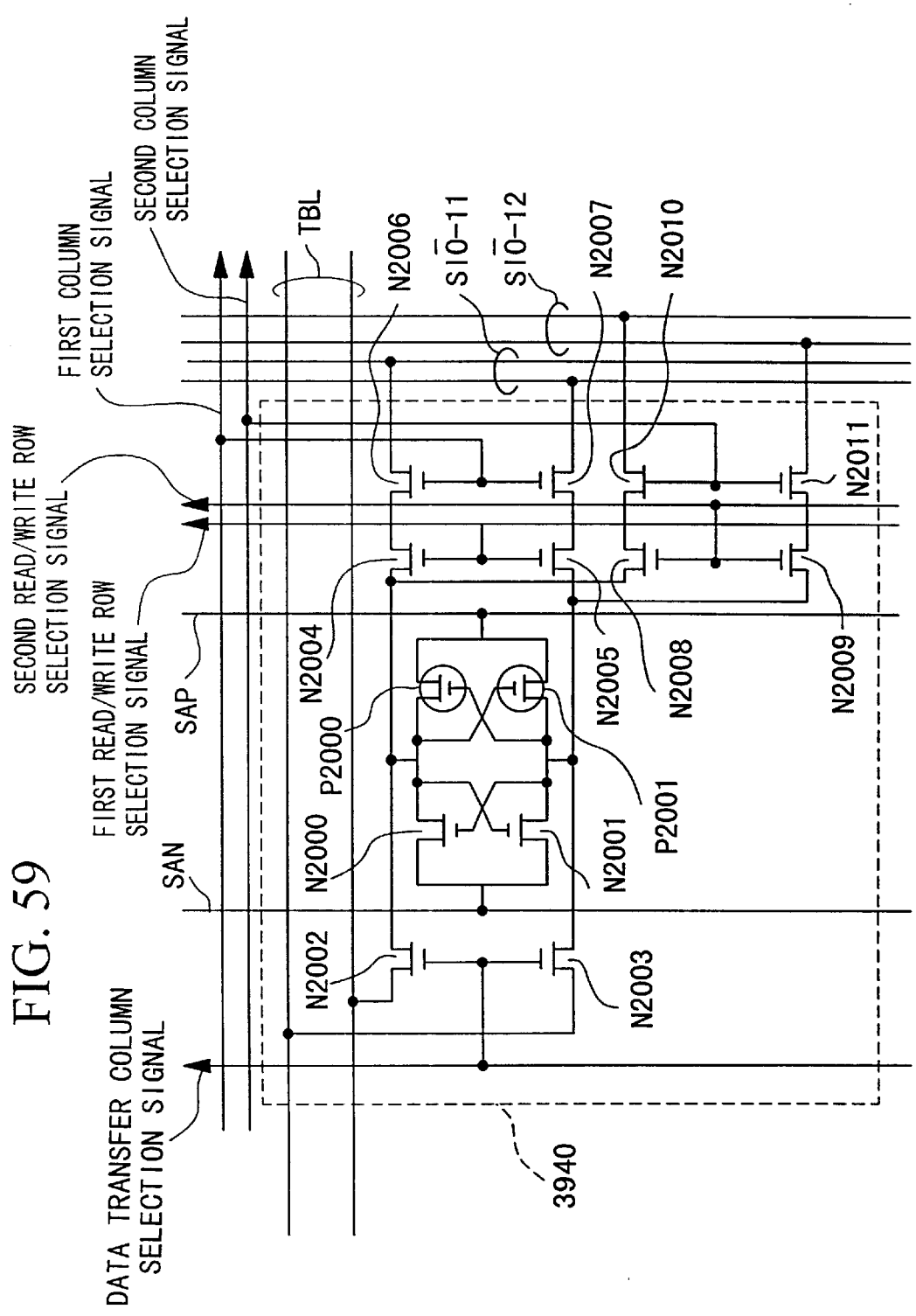
FIG. 59 is a diagram showing the concrete example of the memory cell shown in FIGS. 57 and 58.

In FIG. 57, an SRAM array 1200 includes memory cells 3940, whose details are shown in FIG. 59, as data buffers arranged in a matrix. The memory cell 3940 can be connected to a first data input/output line SIO-11, depending on a first column selection signal from a first column decoder 390 and on a first read/write row selection signal from the first sub-memory row decoder 3900, and can be connected to a second data input/output. line SIO-12, depending on a second column selection signal from a second column decoder 391 and on a second read/write row selection signal from the second sub-memory row decoder 3910. The first data input/output line SIO-11 and the second data input/ output line SIO-12 are connected via switch circuits SW to the global data input/output lines GIO-11 and GIO-12, respectively.

Read/write amplifiers 15301 and 15302 are connected to the global data input/output lines GIO-11 and GIO-12. The read/write amplifiers 15301 and 15302 are connected via data buses 15301D and 15302D to data latch circuits 395 and 396 to which a data input/output circuit 152 is connected.

FIG. 59 specifically shows the construction of the memory cell 3940. As shown in FIG. 59, the memory cell 3940 includes a flip-flop as a main part which comprises: N-type transistors N2000 and N2001 whose sources receive an SRAM cell control signal SAN; and P-type transistors P2000 and P2001 whose sources receive an SRAM cell control signal SAP. A memory node pair of the flip-flop is connected via N-type transistors N2002 and N2003, which become conductive depending on a data transfer SRAM row selection signal, to data transfer bus lines TBL, and is connected by way of the data transfer bus lines TBL to the DRAM portion.

The memory node pair of the flip-flop constituting the memory cell is connected via N-type transistors N2004 and N2005, which become conductive depending on the first read/write row selection signal, and via N-type transistors N2006 and N2007, which become conductive depending on the first column selection signal, to the data input/output line SIO-11. The memory node pair of the flip-flop is connected via N-type transistors N2008 and N2009, which become conductive depending on the second read/write row selection signal, and via N-type transistors N2010 and N2011, which become conductive depending on the second column selection signal, to the data input/output line SIO-12. The gates of the N-type transistors N2002 and N2003 connected to the data transfer bus lines TBL receive the data transfer SRAM row selection signal, which controls the connection between the flip-flop of the SRAM cell and the data transfer bus lines TBL.

According to the construction of the memory cell, when the first read/write row selection signal and the first column selection signal are simultaneously activated, the memory cell is electrically connected to the data input/output line SIO-11. When the second read/write row selection signal and the second column selection signal are simultaneously activated, the memory cell is electrically connected to the data input/output lines SIO-12. That is, depending on two pairs of the read/write row selection signals and the column selection signals, the memory is selectively connected to one of the data input/output lines SIO-11 and SIO-12. Each memory cell in the SRAM array 1200 is selected by the first column decoder, the first sub-memory row decoder, the second column decoder, and the second sub-memory row decoder shown in FIG. 57.

A circuit for generating an internal address signal iASC-11 to be input to the first column decoder and the first sub-memory row decoder, and an internal address signal iASC-12 to be input to the second column decoder and the second sub-memory row decoder will now be explained.

Figure 60:
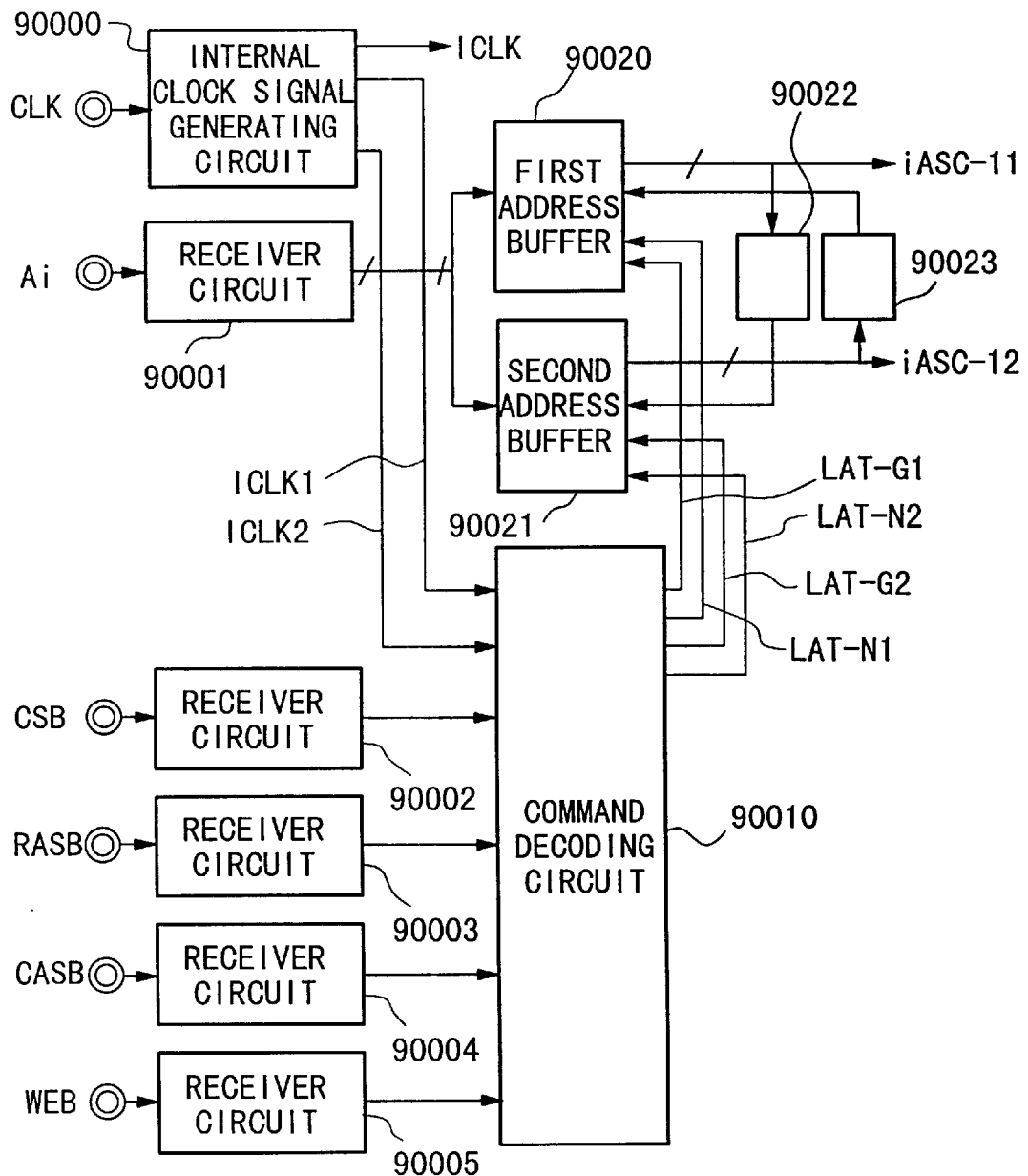
FIG. 60 is a diagram showing the construction of an internal address signal generating circuit system used in the embodiment shown in FIG. 57.

FIG. 60 shows the circuit system for generating the internal address signals. In FIG. 60, an internal clock generating circuit 90000 alternately generates internal clock signals ICLK1 and ICLK2 having a predetermined pulse width, based on an external clock signal CLK. Receiver circuits 90001 to 90005 receive an address signal Ai and various control signals CSB, RASB, CASB, and WEB which are externally input.

A command decoding circuit 90010 decodes the combination of logic of the control signals, and generates a first sub-memory external address latch signal LAT-G1, a first sub-memory next address latch signal LAT-N1, a second sub-memory external address latch signal LAT-G2, and a second sub-memory next address latch signal LAT-N2, according to the internal clock signals ICLK1 and ICLK2 from the internal clock generating circuit 90000. The first sub-memory external address latch signal LAT-G1 and the first sub-memory next address latch signal LAT-N1 are generated based on the internal clock signal ICLK1. The second sub-memory external address latch signal LAT-G2 and the second sub-memory next address latch signal LAT-N2 are generated based on the internal clock signal ICLK2. The first and second sub-memory external address latch signals are generated at a rising edge of the external clock signal when receiving the read command and the external address. The first and second sub-memory next address latch signals are generated at another rising edge of the external clock signal.

A first address buffer 90020, which is controlled by the command decoding circuit 90010, generates an internal address signal iASC-11 corresponding to the address signal Ai, based on the internal clock signal ICLK1. A second address buffer 90021, which is controlled by the command decoding circuit 90010, generates an internal address signal iASC-12 corresponding to the address signal Ai, based on the internal clock signal ICLK2.

A next address signal generating circuit 90022 generates the next address signal of the internal address signal iASC-11 generated by the first address buffer 90020, and outputs, it to the second address buffer 90021. A next address signal generating circuit 90023 generates the next address signal of the internal address signal iASC-12 generated by the second address buffer 90021, and outputs it to the first address buffer 90020.

Figure 61:
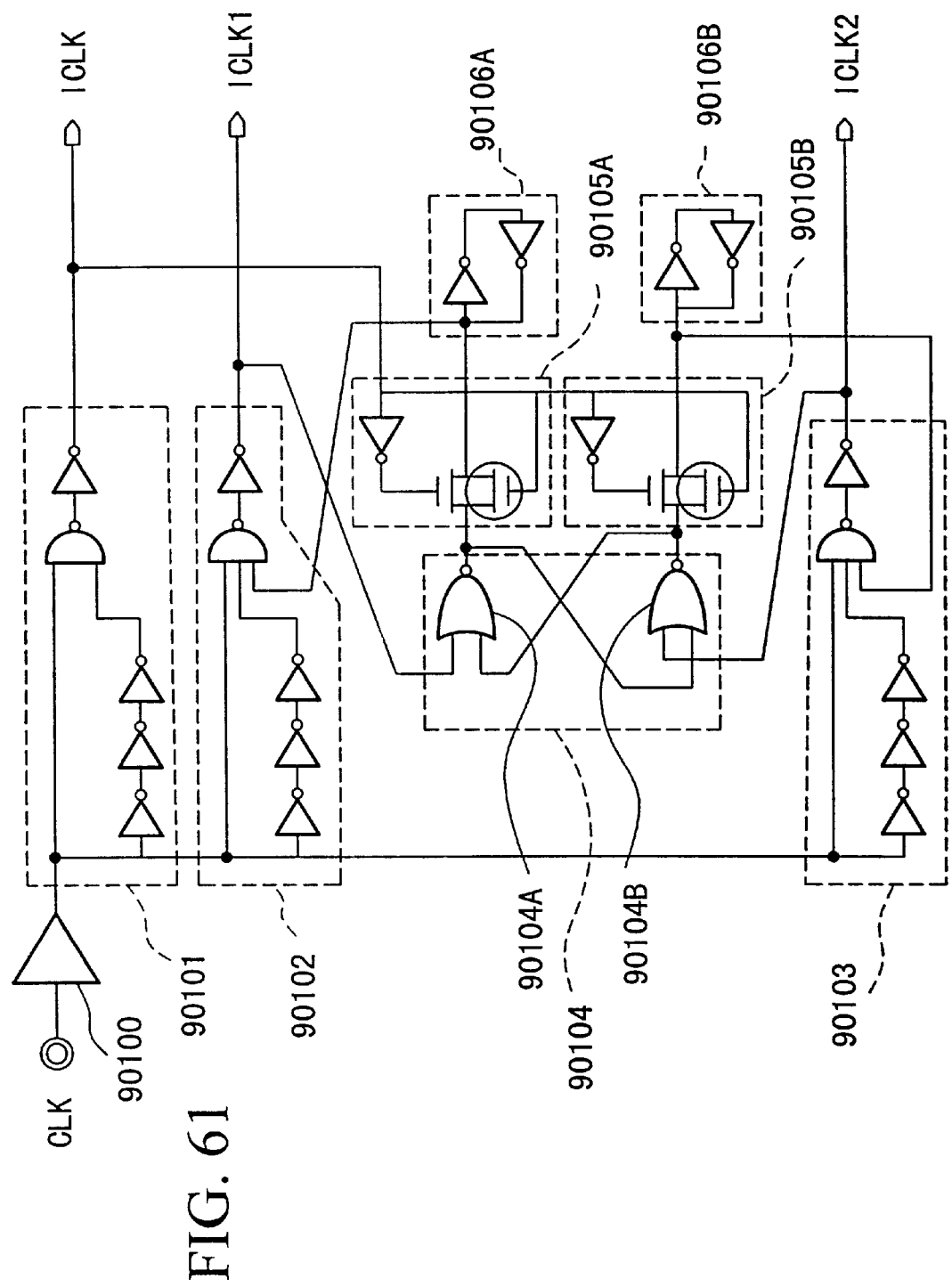
FIG. 61 is a diagram showing the construction of an internal clock signal generating circuit shown in FIG. 60.

FIG. 61 shows the construction of the internal clock signal generating circuit 90000.

A receiver circuit 90100 receives the external clock signal CLK. A transition detector 90101 detects the rising edge of the signal (CLK) output from the receiver circuit 90100. Transition detectors 90102 and 90103 detect the rising edge of the signal (CLK) output from the receiver circuit 90100, and output the internal clock signals ICLK1 and ICLK2, depending on the state of the signals stored in flip-flops 90106A and 90106B which are described later.

A flip-flop 90104 is a so-called reset-type flip-flop which comprises NOR circuits 90104A and 90104B. The internal state of the flip-flop 90104 depends on the pulse output from the transition detectors 90102 and 90103. Switch gate circuits 90105A and 90105B are connected to the output of the NOR circuits 90104A and 90104B, and become conductive, depending on the pulse output from the transition detector 90101. The flip-flops 90106A and 90106B are connected via the switch gate circuits 90105A and 90105B to the outputs from the NOR circuits 90104A and 90104B.

According to the internal clock signal generating circuit 90000, one of the transition detectors 90102 and 90103 is activated, depending on the internal state of the flip-flop 90104. That is, when the external clock signal CLK is steady, the internal clock signals ICLK, ICLK1, and ICLK2 are "0", and the switch gate circuits 90105A and 90105B are conductive. Therefore, the flip-flop 90104 inputs "1" to one of the transition detectors and "0" to the other.

It is assumed that the NOR circuit 90104A of the flip-flop 90104 inputs "1" to the transition detector 90102, and that the NOR circuit 90104B inputs "0" to the transition detector 90103. When the external clock signal CLK rises, the transition detector 90102 outputs a pulse signal as the internal clock signal ICLK1, and the transition detector 90103 maintains the internal clock signal ICLK2 at "0." As a result, the state of the flip-flop is inverted, so that the transition detector 90102 receives "0l" and the transition detector 90103 receives "1."

When the external clock signal CLK rises, the transition detector 90103 outputs a pulse signal as the internal clock signal ICLK2, and the transition detector 90102 maintains the internal clock signal ICLK1 at "0." Thus, the pulses of the internal clock signals ICLK1 and ICLK2 are alternately output at the rising edges of the external clock signal CLK, as described later with reference to FIG. 62.

Even when the flip-flop 90104 is inverted by the pulses of the internal clock signals ICLK1 and ICLK2, the switch gate circuits 90105A and 90105B keep producing the internal clock signals ICLK1 and ICLK2. That is, while the pulse signals are produced, the switch gate circuit 90105A and 90105B are set to be nonconductive, and the state of the flip-flop 90104 is maintained by the flip-flops 90106A and 90106B. Thus, the transition detectors 90102 and 90103 can output the pulse signal having the normal pulse width even when the state of the flip-flop 90104 is inverted while the pulses are produced.

The operation of this embodiment will be explained with reference to the waveform chart of FIG. 62.

Figure 62:
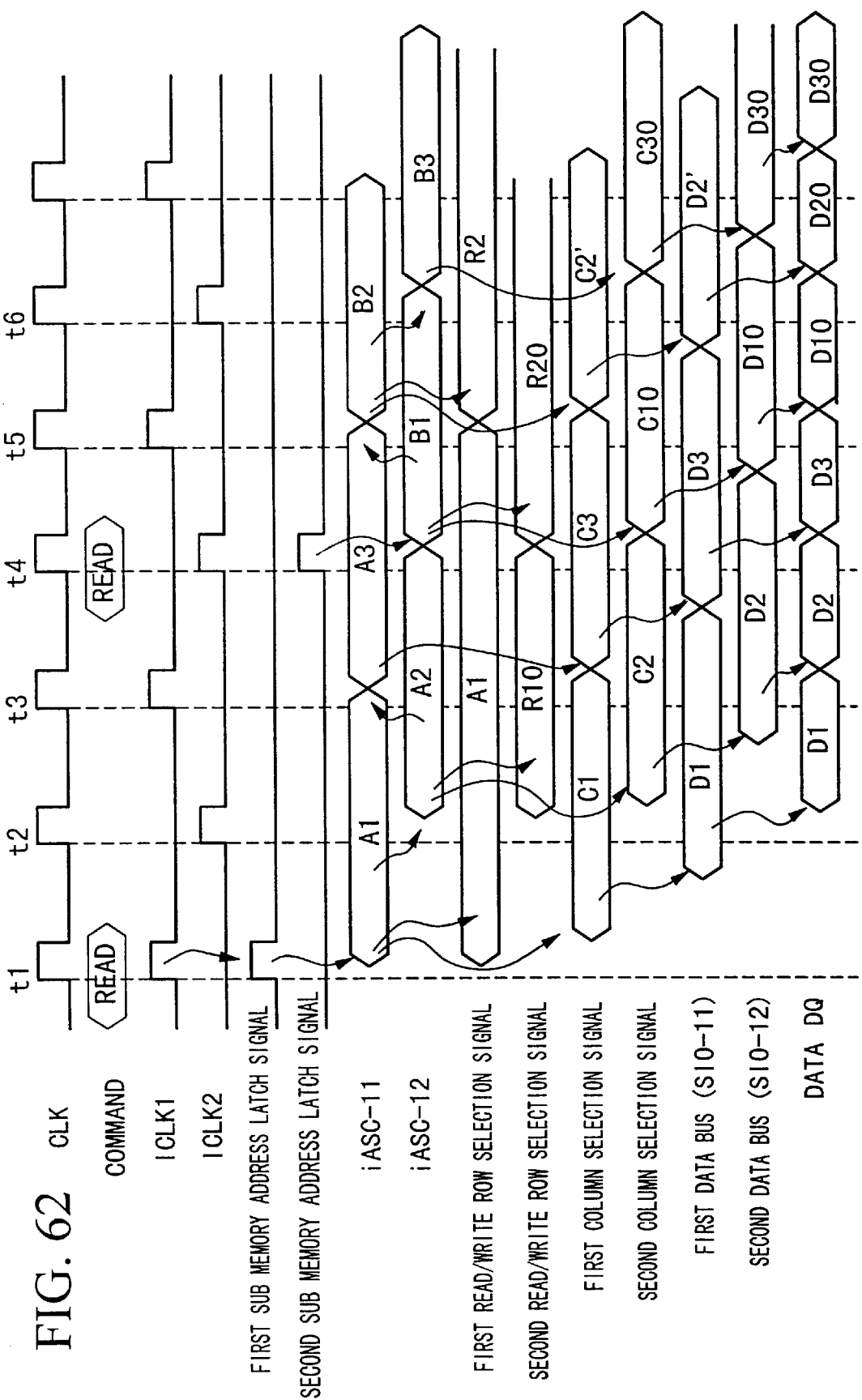
FIG. 62 is a waveform chart for explaining the operation of the embodiment of the SRAM column decoder, the data control circuit, and the SRAM array shown in FIG. 57

In FIG. 62, addresses A (A1 to A3) contains both row address components and column address components. The addresses A1 to A3 have different column address components (while they have the same row address component). Addresses B (B1 to B3) also have components similar to the addresses A. The addresses A and B have different row address components.

While a read command and the address A (not shown) are set up, when the external clock signal CLK rises at the time t1, the internal clock signal generating circuit 90000 outputs the pulse of the internal clock signal CLK1. Upon reception of this signal CLK1, the command decoding circuit 90010 outputs the first sub-memory external address latch signal LAT-G1 to the first address buffer 90020. Based on the first sub-memory external address latch signal LAT-G1, the first address buffer 90020 accepts the external address signal A through the receiver circuit 90001, and outputs the address A1 as the internal address signal iASC-11.

The first sub-memory row decoder 3900 generates a row address R1 as the first read/write row selection signal from the row address component of the address A1, and the first column decoder 390 generates a column address C1 as the first column selection signal from the column address component of the address A1. Based on these selection signals (the row address R1 and the column address C1), a memory cell is selected, and data D1 stored in the cell is output to the data input/output line SIO-11, and is read as the data DQ. The next address generating circuit 90022 increments the address A1 generated by the first address buffer 90020, to thereby obtain the next address signal A2 (having the same row address component as that of the address A1).

Then, when the external clock signal CLK rises at the time t2, the internal clock signal generating circuit 9000 outputs the pulse of the internal clock signal CLK2. Upon reception of this signal CLK2, the command decoding circuit 90010 outputs the second submemory next address latch signal LAT-N2 to the second address buffer 90021. Based on the second sub-memory address latch signal LAT-N2, the second address buffer 90021 accepts the address A2 prepared by the next address signal generating circuit 90022, and outputs the address as the internal address signal iASC-12. Based on the address A2 output as the internal address signal iASC-12, the second sub-memory row decoder 3910 generates the second read/write row selection signal R10. Because the addresses A1 and A2 have the same row address component, the row addresses R10 and R1 have the same value, and therefore the same row is selected by the second read/write selection signal R10

The second column decoder 391 generates a column address C2 as the second column selection signal from the column address component of the address A2 output as the internal address signal iASC-12. Based on the second read/write selection signal (row address R10) and the second column selection signal (column address C2), a memory cell is selected, and the data D2 stored in the cell is output to the data input/output line SIO-12, and is read as the data DQ. The next address generating circuit 90023 increments the address A2, which is generated by the second address buffer 90021, to obtain the next address A3.

When the external clock signal CLK rises at the time t3, the internal clock signal generating circuit 90000 outputs the pulse of the internal clock signal CLK1. Upon reception of this signal CLK1, the command decoding circuit 90010 outputs the first sub-memory next address latch signal LAT-N1 to the first address buffer 90020. Based on the first sub-memory next address latch signal LAT-N1, the first address buffer 90020 accepts the address A3 (having the same row address component as those of the addresses A1 and A2) prepared by the next address signal generating circuit 90023, and outputs this address as the internal address signal iASC-11. At that time, the first sub-memory row decoder 3900 and the second sub-memory row decoder 3910 maintain the row address R1 as the first read/write row selection signal, and maintain the row address R10 as the second read/write row selection signal. That is, the same row is selected.

The first column decoder 390 generates a column address C3 as the first column selection signal from the column address component of the address A3 output as the internal address signal iASC-11. Based on the first read/write row selection signal (row address R1) and the first column selection signal (column address C1), a memory cell is selected, and data D3 stored in the cell is output to the data input/output line SIO-11, and is read as the data DQ.

Thus, in the memory cells which belong to the row specified by the row address R1 (row address R10), the memory cells specified by the column address C1 to C3 are successively selected, and the data D1 to D3 are read.

While the read command and the address B (not shown) are set up, when the external clock signal CLK rises at the time t4, the internal clock signal generating circuit 90000 outputs the pulse of the internal clock signal CLK2. Upon reception of this signal CLK2, the command decoding circuit 90010 outputs the second sub-memory external address latch signal LAT-G2 to the second address buffer 90021. Based on the second sub-memory external address latch signal LAT-G2, the second address buffer 90021 accepts. the address signal B through the receiver circuit 90001, and outputs the address B1 as the internal address signal iASC-12. The second sub-memory row decoder 3910 generates a row address R20 as the second read/write row selection signal from the row address component of the address B1. The second column decoder 391 generates a column address C10 as the second column selection signal from the column address component of the address B1.

Based on these selection signal (the row address R20 and the column address C10), a memory cell is selected, and the data D10 stored in the cell is output to the data input/output line SIO-12, and is read as the data DQ. The next address generating circuit 90023 increments the address B1, which is generated by the second address buffer 90021, to obtain the next address B2 (having the same row address component as that of the address B1).

When the external clock CLK rises at the time t5, the internal clock signal generating circuit 90000 outputs the pulse of the internal clock signal CLK1. Upon reception of this signal CLK1, the command decoding circuit 90010 outputs the first sub-memory next address latch signal LAT-N1 to the first address buffer 90020. Based on the first sub-memory next address latch signal LAT-N1, the first address buffer 90020 accepts the address B2 prepared by the next address signal generating circuit 90023, and outputs this signal as the internal address signal iASC-11. Based on the address B2, the first submemory row decoder 3900 generates a row address R2 as the first read/write row selection signal. Because the addresses B1 and B2 have the same row address component, the row addresses R1 and R10 have the same value.

The first column decoder 390 generates a column address C20 as the first column selection signal from the column address component of the address B2 output as the internal address signal iASC-11. Based on the first read/write row selection signal (row address signal R2) and the first column selection signal (column address C20), a memory cell is selected, and the data D20 stored in the cell is output to the data input/output line SIO-11, and is read as the data DQ. The next address generating circuit 90022 increments the address B2, which is generated by the first address buffer 90020, to obtain the next address B3.

In this way, the first address buffer 90020 and the second address buffer 90021 alternately generate the continuous internal address signals. Based on these signals, a memory cell in the SRAM array 1200 is selected, and the data is read.

According to the embodiment, as shown in FIG. 62, while the data DQ is output in one clock cycle, the column address is switched every two clock cycles. Therefore, the operating cycle for the internal circuits is reduced. Further, because the device has two systems of sub-memory decoders, the internal circuits operate in two clock cycles to output data successively even when the row address is changed in one clock cycle.

While in the above-described embodiment the internal circuits operate in two clock cycles and the data are successively output in one clock cycle, the present invention is not limited to this, and the clock frequency and the clock cycle may be changed according to design specification.

[Another Construction of SRAM Portion including Data Input/Output Terminals]

Figure 63:
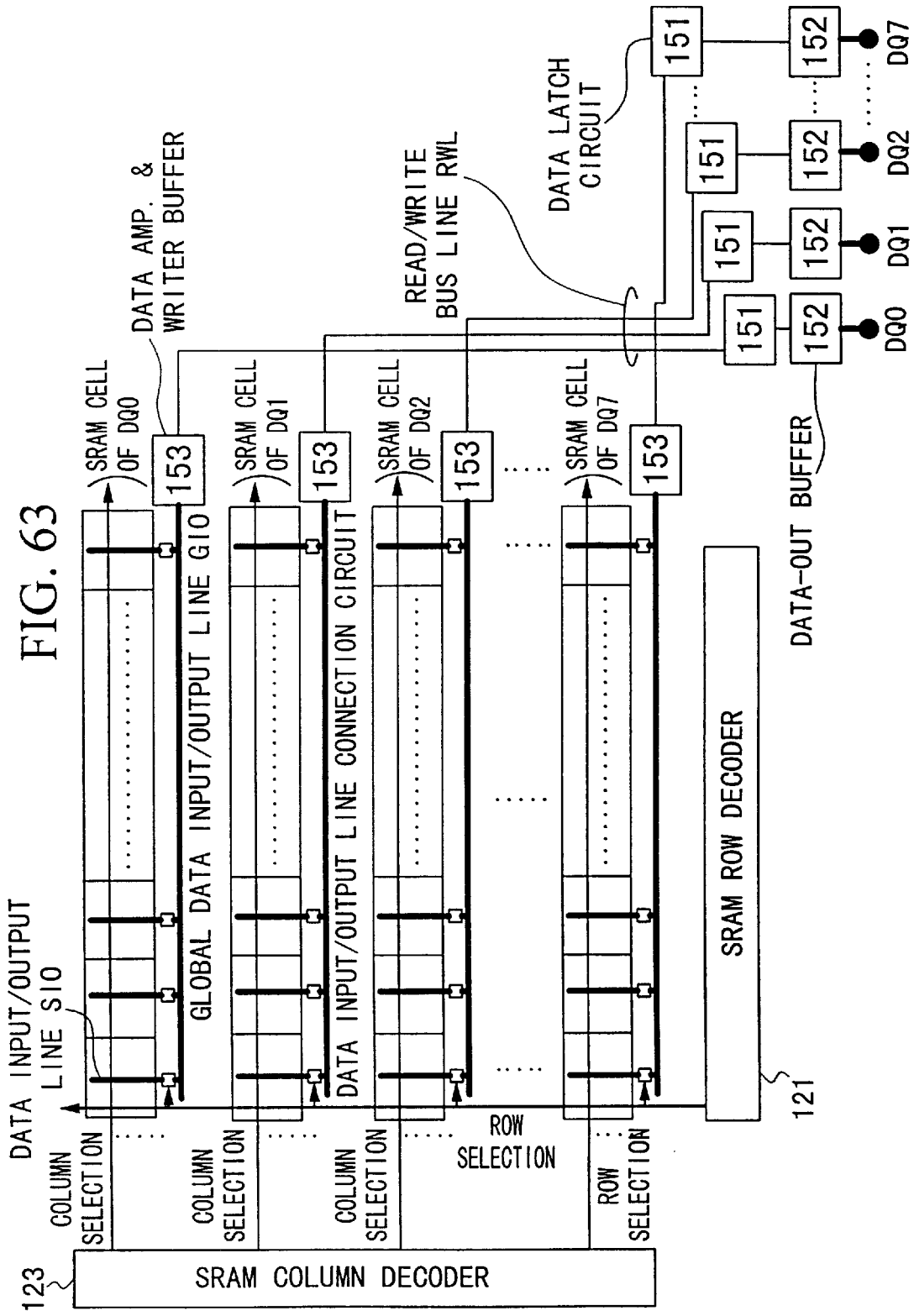
FIG. 63 shows the concrete example of the construction of the SRAM portion and the data input/output terminal.
Figure 64:
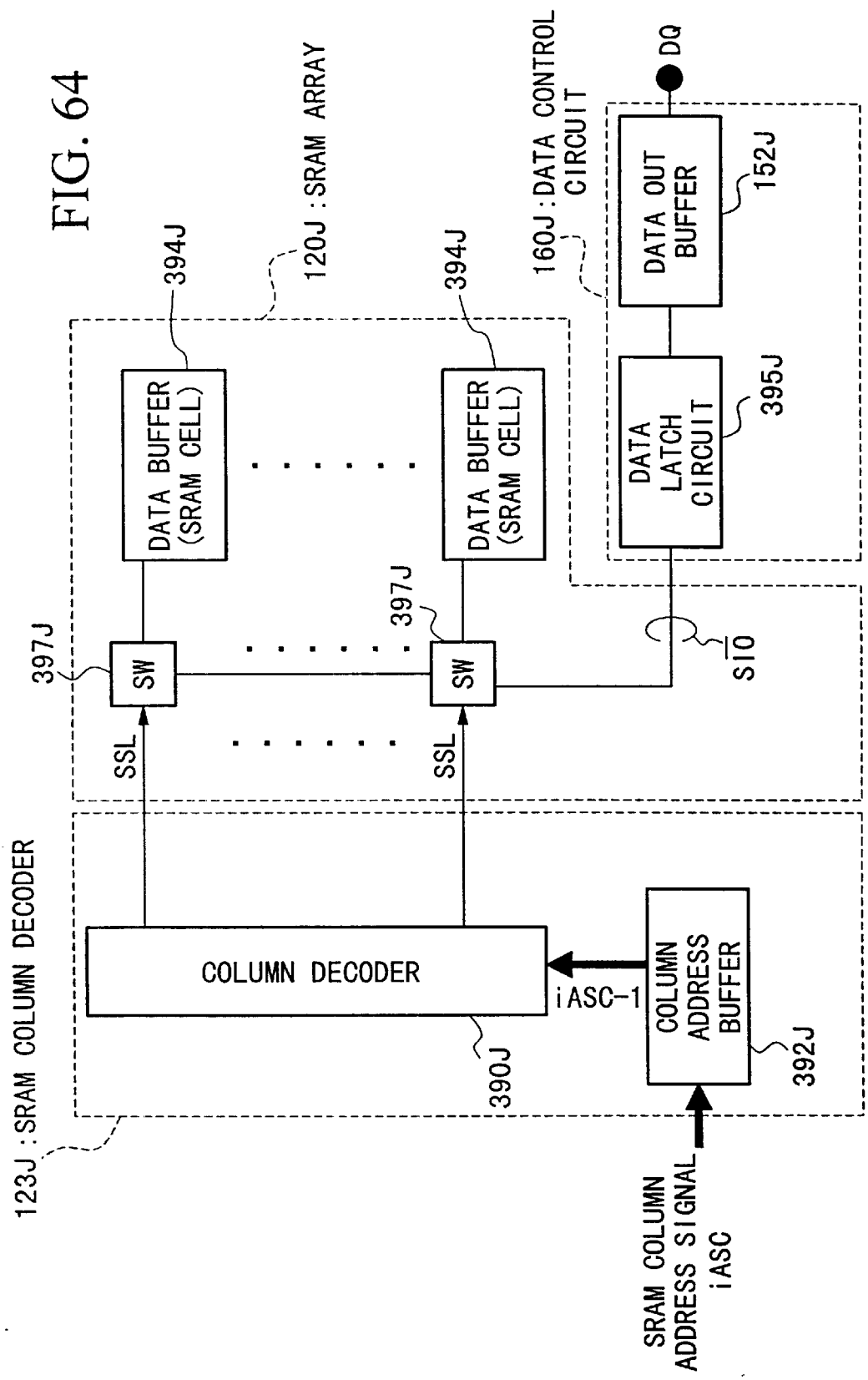
FIG. 64 is a diagram showing the conventional semiconductor integrated circuit device (the circuits for reading data).
Figure 65:
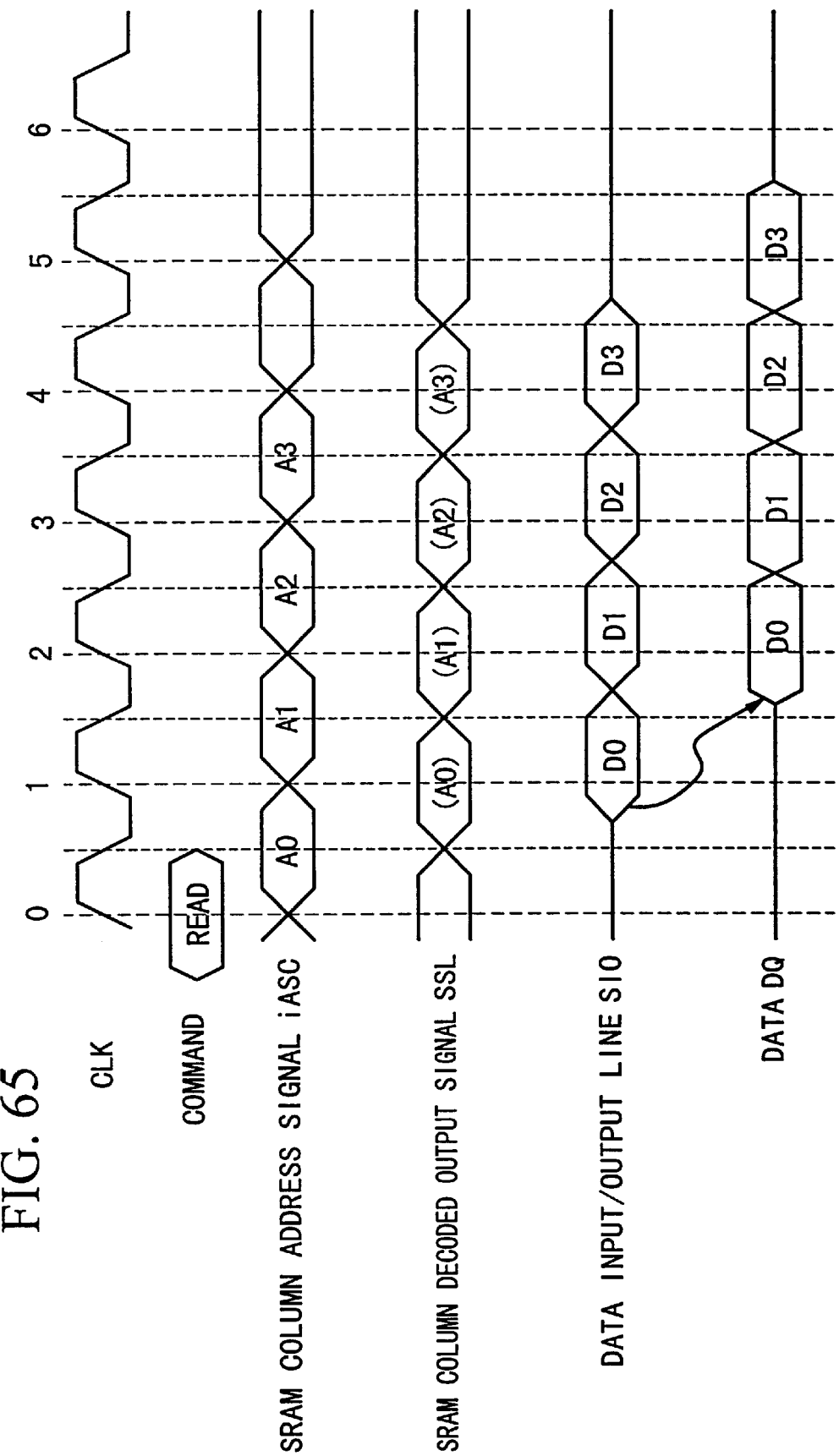
FIG. 65 is a waveform chart for explaining the operation of the conventional semiconductor integrated circuit device shown in FIG. 64.

FIG. 63 schematically shows another example of construction of the SRAM portion including the data input/output terminals in a case where it has the x8-bit construction. In a case of the data output from the SRAM, data of the SRAM cells of selected column and row are output to the respective data input/output lines SIO. The data input/output lines SIO of the selected row are connected to the global data input/output line GIO, and the data are sent to a corresponding data amplifier 153. Thereafter, the data pass through a read/write bus line RWL via a data latch circuit 151 and a data buffer 152 to the data input/output terminal DQ. Since the SRAM portion has the x8-bit construction, 8 sets of data input/output circuits operate simultaneously and output 8 data. Data are written in the SRAM cells along a path reverse to the data read path.

By using this circuit construction using the data input/output lines SIO and the global data input/output lines GIO, the SRAM row selection of every SRAM cell becomes unnecessary, the load of the SRAM row selection signal lines is reduced, and a high speed data input/output of the SRAM cells becomes possible. Further, by using this construction, the load of the data input/output lines SIO is not increased, realizing high speed operation even when the number of rows of the SRAM cells is increased.

The semiconductor integrated circuit device of the present invention alternately specifies continuous internal addresses in the memory cell array starting from an external address, synchronously with the external clock signal, and alternately transfers the data from the memory cells in the memory cell array specified by the internal addresses. Therefore, the present invention can increase the data read speed without increasing the operating frequency of internal circuits, and can reduce the operating frequency of the internal circuits.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A semiconductor integrated circuit device for reading data synchronously with an external clock signal, comprising:
   a memory cell array in which memory cells are arranged in a matrix;
   first and second address specifying devices for alternately specifying a first set of continuous internal addresses in said memory cell array starting from an external address synchronously with the external clock signal;
   third and fourth address specifying devices for alternately specifying a second set of continuous internal addresses in said memory cell array starting from an external address synchronously with the external clock signal;
   first and second data transfer devices, which correspond to said respective third and fourth address specifying devices, for alternately transferring the data from said memory cells in said memory cell array specified by the internal addresses synchronously with the external clock; and
   data output device for outputting the data alternately transferred by said first and second data transfer devices.

2. The semiconductor integrated circuit device according to claim 1, wherein said first and second data transfer devices comprise first and second switch devices which are connected between said memory cells in said memory cell array and said first and second data transfer devices, and which are made conductive based on the internal addresses specified by said third and fourth address specifying devices.

3. The semiconductor integrated circuit device according to claim 1, wherein said first address specifying device comprises:
   a first address buffer for receiving the external address synchronously with the external clock signal and generating a first address signal based on the external address; and
   a first decoder for decoding the first address signal to generate a first selection signal, and
   said second address specifying device comprises:
      a second address buffer for receiving the external address synchronously with the external clock signal and generating a second address signal based on the external address; and
      a second decoder for decoding the second address signal to generate a second selection signal, wherein said first and second address buffers alternately operates synchronously with the external clock signal, and alternately generates the first and second address signals based on the external address, so that said memory cells in said memory cell array are successively selected.

4. The semiconductor integrated circuit device according to claim 3, wherein
   said third address specifying device comprises a third decoder for decoding the first address signal to generate a third selection signal, and inputting the third selection signal to said first switch device, and
   said fourth address specifying device comprises a fourth decoder for decoding the second address signal to generate a fourth selection signal, and inputting the fourth selection signal to said second switch device.

5. A semiconductor integrated circuit device for reading data synchronously with an external clock signal, comprising:
   a memory cell array in which memory cells are arranged in a matrix;
   first and second column address specifying devices for alternately specifying a first set of continuous internal addresses in said memory cell array starting from an external address synchronously with the external clock signal;
   first and second row address specifying devices for alternately specifying a second set of continuous internal addresses in said memory cell array starting from an external address synchronously with the external clock signal;
   first and second data transfer devices, which correspond to said respective first and second row address specifying devices, for alternately transferring the data from said memory cells in said memory cell array specified by the internal addresses synchronously with the external clock; and
   data output device for outputting the data alternately transferred by said first and second data transfer devices.

6. The semiconductor integrated circuit device according to claim 5, wherein said first and second data transfer devices comprise first and second switch devices which are connected between said memory cells in said memory cell array and said first and second data transfer devices, and which are made conductive based on the internal addresses specified by said first and second row address specifying devices.

7. The semiconductor integrated circuit device according to claim 5, wherein said first column address specifying device comprises:
   a first address buffer for receiving the external address synchronously with the external clock signal and generating a first address signal based on the external address; and
   a first column decoder for decoding the first address signal to generate a first selection signal, and
   said second column address specifying device comprises:
      a second address buffer for receiving the external address synchronously with the external clock signal and generating a second address signal based on the external address; and
      a second column decoder for decoding the second address signal to generate a second selection signal, wherein said first and second address buffers alternately operates synchronously with the external clock signal, and alternately generates the first and second address signals based on the external address, so that said memory cells in said memory cell array are successively selected.

8. The semiconductor integrated circuit device according to claim 7, wherein
   said first row address specifying device comprises a first row decoder for decoding the first address signal to generate a third selection signal, and inputting the third selection signal to said first switch device, and
   said second row address specifying device comprises a second row decoder for decoding the second address signal to generate a fourth selection signal, and inputting the fourth selection signal to said second switch device.

* * * * *